US012532622B2

(12) United States Patent
Guo et al.

(10) Patent No.: US 12,532,622 B2
(45) Date of Patent: Jan. 20, 2026

(54) DISPLAY SUBSTRATE, MANUFACTURING METHOD THEREOF, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Dan Guo, Beijing (CN); Fei Fang, Beijing (CN); Shuai Xie, Beijing (CN); Zhenhua Zhang, Beijing (CN); Yuxin Zhang, Beijing (CN); Ling Shi, Beijing (CN); Xuewei Tian, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 446 days.

(21) Appl. No.: 18/018,562

(22) PCT Filed: Feb. 18, 2022

(86) PCT No.: PCT/CN2022/076855
§ 371 (c)(1),
(2) Date: Jan. 29, 2023

(87) PCT Pub. No.: WO2023/155138
PCT Pub. Date: Aug. 24, 2023

(65) Prior Publication Data
US 2024/0260344 A1 Aug. 1, 2024

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/351* (2023.02); *H10K 59/353* (2023.02); *H10K 71/60* (2023.02)

(58) Field of Classification Search
CPC .................................................. H10K 59/131
See application file for complete search history.

(56) References Cited

U.S. PATENT DOCUMENTS

2003/0205708 A1 11/2003 Lee et al.
2021/0193773 A1 6/2021 Park et al.
(Continued)

FOREIGN PATENT DOCUMENTS

CN 110767714 A 2/2020
CN 111129102 A 5/2020
(Continued)

*Primary Examiner* — Douglas M Menz
(74) *Attorney, Agent, or Firm* — Ling Wu; Stephen Yang; Ling and Yang Intellectual Property

(57) ABSTRACT

A display substrate includes a normal display area and a transmissive display area provided within the normal display area, the normal display area being configured to perform image display, the transmissive display area including at least one pixel island, the pixel island being configured to perform image display and transmit light; the pixel island of the transmissive display area including an initial transmission line for transmitting an initial signal and at least one pixel drive circuit connected to the initial transmission line, the initial transmission line including a first transmission line with a main part extending in a first direction and a second transmission line with a main part extending in a second direction, the first transmission line and the second transmission line being connected to form a grid structure.

20 Claims, 24 Drawing Sheets

(51) Int. Cl.
 *H10K 59/35* (2023.01)
 *H10K 71/60* (2023.01)

(56) References Cited

U.S. PATENT DOCUMENTS

| | | |
|---|---|---|
| 2021/0202621 A1 | 7/2021 | Liang et al. |
| 2021/0335221 A1 | 10/2021 | Ma et al. |
| 2022/0077265 A1* | 3/2022 | Ma .................... H10K 59/1213 |
| 2022/0336566 A1 | 10/2022 | Chen et al. |
| 2022/0406874 A1 | 12/2022 | Chen et al. |

FOREIGN PATENT DOCUMENTS

| | | |
|---|---|---|
| CN | 111179864 A | 5/2020 |
| CN | 111403468 A | 7/2020 |
| CN | 111477669 A | 7/2020 |
| CN | 111508978 A | 8/2020 |
| CN | 113053982 A | 6/2021 |
| CN | 113096581 A | 7/2021 |
| CN | 113437126 A | 9/2021 |

\* cited by examiner

DISPLAY SUBSTRATE, MANUFACTURING METHOD THEREOF, AND DISPLAY APPARATUS

CROSS-REFERENCE TO RELATED APPLICATION

This application is a national stage application of PCT Application No. PCT/CN2022/076855, which is filed on Feb. 18, 2022 and entitled "Display Substrate, Manufacturing Method Thereof, and Display Apparatus", the content of which should be regarded as being incorporated herein by reference.

TECHNICAL FIELD

The present disclosure relates to, but is not limited to, the field of display technologies, and particularly to a display substrate, a manufacturing method for the display substrate, and a display apparatus.

BACKGROUND TECHNOLOGY

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, extremely high response speed, lightness and thinness, flexibility, and low costs. With constant development of display technologies, a flexible display that uses an OLED or a QLED as a light emitting device and performs signal control by a Thin Film Transistor (TFT for short) has become a mainstream product in the field of display at present.

SUMMARY

The following is a summary of subject matters described herein in detail. The summary is not intended to limit the protection scope of claims.

On the one hand, the present disclosure provides a display substrate including a normal display area and a transmissive display area provided within the normal display area, the normal display area being configured to perform image display, the transmissive display area including at least one pixel island, the pixel island of the transmissive display area being configured to perform image display and transmit light; the pixel island of the transmissive display area including an initial transmission line for transmitting an initial signal and at least one pixel drive circuit connected to the initial transmission line, the initial transmission line including a first transmission line with a main part extending in a first direction and a second transmission line with a main part extending in a second direction, the first transmission line and the second transmission line being connected to form a grid structure, the grid structure having a closed shape in an orthographic projection in the plane of the display substrate, the first direction being crossed with the second direction.

In an exemplary embodiment, the pixel island of the transmissive display area including a plurality of pixel units, at least one pixel unit including a first sub-pixel and a second sub-pixel provided sequentially in the first direction, and a third sub-pixel and a fourth sub-pixel provided sequentially in the second direction, the third sub-pixel and the fourth sub-pixel being provided between the first sub-pixel and the second sub-pixel; the initial transmission line including a first initial transmission line for transmitting a first initial signal, the first initial transmission line including a first initial signal line, an eleventh transmission connection line and a twelfth transmission connection line as the first transmission line, and a thirteenth transmission connection line and a fourteenth transmission connection line as the second transmission line, the first initial signal line being provided in the sub-pixel in the form of a straight line extending in the first direction, the eleventh transmission connection line and twelfth transmission connection line being provided between adjacent sub-pixels in the first direction, being configured to connect the first initial signal line of adjacent sub-pixels in the first direction, and the thirteenth transmission connection line and fourteenth transmission connection line being provided between adjacent sub-pixels in the second direction, being configured to connect the first initial signal line of adjacent sub-pixels in the second direction.

In an exemplary implementation, the eleventh transmission connection line being provided between the first sub-pixel and the second sub-pixel adjacent in the first direction, the first initial signal line of the second sub-pixel and the first initial signal line of the first sub-pixel adjacent in the first direction being connected via the eleventh transmission connection line.

In an exemplary implementation, the twelfth transmission connection line being provided between the first sub-pixel and the fourth sub-pixel adjacent in the first direction, and between the second sub-pixel and the fourth sub-pixel adjacent in the first direction, the first initial signal line of the first sub-pixel and the first initial signal line of the fourth sub-pixel adjacent in the first direction being connected via the twelfth transmission connection line, the first initial signal line of the fourth sub-pixel and the first initial signal line of the second sub-pixel adjacent in the first direction being connected via the twelfth transmission connection line.

In an exemplary implementation, the thirteenth transmission connection line being provided between the first sub-pixel and the second sub-pixel adjacent in the second direction, and between the second sub-pixel and the third sub-pixel adjacent in the second direction, the first initial signal line of the first sub-pixel and the first initial signal line of the second sub-pixel adjacent in the second direction being connected via the thirteenth transmission connection line, the first initial signal line of the second sub-pixel and the first initial signal line of the third sub-pixel adjacent in the second direction being connected via the thirteenth transmission connection line.

In an exemplary implementation, the fourteenth transmission connection line being provided between the first sub-pixel and the third sub-pixel adjacent in the second direction, and the first initial signal line of the third sub-pixel and the first initial signal line of the first sub-pixel adjacent in the second direction being connected via the fourteenth transmission connection line.

In an exemplary implementation, the first initial transmission line further including a first transmission electrode and a second transmission electrode provided in the sub-pixel, the fourteenth transmission connection line and the first initial signal line of the third sub-pixel being connected through the first transmission electrode and the second transmission electrode.

In an exemplary embodiment, the fourteenth transmission connection line being connected to the first transmission electrode through a via, and the second transmission electrode being connected to the first transmission electrode and first initial signal line, respectively, through a via.

In an exemplary implementation, the first transmission electrode being connected to the first region of the active layer of the seventh transistor in the pixel drive circuit through a via.

In an exemplary embodiment, the pixel island of the transmissive display area including a plurality of pixel units, at least one pixel unit including a first sub-pixel and a second sub-pixel provided sequentially in the first direction, and a third sub-pixel and a fourth sub-pixel provided sequentially in the second direction, the third sub-pixel and the fourth sub-pixel being provided between the first sub-pixel and the second sub-pixel; the initial transmission line including a second initial transmission line for transmitting a second initial signal, the second initial transmission line including a second initial signal line and a twenty-first transmission connection line as the first transmission line, and a twenty-second transmission connection line and a twenty-third transmission connection line as the second transmission line, the second initial signal line being provided in the sub-pixel in the form of a straight line extending in the first direction, the twenty-first transmission connection line being provided between adjacent sub-pixels in the first direction, being configured to connect the second initial signal line of adjacent sub-pixels in the first direction, the twenty-second transmission connection line and the twenty-third transmission connection line being provided between adjacent sub-pixels in the second direction, being configured to connect the second initial signal line of adjacent sub-pixels in the second direction.

In an exemplary implementation, the twenty-first transmission connection line being provided between the first sub-pixel and the fourth sub-pixel adjacent in the first direction, and between the second sub-pixel and the fourth sub-pixel adjacent in the first direction, the second initial signal line of the first sub-pixel and the second initial signal line of the fourth sub-pixel adjacent in the first direction being connected via the twenty-first transmission connection line, the second initial signal line of the fourth sub-pixel and the second initial signal line of the second sub-pixel adjacent in the first direction being connected via the twenty-first transmission connection line.

In an exemplary implementation, the twenty-second transmission connection line being provided between the first sub-pixel and the third sub-pixel adjacent in the second direction, and between the second sub-pixel and the third sub-pixel adjacent in the second direction, the second initial signal line of the first sub-pixel and the second initial signal line of the third sub-pixel adjacent in the second direction being connected via the twenty-second transmission connection line, the second initial signal line of the second sub-pixel and the second initial signal line of the third sub-pixel adjacent in the second direction being connected via the twenty-second transmission connection line.

In an exemplary implementation, the twenty-third transmission connection line being provided between the first sub-pixel and the fourth sub-pixel adjacent in the second direction, and the second initial signal line of the fourth sub-pixel and the second initial signal line of the first sub-pixel adjacent in the second direction being connected via the twenty-third transmission connection line.

In an exemplary implementation, the second initial transmission line further including a third transmission electrode provided in a sub-pixel, the third transmission electrode being connected to the second initial signal line through a via, and the twenty-first transmission connection line, twenty-second transmission connection line and twenty-third transmission connection line being connected to the third transmission electrode, respectively.

In an exemplary embodiment, the third transmission electrode being further connected to the second initial signal line and the first region of the active layer of the first transistor in the pixel drive circuit simultaneously through a jumper via.

In an exemplary embodiment, a first end of the twenty-first transmission connection line being connected to the third transmission electrode of the first sub-pixel through a via, and a second end of the twenty-first transmission connection line being connected to the second initial signal line of the fourth sub-pixel; a first end of the twenty-first transmission connection line being connected to the second initial signal line of the second sub-pixel, and a second end of the twenty-first transmission connection line being connected to the third transmission electrode of the fourth sub-pixel through a via.

In an exemplary embodiment, a first end of the twenty-second transmission connection line being connected to the second initial signal line of the first sub-pixel, a second end of the twenty-second transmission connection line being connected to the third transmission electrode of the third sub-pixel through a via; a first end of the twenty-second transmission connection line being connected to the third transmission electrode of the second sub-pixel through a via, and a second end of the twenty-second transmission connection line being connected to the second initial signal line of the third sub-pixel.

In an exemplary implementation, a first end of the twenty-third transmission connection line being connected to the twenty-first transmission connection line of the fourth sub-pixel through a via, and a second end of the twenty-third transmission connection line being connected to the twenty-second transmission connection line of the first sub-pixel through a via.

In an exemplary embodiment, in a plane perpendicular to the display substrate, the display substrate including a first conductive layer, a second conductive layer, a third conductive layer, a fourth conductive layer, a fifth conductive layer, and a sixth conductive layer provided sequentially on the base substrate, the fourth conductive layer and the fifth conductive layer being transparent conductive layers, the fourth conductive layer including the eleventh transmission connection line and the twelfth transmission connection line in the first initial transmission line, and the twenty-first transmission connection line and the twenty-second transmission connection line in the second initial connection line, the fifth conductive layer including the thirteenth transmission connection line and the fourteenth transmission connection line in the first initial transmission line, and the twenty-third transmission connection line in the second initial transmission line.

In an exemplary embodiment, the first conductive layer including the second initial signal line in the second initial transmission line, and the second conductive layer including the first initial signal line in the first initial transmission line.

In an exemplary embodiment, the third conductive layer including a third transmission electrode in a second initial transmission line, and a first transmission electrode in a first initial transmission line, and the sixth conductive layer including a second transmission electrode in a first initial transmission line.

In another aspect, the present disclosure further provides a display apparatus, including the aforementioned display substrate.

In yet another aspect, the present disclosure further providing a manufacturing method of a display substrate, the display substrate including a normal display area and a transmissive display area provided within the normal display area, the normal display area being configured to perform image display, the transmissive display area including at least one pixel island, the pixel island of the transmissive display area being configured to perform image display and transmit light; the manufacturing method including:

forming an initial transmission line for transmitting an initial signal and at least one pixel drive circuit connected to the initial transmission line in the pixel island of the transmissive display area, the initial transmission line including a first transmission line with a main part extending in a first direction and a second transmission line with a main part extending in a second direction, the first transmission line and the second transmission line being connected to form a grid structure, the grid structure having a closed shape in an orthographic projection in the plane of the display substrate, the first direction being crossed with the second direction.

Other aspects may be understood upon reading and understanding the drawings and the detailed description.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

FIG. 10b is a schematic planar view of the first conductive layer in FIG. 10a;

FIG. 11b is a schematic plan view of the second conductive layer in FIG. 11a;

FIG. 13b is a schematic plan view of the third conductive layer in FIG. 13a;

FIG. 15b is a schematic plan view of the fourth conductive layer in FIG. 15a;

FIG. 17b is a schematic plan view of the fifth conductive layer in FIG. 17a;

FIG. 19b is a schematic plan view of the sixth conductive layer in FIG. 19a.

DESCRIPTION OF REFERENCE SIGNS

Figure 1:
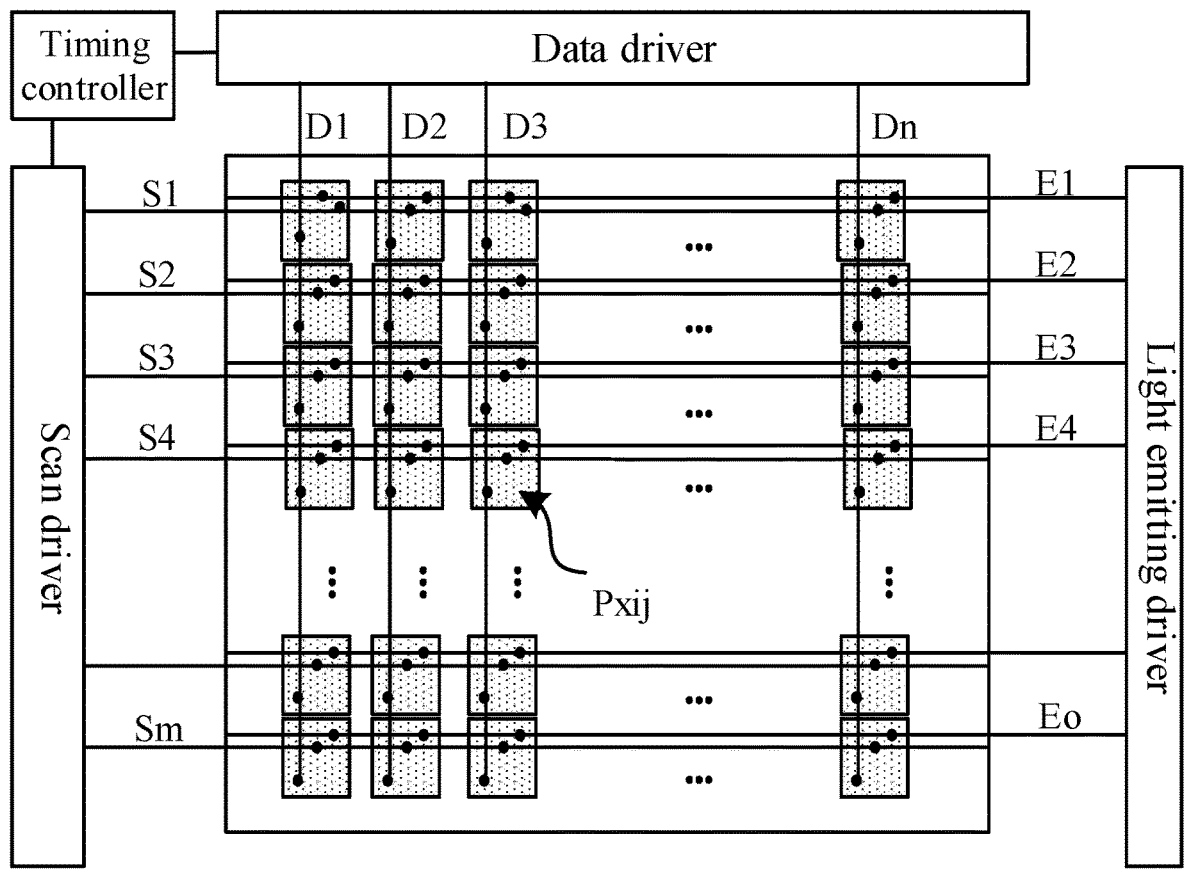
FIG. 1 is a schematic diagram of a structure of a display apparatus.

| | |
|---|---|
| 10-first initial transmission line; | 10a-eleventh transmission connection line; |
| 10b-twelfth transmission connection line; | 10c-thirteenth transmission connection line; |
| 10d-fourteenth transmission connection line; | 11-first active layer; |
| 12-second active layer; | 13-third active layer; |
| 14-fourth active layer; | 15-fifth active layer; |
| 16-sixth active layer; | 17-seventh active layer; |
| 20-second initial transmission line; | 20a-twenty-first transmission connection line; |
| 20b twenty-second transmission connection line; | 20c-twenty-third transmission connection line; |

| | |
|---|---|
| 21-first scan signal line | 22-second scan signal line |
| 23-light emitting control signal line; | 24-first initial signal line; |
| 25-first electrode plate; | 31-thirty-first connection electrode; |
| 32-thirty-second connection electrode; | 33-second initial signal line; |
| 34-second electrode plate; | 41-forty-first connection electrode; |
| 42-forty-second connection electrode; | 43-forty-third connection electrode; |
| 44-forty-fourth connection electrode; | 45-forty-fifth connection electrode; |
| 46-forty-sixth connection electrode; | 47-forty-seventh connection electrode; |
| 48-forty-eighth connection electrode; | 49-forty-ninth connection electrode; |
| 50-fiftieth connection electrode; | 51-fifty-first connection electrode; |
| 52-fifty-second connection electrode; | 53-fifty-third connection electrode; |
| 54-fifty-fourth connection electrode; | 55-fifty-fifth connection electrode; |
| 61-sixty-first connection line; | 62-sixty-second connection line; |
| 63-sixty-third connection line; | 64-sixty-fourth connection line; |
| 65-sixty-fifth connection line; | 66-sixty-sixth connection line; |
| 67-sixty-seventh connection line; | 68-sixty-eighth connection line; |
| 69-sixty-ninth connection line; | 71-seventy-first connection line; |
| 72-seventy-second connection line; | 73-seventy-third connection line; |
| 74-seventy-fourth connection line; | 75-seventy-fifth connection line; |
| 76-data signal line; | 77-first power supply line; |
| 81-eighty-first connection electrode; | 82-eighty-second connection electrode; |
| 83-eighty-third connection electrode; | 84-eighty-fourth connection electrode; |
| 100-normal display area; | 101-base substrate; |
| 102-drive circuit layer; | 103-emitting structure layer; |
| 104-encapsulation structure layer; | 200-transmissive display area; |
| 301-anode; | 302-pixel definition layer; |
| 303-organic emitting layer; | 304-cathode; |
| 401-1st encapsulation layer; | 402-2nd encapsulation layer; |
| 403-3rd encapsulation layer. | |

DETAILED DESCRIPTION

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

Scales of the drawings in the present disclosure may be used as a reference in the actual process, but are not limited thereto. For example, the width-length ratio of the channel, the thickness and spacing of each film layer, and the width and spacing of each signal line may be adjusted according to the actual needs. The number of pixels in the display substrate and the number of sub-pixels in each pixel are not limited to the number shown in the drawings. The drawings described in the present disclosure are schematic structure diagrams only, and one implementation of the present disclosure is not limited to the shapes, numerical values or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode", as well as the "source terminal" and the "drain terminal" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulation layer" sometimes.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be guide angle, arc edge and deformation, etc.

In the present disclosure, "about" refers to that a boundary is defined not so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver and a pixel array. The timing controller is connected to the data driver, the scan driver and the light emitting driver, respectively, the data driver is connected to a plurality of data signal lines (D1 to Dn) respectively, the scan driver is connected to a plurality of scan signal lines (S1 to Sm) respectively, and the light emitting driver is connected to a plurality of light emitting signal lines (E1 to Eo) respectively. The pixel array may include a plurality of sub-pixels Pxij, i and j may be natural numbers, at least one sub-pixel Pxij may include a circuit unit and a light emitting device connected to the circuit unit, and the circuit unit may include at least one scan signal line, at least one data signal line, at least one light emitting signal line and a pixel drive circuit. In an exemplary implementation, the timing controller may provide a gray tone value and a control signal, which are suitable for a specification of the data driver, to the data driver, provide a clock signal, a scan start signal, etc., which are suitable for a specification of the scan driver, to the scan driver, and provide a clock signal, a transmit stop signal, etc., which are suitable for a specification of the light emitting driver, to the light emitting driver. The data driver may generate a data voltage to be provided to the data signal lines D1, D2, D3 . . . and Dn by using the gray tone value and the control signal that are received from the timing controller. For example, the data driver may sample the gray tone value by using the clock signal and apply a data voltage corresponding to the gray tone value to the data signal lines D1 to Dn by taking a pixel row as a unit, wherein n may be a natural number. The scan driver may receive the clock signal, the scan start signal, etc., from the timing controller to generate a scan signal to be provided to the scan signal lines S1, S2, S3, . . . , and Sm. For example, the scan driver may provide a scan signal with an on-level pulse to the scan signal lines S1 to Sm sequentially. For example, the scan driver may be constructed in a form of a shift register and may generate a scan signal in a manner in which the scan start signal provided in a form of an on-level pulse is transmitted to a next-stage circuit sequentially under the control of the clock signal, wherein m may be a natural number. The light emitting driver may receive a clock signal, a transmit stop signal, etc., from the timing controller to generate a transmit signal to be provided to the light emitting signal lines E1, E2, E3, . . . , and Eo. For example, the light emitting driver may provide a transmit signal with an off-level pulse to the light emitting signal lines E1 to Eo sequentially. For example, the light emitting driver may be constructed in a form of a shift register and may generate a transmit signal in a manner in which the transmit stop signal provided in a form of an off-level pulse is transmitted to a next-stage circuit sequentially under the control of the clock signal, wherein o may be a natural number.

With the development of display technology, full-screen or narrow-bezel products have gradually become the development trend of display products with their large screen-to-body ratio and ultra-narrow bezels. For smart terminals and other products, hardware such as front cameras, fingerprint sensors or light sensors are usually required. To improve the screen-to-body ratio, full-screen or narrow-bezel products usually use under-screen fingerprint or full display with camera technology (FDC for short), which places the camera and other sensors in the under-screen camera area (Under Display Camera, or UDC for short) of the display substrate. The under display camera area not only has a certain transmittance, but also has a display function.

Figure 2:
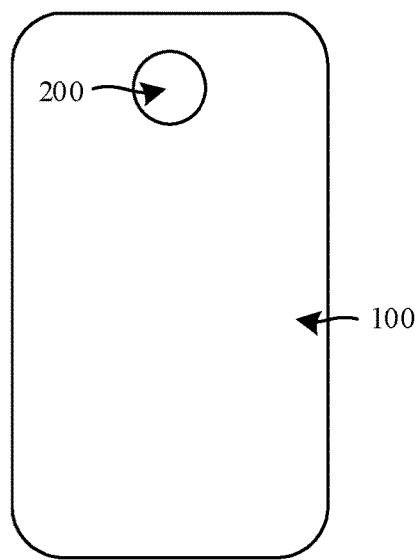
FIG. 2 is a schematic diagram of a structure of a display substrate.

FIG. 2 is a schematic diagram of a structure of a display substrate. As shown in FIG. 2, in a plane parallel to the display substrate, the display substrate may include a normal display area 100 and a transmissive display area 200, and the transmissive display area 200 may be located within the normal display area 100. In an exemplary embodiment, the normal display area 100 is configured to perform image display, the position of the transmissive display area 200 may correspond to the position of the optical apparatus, the transmissive display area 200 is configured to perform image display and transmit light, and the transmitted light is received by the optical apparatus.

In an exemplary embodiment, the transmissive display area 200 has an unlimited location in the normal display area 100, and may be located in the upper or lower portion of the normal display area 100, or may be located at the edge of the normal display area 100. In an exemplary implementation, in a plane parallel to the display substrate, the shape of the transmissive display area 200 may be any one or more of the following: rectangular, polygonal, circular, and elliptical. The optical apparatus may be an optical sensor such as a fingerprint recognition apparatus, a camera apparatus, or 3D imaging apparatus.

In an exemplary embodiment, the resolution of the normal display area 100 and the transmissive display area 200 may be the same, or the resolution of the transmissive display area 200 may be less than the resolution of the normal display area 100. For example, the resolution of the transmissive display area 200 may be about 50% to about 70% of the resolution of the normal display area 200. Resolution (Pixels Per Inch, PPI for short) refers to the number of pixels per unit area, which can be called pixel density. The higher the PP1 value, the higher the density of the display substrate can display the picture, and the richer the details of the picture.

Figure 3:
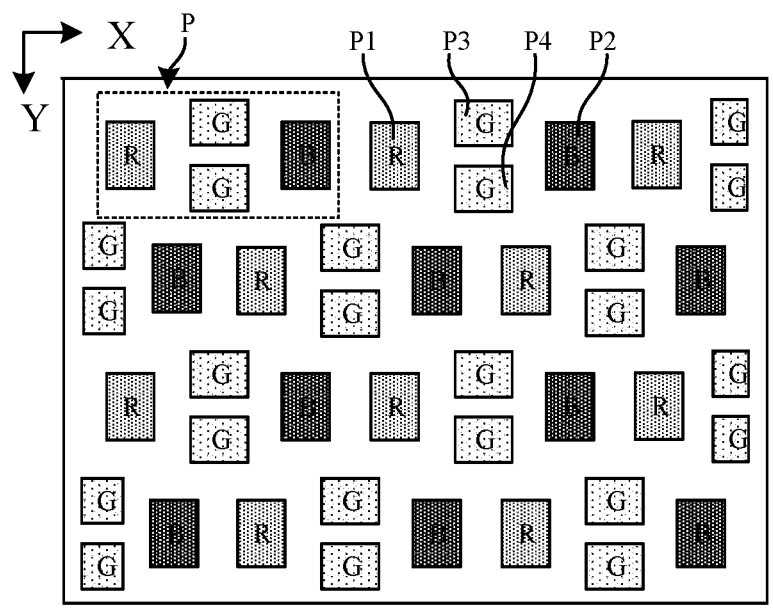
FIG. 3 is a schematic diagram of a planar structure of a transmissive display area.

FIG. 3 is a schematic diagram of a planar structure of a transmissive display area. As shown in FIG. 3, the transmissive display area may include a plurality of pixel islands, at least one pixel island may include at least one pixel unit P, at least one pixel unit P may include a first sub-pixel P1 emitting a first color light, a second sub-pixel P2 emitting a second color light, a third sub-pixel P3 emitting a third color light, and a fourth sub-pixel P4, each of the four sub-pixels may include a circuit unit and a light emitting device. The circuit unit may include a pixel drive circuit and a scan signal line, a data signal line, and a light emitting signal line is connected to the pixel drive circuit, etc. The pixel drive circuit is configured to receive the data voltage transmitted by the data signal line and output a corresponding current to the light emitting device under the control of the scan signal line and the light emitting signal line. The light emitting device in the four sub-pixels is respectively connected with a pixel drive circuit of a sub-pixel where the light emitting device is located, and is configured to emit light with corresponding brightness in response to a current output by the pixel drive circuit of the sub-pixel where the light emitting device is located.

In the present disclosure, the pixel island may be a logical division mode, where the pixel island may include N pixel cells, and each pixel cell may include a first sub-pixel, a second sub-pixel, a third sub-pixel, and a fourth sub-pixel, or the pixel island may be a physical division mode, where the pixel island may include an area having a shading film layer, and the area of the shading film layer may be the region where the pixel drive circuit is located, and the present disclosure is not limited herein.

In an exemplary embodiment, multiple pixel cells P of the pixel island may be arranged in a zigzag pattern, with adjacent pixel cells P aligned in the first direction X and adjacent pixel cells P staggered in the second direction Y, with the first direction X being crossed with the second direction Y.

In an exemplary embodiment, the four sub-pixels of the pixel unit P may be arranged in a diamond-shaped manner, the first sub-pixel P1 and the second sub-pixel P2 may be spaced along the first direction X and may be located on both sides of the first direction X of the pixel unit P, the third sub-pixel P3 and the fourth sub-pixel P4 may be sequentially located along the second direction Y, and the third sub-pixel P3 and the fourth sub-pixel P4 may be located between the first sub-pixel P1 and the second sub-pixel P2.

In an exemplary implementation, the first sub-pixel P1 may be a red sub-pixel emitting red (R) light, the second sub-pixel P2 may be a blue sub-pixel emitting blue (B) light, the third sub-pixel P3 and the fourth sub-pixel P4 may be green sub-pixels emitting green (G) light, and the shape of the sub-pixels may be rectangular, diamond, pentagonal, or hexagonal, etc.

In some possible exemplary embodiments, the arrangement of the pixel cells and the arrangement of the sub-pixels within the pixel cells may be arranged in other arrangements, such as horizontally side-by-side, vertically side-by-side, square, etc., and the present disclosure is not limited herein.

In some possible exemplary implementations, the pixel unit may include three sub-pixels, such as a red sub-pixel, a blue sub-pixel, and a green sub-pixel, and the three sub-pixels may be arranged horizontally side-by-side, vertically side-by-side, or in a zigzag fashion, etc., and the present disclosure is not limited herein.

Figure 4:
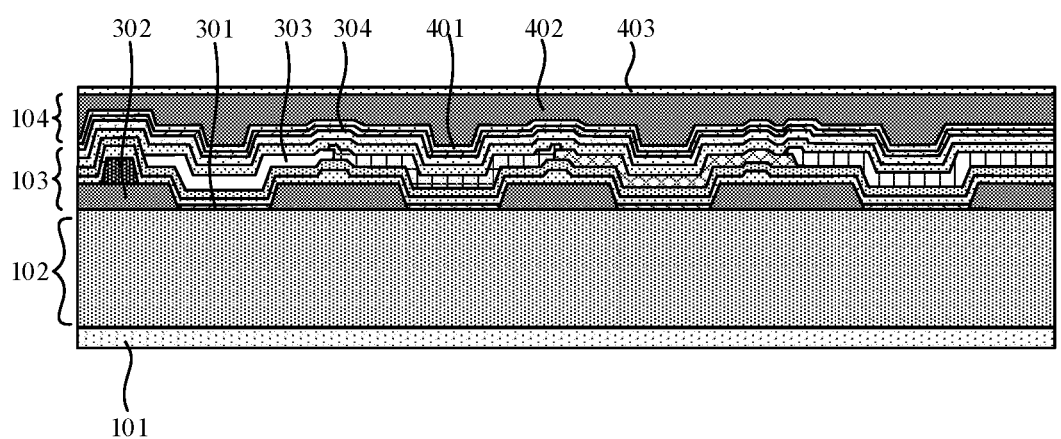
FIG. 4 is a schematic diagram of a sectional structure of a display substrate.

FIG. 4 is a schematic diagram of a sectional structure of a display substrate, and illustrates a structure of four sub-pixels of the display substrate. As shown in FIG. 4, on a plane perpendicular to the display substrate, each sub-pixel of the display substrate may include a drive circuit layer 102 arranged on a substrate 101, a emitting structure layer 103 arranged on a side of the drive circuit layer 102 away from the substrate, and an encapsulation layer 104 arranged on a side of the emitting structure layer 103 away from the substrate.

In an exemplary implementation, the base substrate 101 may be a flexible base substrate, or a rigid base substrate. The drive circuit layer 102 of each sub-pixel may include a pixel drive circuit composed of multiple transistors and storage capacitors. The emitting structure layer 103 of each sub-pixel may include at least a light emitting device composed of multiple film layers, and the multiple film layers may include an anode 301, a pixel define layer 302, an organic emitting layer 303 and a cathode 304. The anode 301 is connected to the pixel drive circuit, the organic emitting layer 303 is connected to the anode 301, the cathode 304 is connected to the organic emitting layer 303, the organic emitting layer 303 emits light of a corresponding color under driving of the anode 301 and the cathode 304. The encapsulation structure layer 104 may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, forming inorganic materials/organic materials/inorganic material laminated structure, thus ensuring that external water vapor cannot enter the light emitting structure layer 103.

In an exemplary implementation, the organic light emitting layer may include an emitting layer (EML), and any one or more of following layers: a hole injection layer (HIL), a hole transport layer (HTL), an electron block layer (EBL), a hole block layer (HBL), an electron transport layer (ETL), and an electron injection layer (EIL). In an exemplary implementation, one or more of the hole injection layers, hole transport layers, electron block layers, hole block layers, electron transport layers, and electron injection layer of all sub-pixels may be a common layer connected together. Emitting layers of adjacent sub-pixels may be overlapped slightly, or may be isolated.

Figure 5:
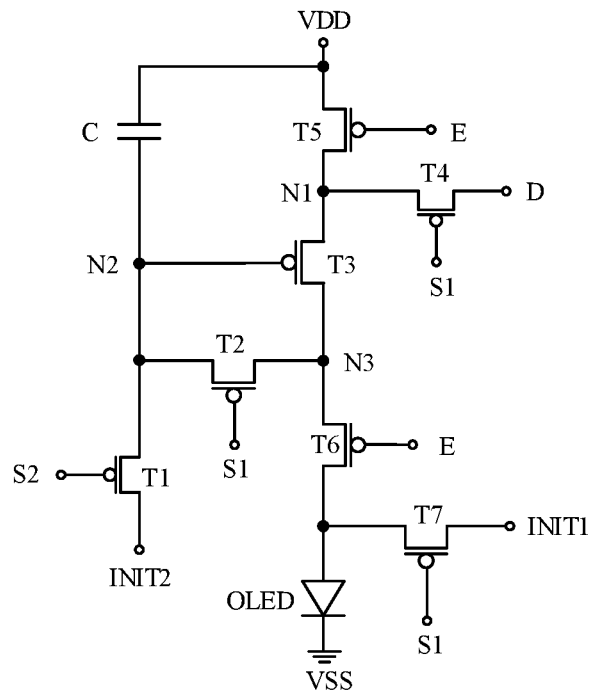
FIG. 5 is a schematic diagram of an equivalent circuit of a pixel drive circuit.

FIG. 5 is a schematic diagram of an equivalent circuit of a pixel drive circuit. In an exemplary implementation, the pixel drive circuit may have a structure of 3T1C, 4T1C, 5T1C, 5T2C, 6T1C, 7T1C or 8T1C. As shown in FIG. 5, the pixel drive circuit may include seven transistors (a first transistor T1 to a seventh transistor T7), one memory capacitor C, and the pixel drive circuit is respectively connected with eight signal lines (a data signal line D, a first scan signal line S1, a first scan signal line S2, a light emitting signal line E, a first power supply line VDD, a first initial signal line INIT1, a second initial signal line INIT2 and a second power supply line VSS).

In an exemplary implementation, the pixel drive circuit may include a first node N1, a second node N2, and a third node N3. Herein, the first node N1 is respectively connected with a first electrode of the third transistor T3, a second electrode of the fourth transistor T4, and a second electrode of the fifth transistor T5, the second node N2 is respectively connected with a second electrode of the first transistor, a first electrode of the second transistor T2, a control electrode of the third transistor T3, and a second end of the storage capacitor C, and the third node N3 is respectively connected with a second electrode of the second transistor T2, a second electrode of the third transistor T3, and a first electrode of the sixth transistor T6.

In an exemplary implementation, a first end of the storage capacitor C is connected with the first power line VDD, and the second end of the storage capacitor C is connected with the second node N2, i.e., the second end of the storage capacitor C is connected with the control electrode of the third transistor T3.

A control electrode of the first transistor T1 is connected with the second scan signal line S2, a first electrode of the first transistor T1 is connected with the second initial signal line INIT2, and a second electrode of the first transistor is connected with the second node N2. When a scan signal with an on-level is applied to the second scan signal line S2, the first transistor T1 transmits a first initial voltage to the control electrode of the third transistor T3 so as to initialize a charge amount of the control electrode of the third transistor T3.

A control electrode of the second transistor T2 is connected with the first scan signal line S1, the first electrode of the second transistor T2 is connected with the second node N2, and the second electrode of the second transistor T2 is connected with the third node N3. When a scan signal with an on-level is applied to the first scan signal line S1, the second transistor T2 enables the control electrode of the third transistor T3 to be connected with a second electrode of the third transistor T3.

The control electrode of the third transistor T3 is connected with the second node N2, i.e., the control electrode of the third transistor T3 is connected with the second end of the storage capacitor C, a first electrode of the third transistor T3 is connected with the first node N1, and the second electrode of the third transistor T3 is connected with the third node N3. The third transistor T3 may be referred to as a drive transistor, and the third transistor T3 determines an amount of a drive current flowing between the first power line VDD and the second power line VSS according to a potential difference between the control electrode and the first electrode of the third transistor T3.

A control electrode of the fourth transistor T4 is connected with the first scan signal line S1, a first electrode of the fourth transistor T4 is connected with the data signal line D, and a second electrode of the fourth transistor T4 is connected with the first node N1. The fourth transistor T4 may be referred to as a switch transistor, a scan transistor, etc., and when a scan signal with an on-level is applied to the first scan signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first power line VDD, and a second electrode of the fifth transistor T5 is connected with the first node N1. A control electrode of the sixth transistor T6 is connected with the light emitting signal line E, a first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a drive current path between the first power line VDD and the second power line VSS.

A control electrode of the seventh transistor T7 is connected with the first scan signal line S1, a first electrode of the seventh transistor T7 is connected with the first initial signal line INIT1, and a second electrode of the seventh transistor T7 is connected with the first electrode of the light emitting device. When a scan signal with an on-level is applied to the first scan signal line S1, the seventh transistor T7 transmits a second initial voltage to the first electrode of the light emitting device so as to initialize a charge amount accumulated in the first electrode of the light emitting device or release a charge amount accumulated in the first electrode of the light emitting device.

In an exemplary implementation, the light emitting device may be an OLED including a first electrode (anode), an organic light emitting layer, and a second electrode (cathode), which are stacked, or may be a QLED including a first electrode (anode), a quantum dot light emitting layer, and a second electrode (cathode), which are stacked.

In an exemplary implementation, a second electrode of the light emitting device is connected with the second power line VSS, a signal of the second power line VSS is a low-level signal, and a signal of the first power line VDD is a high-level signal continuously provided. The first scan signal line S1 is a scan signal line in a pixel drive circuit of a current display row, and the second scan signal line S2 is a scan signal line in a pixel drive circuit of a previous display row. That is, for an n-th display row, the first scan signal line S1 is S(n), and the second scan signal line S2 is S(n−1). The second scan signal line S2 of the current display row and the first scan signal line S1 in the pixel drive circuit of the previous display row are a same signal line, thus signal lines of the display panel may be reduced, so that a narrow bezel of the display panel is achieved.

In an exemplary implementation, the first transistor T1 to the seventh transistor T7 may be P-type transistors or N-type transistors. Use of a same type of transistors in a pixel drive circuit may simplify a process flow, reduce process difficulties of a display panel, and improve a product yield. In some possible implementations, the first transistor T1 to the seventh transistor T7 may include a P-type transistor and an N-type transistor.

In an exemplary implementation mode, the first transistor T1 to the seventh transistor T7 may be low temperature poly silicon thin film transistors, or may be oxide thin film transistors, or may be low temperature poly silicon thin film transistors and oxide thin film transistors. An active layer of a low temperature poly silicon thin film transistor may be made of Low Temperature Poly Silicon (LTPS for short), and an active layer of an oxide thin film transistor may be made of an oxide semiconductor (Oxide). The low temperature poly-silicon thin film transistor has advantages such as high migration rate and fast charging. The oxide thin film transistor has advantages such as low drain current. The low temperature poly-silicon thin film transistor and the oxide thin film transistor are integrated on one display substrate to form a Low Temperature Polycrystalline Oxide (LTPO for short) display substrate, so that advantages of the low temperature poly-silicon thin film transistor and the oxide thin film transistor can be utilized, low-frequency drive can be realized, power consumption can be reduced, and display quality can be improved.

Figure 6:
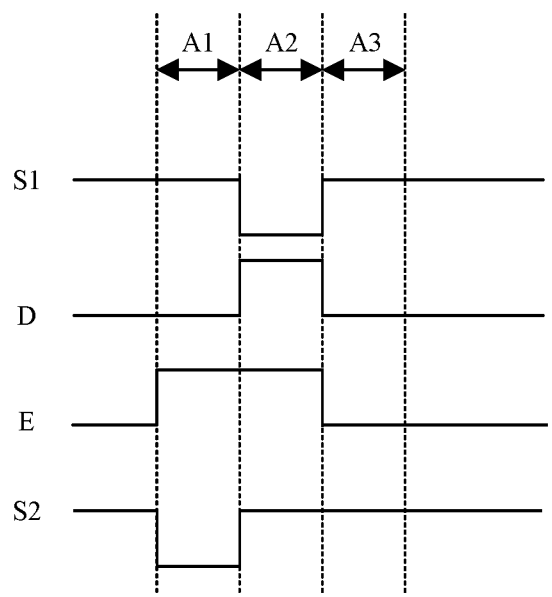
FIG. 6 is a working timing diagram of a pixel drive circuit.

FIG. 6 is a working timing diagram of a pixel drive circuit. An exemplary embodiment of the present disclosure will be described below through a working process of the pixel drive circuit exemplified in FIG. 5. The pixel drive circuit in FIG. 5 includes seven transistors (a first transistor T1 to a seventh transistor T7) and one storage capacitor C, and the seven transistors are all P-type transistors.

In an exemplary implementation, taking an OLED as example, the working process of the pixel drive circuit may include the following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is the low-level signal, so that the first transistor T1 is turned on, a second initial voltage of the second initial signal line INIT2 is provided to the second node N2 to initialize the storage capacitor C, thereby clearing an original data voltage in the storage capacitor. The signals of the first scan signal line S1 and the light emitting signal line E are high-level signals, so that the second transistor T2, the fourth transistor T4, the fifth transistor T5, the sixth transistor T6, and the seventh transistor T7 are turned off. An OLED does not emit light in this stage.

In a second stage A2, referred to as a data writing stage or a threshold compensation stage, the signal of the first scan signal line S1 is a low-level signal, signals of the second scan signal line S2 and the light emitting signal line E are high-level signals, and the data signal line D outputs a data voltage. In this stage, a second end of the storage capacitor C is at a low level, so the third transistor T3 is turned on. The signal of the first scan signal line S1 is a low-level signal, so that the second transistor T2, the fourth transistor T4, and the seventh transistor T7 are turned on. The second transistor T2 and the fourth transistor T4 are turned on, so that the data voltage output by the data signal line D is provided to the second node N2 through a first node N1, the turned-on third transistor T3, a third node N3, and the turned-on second transistor T2, and the storage capacitor C is charged with a difference between the data voltage output by the data signal line D and a threshold voltage of the third transistor T3. A voltage at the second end (the second node N2) of the storage capacitor C is Vd-|Vth|, wherein Vd is the data voltage output by the data signal line D, and Vth is the threshold voltage of the third transistor T3. The seventh transistor T7 is turned on, so that the first initial voltage of the first initial signal line INIT1 is provided to a first electrode of the OLED to initialize (reset) the first electrode of the OLED and clear its internal pre-stored voltage, thereby completing initialization and ensuring that the OLED does not emit light. The signal of the second scan signal line S2 is a high-level signal, so that the first transistor T1 is turned off. The signal of the light emitting signal line E is a high-level signal, so that the fifth transistor T5 and the sixth transistor T6 are turned off.

In a third stage A3, referred to as a light emitting stage, the signal of the light emitting signal line E is a low-level signal, and the signals of the first scan signal line S1 and the second scan signal line S2 are high-level signals. The signal of the light emitting signal line E is a low-level signal, so that the fifth transistor T5 and the sixth transistor T6 are turned on, and a power voltage output by the first power line VDD provides a drive voltage to the first electrode of the OLED through the turned-on fifth transistor T5, the third transistor T3, and the sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. The voltage of the second node N2 is Vdata-|Vth|, so the drive current of the third transistor T3 is as follows.

$$I = K*(Vgs - Vth)^2 = K*[(Vdd - Vd + |Vth|) - Vth]^2 = K*[(Vdd - Vd]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power line VDD.

Figure 7:
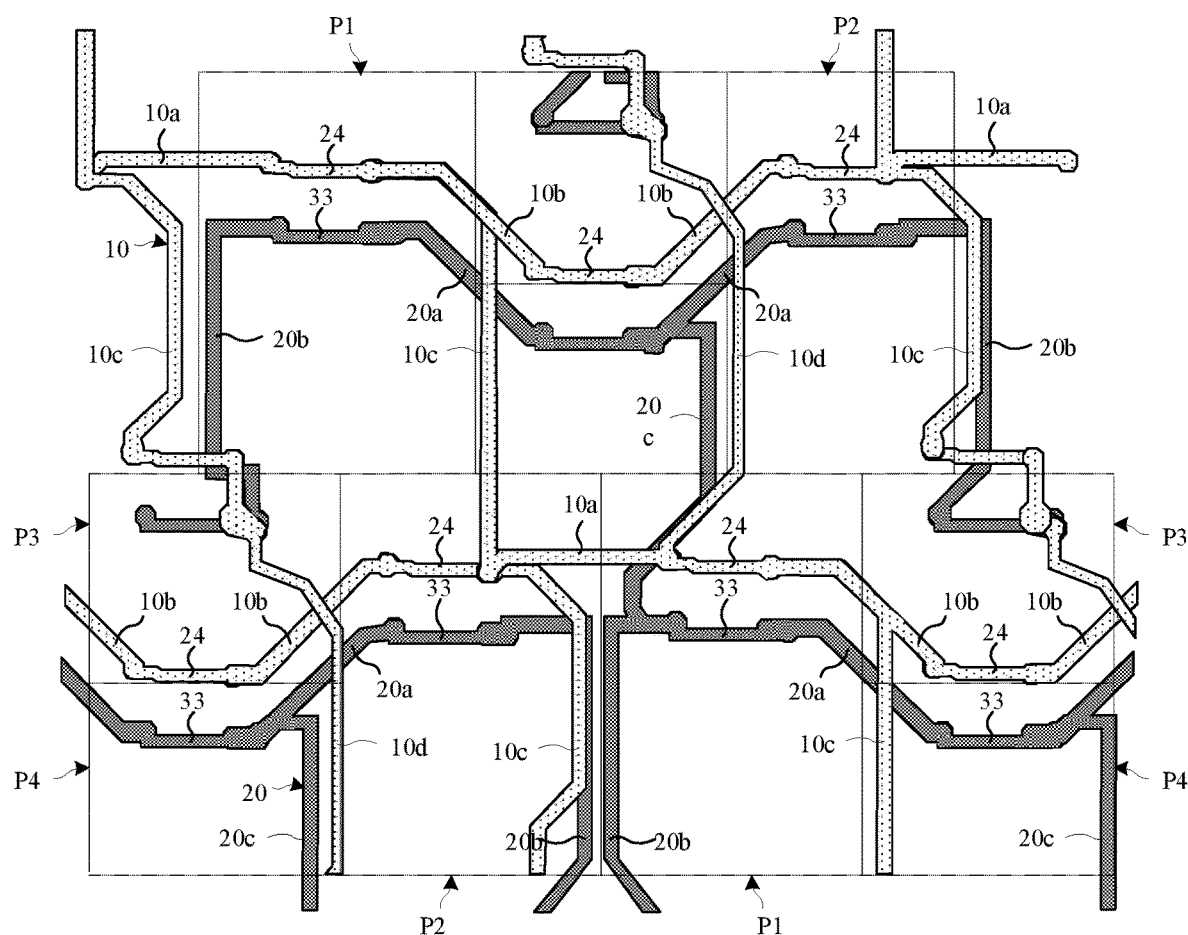
FIG. 7 is a schematic diagram of the structure of an initial transmission line in a display substrate of an exemplary embodiment of the present disclosure.

FIG. 7 is a schematic diagram of a structure of an initial transmission line in a display substrate of an exemplary embodiment of the present disclosure, illustrating a planar structure of an initial transmission line of 10 sub-pixels in a pixel island of a transmissive display area. In a plane parallel to the display substrate, the transmissive display area may include a plurality of pixel islands, and the plurality of pixel islands are configured to perform image display and transmit light. At least one pixel island may include a plurality of sub-pixels, and the plurality of sub-pixels may include a first sub-pixel P1 emitting a first color light, a second sub-pixel P2 emitting a second color light, a third sub-pixel P3 emitting a third color light, and a fourth sub-pixel P4, the first sub-pixel P1 and the second sub-pixel P2 may be spaced along a first direction X, and the third sub-pixel P3 and the fourth sub-pixel P4 may be provided sequentially along a second direction Y, and the third sub-pixel P3 and the fourth sub-pixel P4 may be located between the first sub-pixel P1 and the second sub-pixel P2. As shown in FIG. 7, in an exemplary embodiment, the pixel island of the transmissive display area may include a first initial transmission line 10, a second initial transmission line 20, and at least one pixel drive circuit (not shown), the pixel drive circuit may include a plurality of transistors and a storage capacitor, the pixel drive circuit is connected to the first initial transmission line 10 and the second initial transmission line 20, respectively, and the first initial transmission line 10 and the second initial transmission line 20 form the initial transmission line for transmitting the initial signal of the present disclosure. The first initial transmission line 10 may provide a signal line of the first initial signal to the pixel drive circuit to initialize (reset) the light emitting device, and the second initial transmission line 20 may provide a signal line of the second initial signal to the pixel drive circuit to initialize (reset) the storage capacitor.

In an exemplary embodiment, the first initial transmission line 10 may include a first transmission line with a main part extending in a first direction X and a second transmission line with a main part extending in a second direction Y, the first transmission line and the second transmission line being connected to form a first grid structure, and the first grid structure may have a closed shape in an orthographic projection in the display substrate plane.

In an exemplary implementation, the second initial transmission line 20 may include a first transmission line with a main part extending in a first direction X and a second transmission line with a main part extending in a second direction Y, the first transmission line being connected to the second transmission line to form a second grid structure, and the second grid structure may have a closed shape in an orthographic projection in the display substrate plane.

In the present disclosure, the extension of a main part of A in the B direction means that A may include a main portion, which is a line, a line segment or a strip-shaped body, and a secondary portion connected with the main portion, the main portion extending in the B direction, and a length of the main portion extending in the B direction is greater than a length of the secondary portion extending in other directions.

Figure 8A:
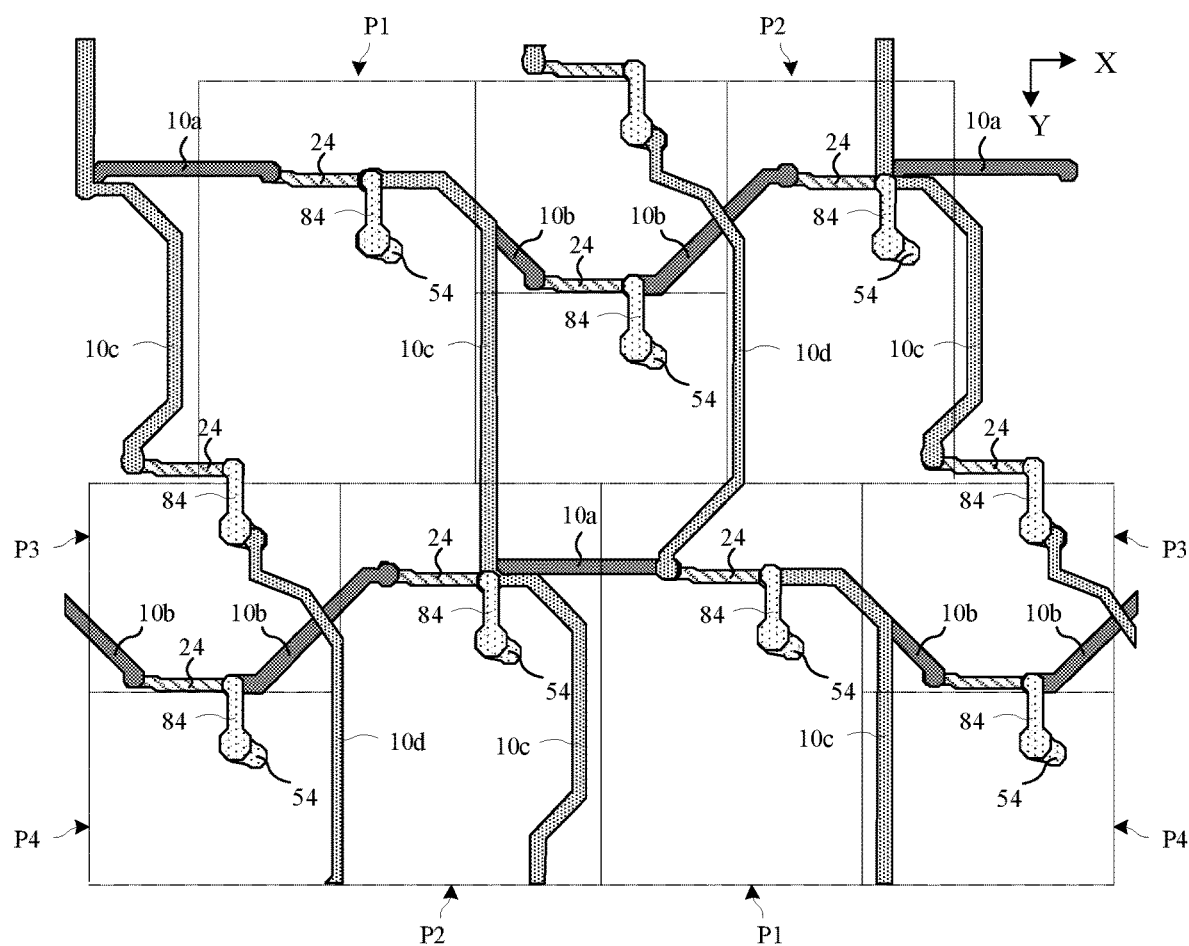
FIG. 8a is a schematic diagram of the structure of a first initial transmission line of an exemplary embodiment of the present disclosure.

FIG. 8a is a schematic diagram of a structure of a first initial transmission line of an exemplary embodiment of the present disclosure, illustrating a planar structure of a first initial transmission line of 10 sub-pixels in a pixel island of a transmissive display area. As shown in FIGS. 7 and 8a, the first initial transmission line 10 may include a first initial signal line 24, an eleventh transmission connection line 10a, a twelfth transmission connection line 10b, a thirteenth transmission connection line 10c, and a fourteenth transmission connection line 10d. The eleventh transmission connection line 10a and the twelfth transmission connection line 10b may serve as a first transmission line with a main part extending in a first direction X, and the thirteenth transmission connection line 10c and the fourteenth transmission connection line 10d may serve as a second transmission line with a main part extending in a second direction Y.

In an exemplary embodiment, the first initial signal line 24 may be provided in each sub-pixel and may be in the form of a straight line with a main part extending in a first direction X. The eleventh transmission connection line 10a and the twelfth transmission connection line 10b may be provided between adjacent sub-pixels in the first direction X, being configured to connect the first initial signal line 24 of adjacent sub-pixels in the first direction X. The thirteenth transmission connection line 10c and the fourteenth transmission connection line 10d may be provided between adjacent sub-pixels in the second direction Y, being configured to connect the first initial signal line 24 of adjacent sub-pixels in the second direction Y.

In an exemplary implementation, the eleventh transmission connection line 10a is provided between the first sub-pixel P1 and the second sub-pixel P2 adjacent in the first direction X. The first initial signal line 24 of the second sub-pixel P2 is connected to the first initial signal line 24 of the first sub-pixel P1 adjacent in the first direction X via the eleventh transmission connection line 10a.

In an exemplary implementation, the twelfth transmission connection line 10b is provided between the first sub-pixel P1 and the fourth sub-pixel P4 adjacent in the first direction X and between the second sub-pixel P2 and the fourth sub-pixel P4 adjacent in the first direction X. The first initial signal line 24 of the first sub-pixel P1 is connected to the first initial signal line 24 of the fourth sub-pixel P4 adjacent in the first direction X via the twelfth transmission connection line 10b, and the first initial signal line 24 of the fourth sub-pixel P4 is connected to the first initial signal line 24 of the second sub-pixel P2 adjacent in the first direction X via the twelfth transmission connection line 10b.

In an exemplary implementation, the thirteenth transmission connection line 10c is provided between a first sub-pixel P1 and a second sub-pixel P2 adjacent in the second direction Y, and between a second sub-pixel P2 and a third sub-pixel P3 adjacent in the second direction Y. The first initial signal line 24 of the first sub-pixel P1 is connected to the first initial signal line 24 of the second sub-pixel P2 adjacent in the second direction Y via thirteenth transmission connection line 10c, and the first initial signal line 24 of the second sub-pixel P2 is connected to the first initial signal line 24 of the third sub-pixel P3 adjacent in the second direction Y via the thirteenth transmission connection line 10c.

In an exemplary implementation, the fourteenth transmission connection line 10d is provided between the first sub-pixel P1 and the third sub-pixel P3 adjacent in the second direction Y. The first initial signal line 24 of the third sub-pixel P3 is connected to the first initial signal line 24 of the first sub-pixel P1 adjacent in the second direction Y via the fourteenth transmission connection line 10d.

In an exemplary implementation, the first initial transmission line 10 may also include a fifty-fourth connection electrode 54 as the first transmission electrode and an eighty-fourth connection electrode 84 as the second transmission electrode. The fifty-fourth connection electrode 54 and the eighty-fourth connection electrode 84 may be provided in each sub-pixel, and the fourteenth transmission connection line 10d may be connected to the first initial signal line 24 of the third sub-pixel P3 via the fifty-fourth connection electrode 54 and the eighty-fourth connection electrode 84.

In an exemplary implementation, in the third sub-pixel P3, the fourteenth transmission connection line 10d is connected to the fifty-fourth connection electrode 54 through a via. The eighty-fourth connection electrode 84 is connected to the fifty-fourth connection electrode 54 through a via on the one hand, and to the first initial signal line 24 of the third sub-pixel P3 through a via on the other hand.

In an exemplary implementation, the fifty-fourth connection electrode 54 may serve as the first electrode of the seventh transistor in the pixel drive circuit, and the fifty-fourth connection electrode 54 may be connected to the first region of the active layer of the seventh transistor through a via.

Figure 8B:
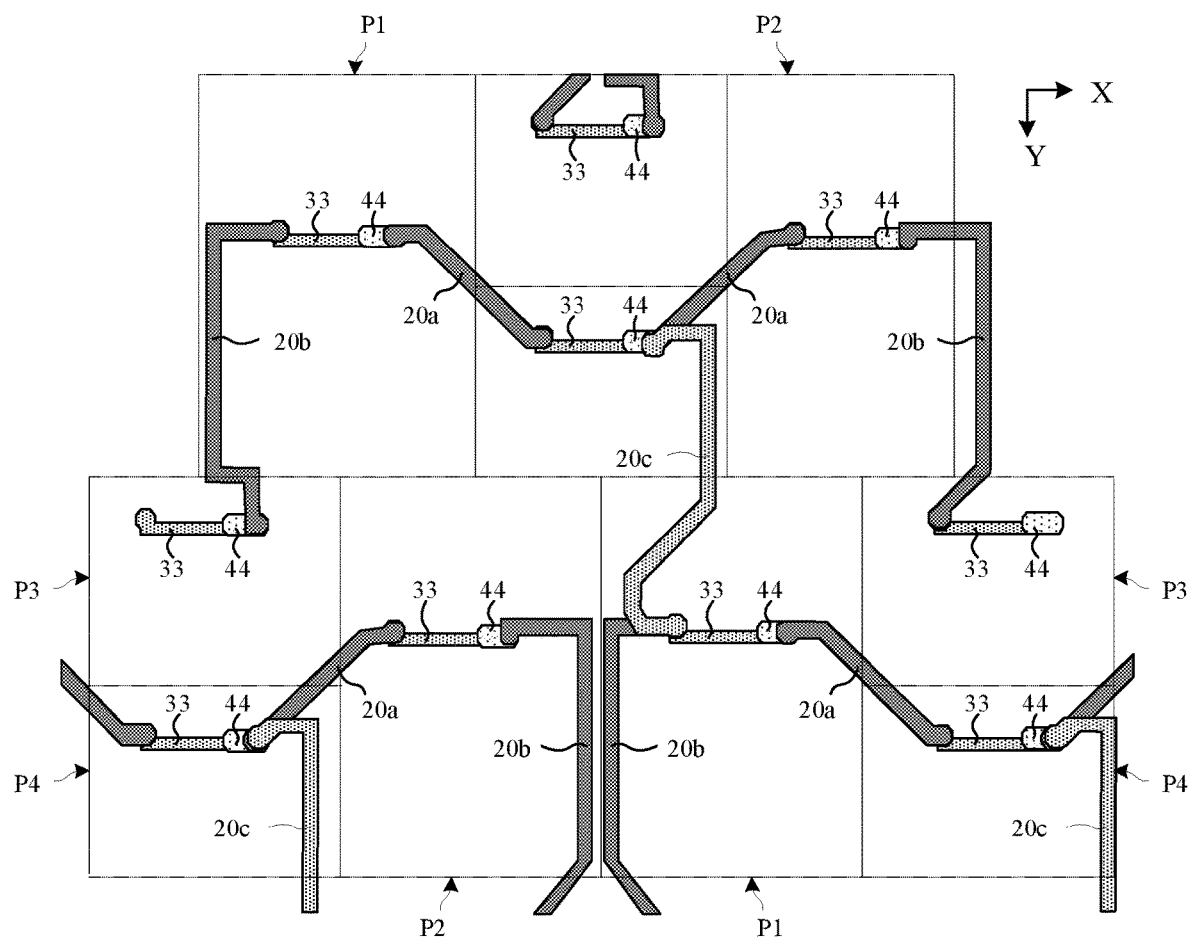
FIG. 8b is a schematic diagram of the structure of a second initial transmission line of an exemplary embodiment of the present disclosure.

FIG. 8b is a schematic diagram of a structure of a second initial transmission line of an exemplary embodiment of the present disclosure, illustrating a planar structure of a second initial transmission line of 10 sub-pixels in a pixel island of a transmissive display area. As shown in FIG. 7 and FIG. 8b, the second initial transmission line 20 may include a second initial signal line 33, a twenty-first transmission connection line 20a, a twenty-second transmission connection line 20b, and a twenty-third transmission connection line 20c. The second initial signal line 33 and the twenty-first transmission connection line 20a may serve as a first transmission line with a main part extending in a first direction X, and the twenty-second transmission connection line 20b and the twenty-third transmission connection line 20c may be used as a second transmission line with a main part extending in a second direction Y.

In an exemplary embodiment, the second initial signal line 33 may be provided in each sub-pixel and may be in the form of a straight line extending along the first direction X. The twenty-first transmission connection line 20a may be provided between adjacent sub-pixels in the first direction X, being configured to connect the second initial signal line 33 of adjacent sub-pixels in the first direction X. The twenty-second transmission connection line 20b and the twenty-third transmission connection line 20c may be provided between adjacent sub-pixels in the second direction, being configured to connect the second initial signal line 33 of adjacent sub-pixels in the second direction Y.

In an exemplary implementation, the twenty-first transmission connection line 20a may be provided between the first sub-pixel P1 and the fourth sub-pixel P4 adjacent in the first direction X and between the second sub-pixel P2 and the fourth sub-pixel P4 adjacent in the first direction X. The second initial signal line 33 of the first sub-pixel P1 is connected to the second initial signal line 33 of the fourth sub-pixel P4 adjacent in the first direction X via the twenty-first transmission connection line 20a, and the second initial signal line 33 of the fourth sub-pixel P4 is connected to the second initial signal line 33 of the second sub-pixel P2 adjacent in the first direction X via the twenty-first transmission connection line 20a.

In an exemplary implementation, the twenty-second transmission connection line 20b is provided between the first sub-pixel P1 and the third sub-pixel P3 adjacent in the second direction Y and between the second sub-pixel P2 and the third sub-pixel P3 adjacent in the second direction Y. The second initial signal line 33 of the first sub-pixel P1 is connected to the second initial signal line 33 of the third sub-pixel P3 adjacent in the second direction Y via the twenty-second transmission connection line 20b, and the second initial signal line 33 of the second sub-pixel P2 is connected to the second initial signal line 33 of the third sub-pixel P3 adjacent in the second direction Y via the twenty-second transmission connection line 20b.

In an exemplary implementation, the twenty-third transmission connection line 20c is provided between the first sub-pixel P1 and the fourth sub-pixel P4 adjacent in the second direction Y. The second initial signal line 33 of the fourth sub-pixel P4 is connected to the second initial signal line 33 of the first sub-pixel P1 adjacent in the second direction Y via the twenty-third transmission connection line 20c.

In an exemplary embodiment, the second initial transmission line 20 may further include a forty-fourth connection electrode 44 as a third transmission electrode, the forty-fourth connection electrode 44 may be provided in each sub-pixel, the forty-fourth connection electrode 44 being connected to the second initial signal line 33 through a via on the one hand, and to the twenty-first transmission connection line 20a, the twenty-second transmission connection line 20b, and the twenty-third transmission connection line 20c, respectively, through the via on the other hand.

In an exemplary embodiment, the forty-fourth connection electrode 44 may serve as the first electrode of the first transistor in the pixel drive circuit, and the forty-fourth connection electrode 44 may be connected to the first region of the active layer of the first transistor through a via.

In an exemplary embodiment, in a plane perpendicular to the display substrate, the pixel islands of the transmissive display area may include a first insulating layer, a semiconductor layer, a second insulating layer, a first conductive layer, a third insulating layer, a second conductive layer, a fourth insulating layer, a third conductive layer, a fifth insulating layer, a fourth conductive layer, a first planarization layer, a fifth conductive layer, a second planarization layer, and a sixth conductive layer provided sequentially on the base substrate, and the fourth conductive layer and the fifth conductive layer may be transparent conductive layers.

In an exemplary embodiment, the fourth conductive layer may include an eleventh transmission connection line 10a and a twelfth transmission connection line 10b in the first initial transmission line 10, and a twenty-first transmission connection line 20a and a twenty-second transmission connection line 20b in the second initial transmission line 20.

In an exemplary embodiment, the fifth conductive layer may include a thirteenth transmission connection line 10c and a fourteenth transmission connection line 10d in the first initial transmission line 10, and a twenty-third transmission connection line 20c in the second initial transmission line 20.

In an exemplary embodiment, the first conductive layer may include a second initial signal line 33 in the second initial transmission line 20, and the second conductive layer may include a first initial signal line 24 in the first initial transmission line 10.

In an exemplary embodiment, the third conductive layer may include a forty-fourth connection electrode 44 in the second initial transmission line 20, and a fifty-fourth connection electrode 54 in the first initial transmission line 10, and the sixth conductive layer includes an eighty-fourth connection electrode 84 in the first initial transmission line 10.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition, coating, etc. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being disposed on a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" or "an orthographic projection of A includes an orthographic projection of B" refers to that a boundary of the orthographic projection of B falls within a range of a boundary of the orthographic projection of A, or the boundary of the orthographic projection of A is overlapped with the boundary of the orthographic projection of B.

In an exemplary embodiment, taking 10 sub-pixels as an example, the preparation process of the display substrate may include the following operations.

Figure 9:
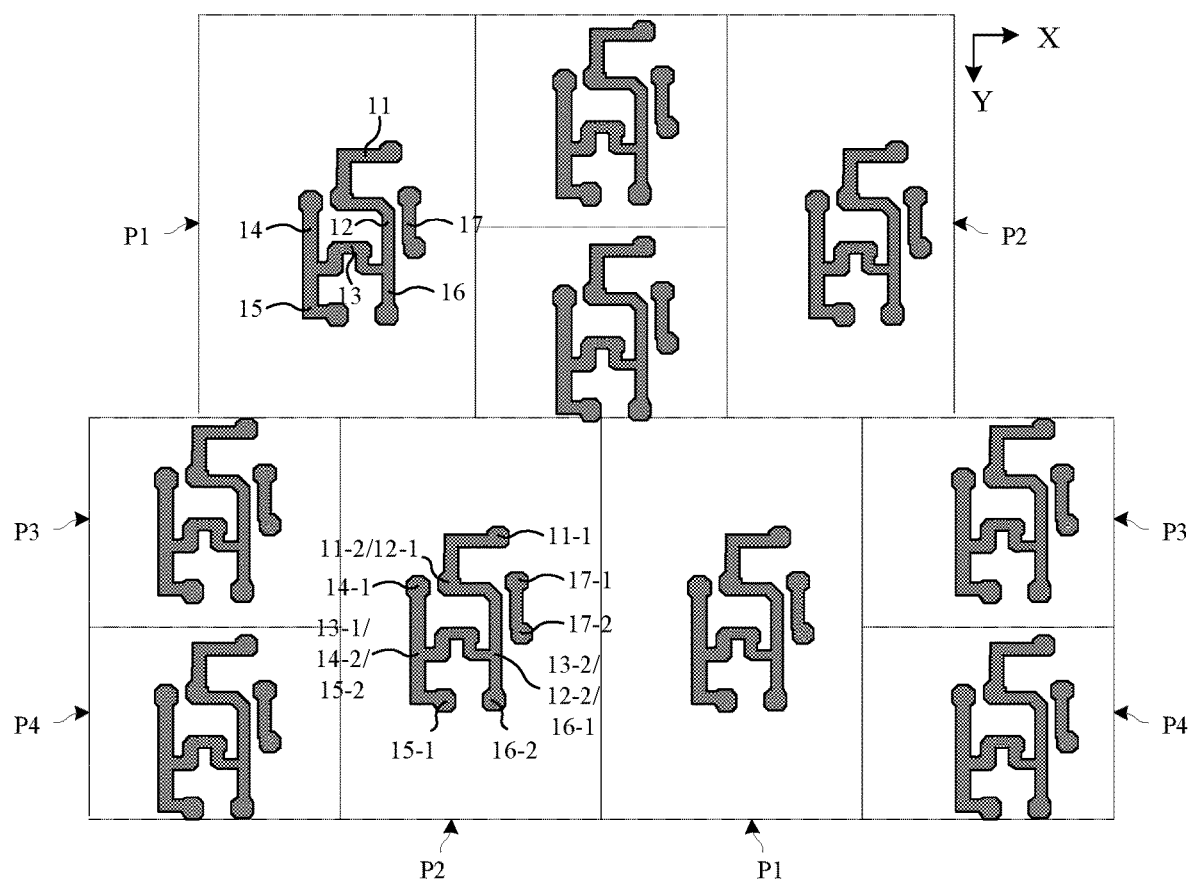
FIG. 9 is a schematic diagram after a pattern of a semiconductor layer is formed according to an exemplary embodiment of the present disclosure.

(1) A pattern of a semiconductor layer is formed. In an exemplary embodiment, forming a pattern of a semiconductor layer may include: depositing sequentially a first insulating thin film and a semiconductor thin film on a substrate, and patterning the semiconductor thin film through a patterning process to form a first insulating layer overlying the substrate and a semiconductor layer disposed on the first insulating layer, as shown in FIG. 9.

In an exemplary embodiment, the semiconductor layer may include a first active layer 11 of a first transistor T1, a second active layer 12 of a second transistor T2, a third active layer 13 of a third transistor T3, a fourth active layer 14 of a fourth transistor T4, a fifth active layer 15 of a fifth transistor T5, a sixth active layer 16 of a sixth transistor T6, and a seventh active layer 17 of a seventh transistor T7 located at each sub-pixel. The first active layer 11 to the sixth active layer 16 of the sixth transistor T6 may be an interconnected one-piece structure, and the seventh active layer 17 of the seventh transistor T7 may be provided separately.

In an exemplary embodiment, the first active layer 11, the second active layer 12, and the fifth active layer 15 may be shaped in an "L" shape, the third active layer 13 may be shaped in an "n" shape, and the fourth active layer 14, the sixth active layer 16, and the seventh active layer 17 may be shaped in an "I" shape.

In an exemplary embodiment, an active layer of each transistor may include a first region, a second region, and a channel region located between the first region and the second region. In an exemplary embodiment, the first region 11-1 of the first active layer 11 may be provided separately, the second region 11-2 of the first active layer 11 may serve as the first region 12-1 of the second active layer 12 simultaneously, the first region 13-1 of the third active layer 13 may serve as the second region 14-2 of the fourth active layer 14 and the second region 15-2 of the fifth active layer 15 simultaneously, and the second region 13-2 of the third active layer 13 may serve as the second region 12-2 of the second active layer 12 and the first region 16-1 of the sixth active layer 16 simultaneously, and the first region 14-1 of the fourth active layer 14, the first region 15-1 of the fifth active layer 15, the second region 16-2 of the sixth active layer 16, the first region 17-1 of the seventh active layer 17, and the second region 17-2 of the seventh active layer 17 can be provided separately.

In an exemplary embodiment, the semiconductor layers of the first sub-pixel P1, the second sub-pixel P2, the third sub-pixel P3, and the fourth sub-pixel P4 may have substantially the same shape and location.

Figure 10A:
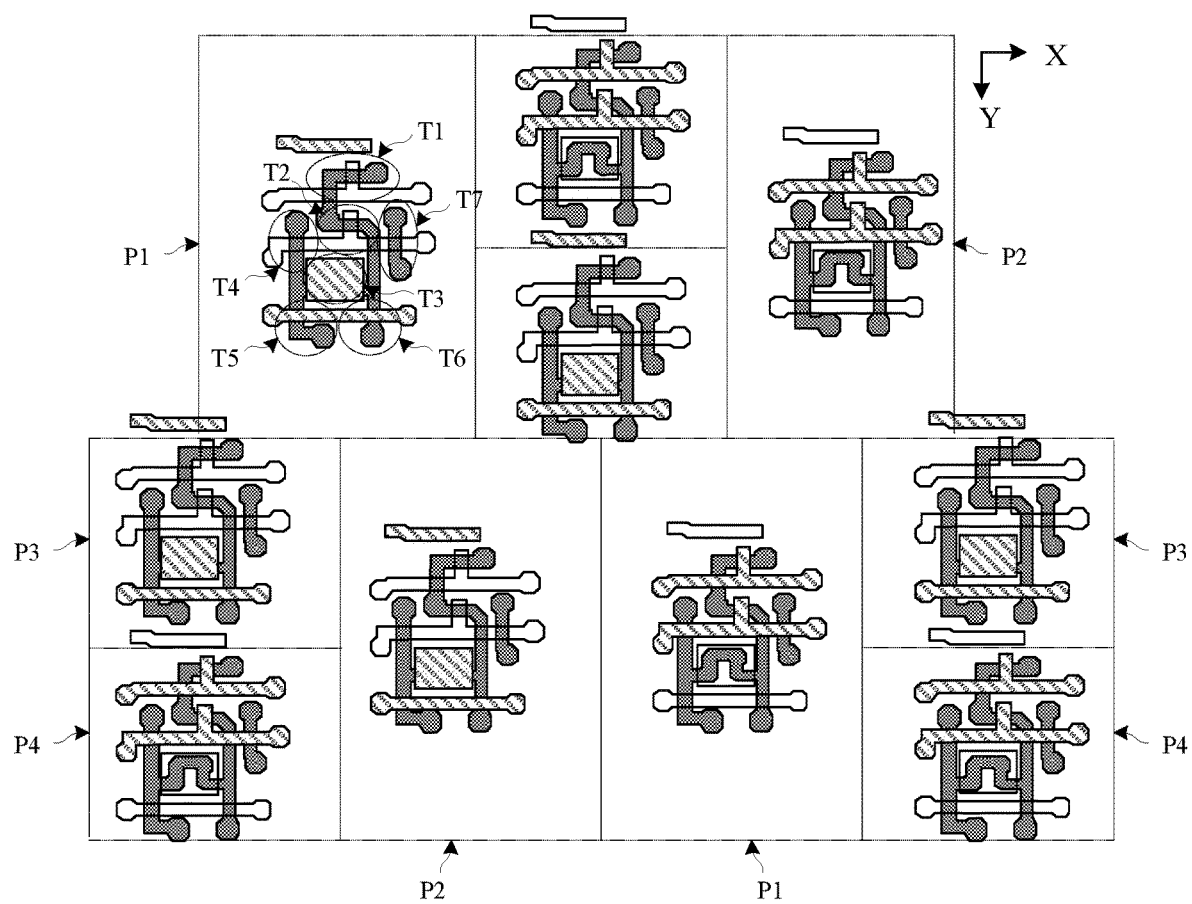
FIG. 10a is a schematic diagram after a pattern of a first conductive layer is formed according to an exemplary embodiment of the present disclosure.

(2) Forming a pattern of a first conductive layer. In an exemplary embodiment, forming a pattern of a first conductive layer may include: sequentially depositing a second insulating thin film and a first conductive thin film on the substrate on which the above-mentioned pattern is formed, and patterning the first conductive thin film through a patterning process to form a second insulating layer that covers a pattern of the semiconductor layer and form a pattern of the first conductive layer disposed on the second insulating layer; as shown in FIG. 10a and FIG. 10b, and FIG. 10b is a planar schematic diagram of the first conductive layer in FIG. 10a.

Figure 10B:
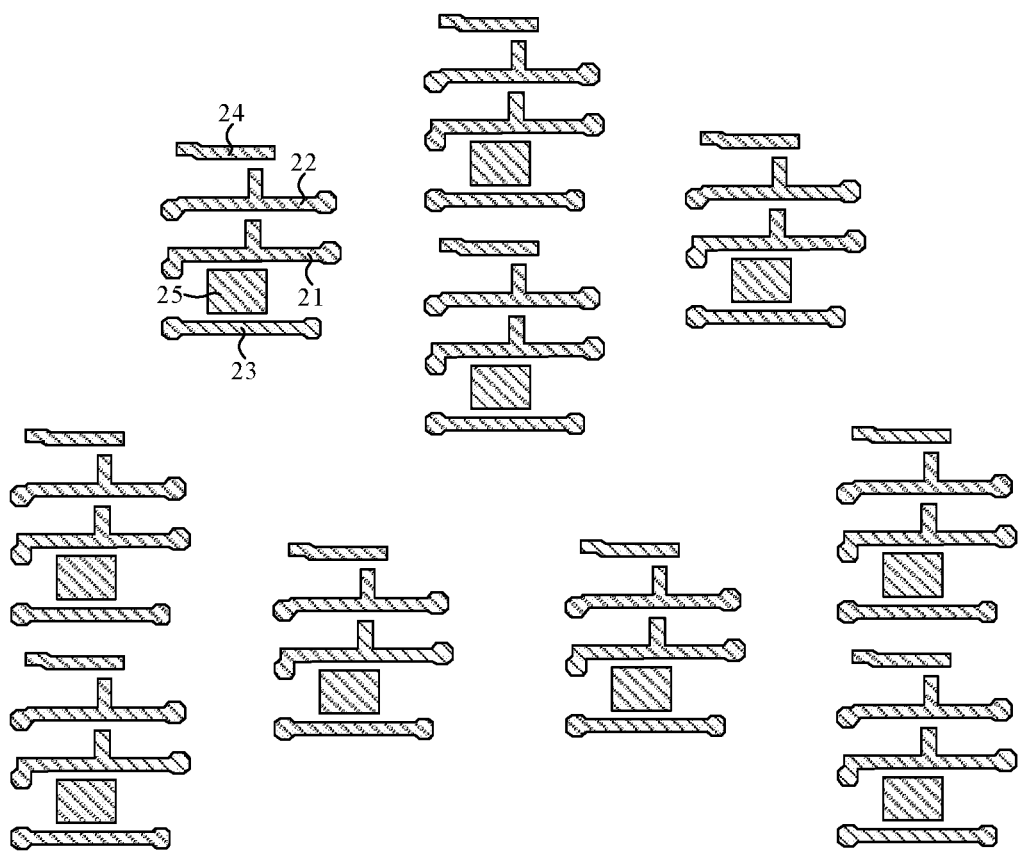

In conjunction with FIGS. 9 through 10b, the first conductive layer pattern includes at least a first scan signal line 21, a second scan signal line 22, a light emitting control signal line 23, a first initial signal line 24, and a first electrode plate 25 located at each sub-pixel, and In an exemplary embodiment, the first conductive layer may be referred to as a first gate metal (GATE 1) layer.

In an exemplary embodiment, the first electrode plate 25 may be rectangular, and rectangle corners may be set with chamfer. The first electrode plate 25 may be located between the first scan signal line 21 and the light emitting control signal line 23. There is an overlapped region between an orthographic projection of the first electrode plate 25 on the substrate and an orthographic projection of the third active layer of the third transistor T3 on the substrate. In an exemplary embodiment, the first electrode plate 25 may simultaneously serve as an electrode plate of the storage capacitor and a gate electrode of the third transistor T3.

In an exemplary embodiment, the first scan signal line 21, the second scan signal line 22, the light emitting control signal line 23, and the first initial signal line 24 may be in the shape of a line with a main part extending in the first direction X. The first scan signal line 21 may be located on a side of the first electrode plate 25 in the opposite direction of the second direction Y, the second scan signal line 22 may be located on a side of the first scan signal line 21 away from the first electrode plate 25, the first initial signal line 24 may be located on a side of the second scan signal line 22 away from the first electrode plate 25, and the light emitting control signal line 23 may be located on a side of the first electrode plate 25 in the second direction Y.

In an exemplary embodiment, the region where the first scan signal line 21 overlaps with the second active layer 12 serves as the gate electrode of the second transistor T2, the first scan signal line 21 is provided with a first gate block projecting toward a side of the second scan signal line 22. The orthographic projection of the first gate block on the base substrate and the orthographic projection of the second active layer 12 on the base substrate have an overlapped region to form the second transistor T2 with a double-gate structure. The region where the first scan signal line 21 overlaps with the fourth active layer 14 serves as the gate electrode of the fourth transistor T4, and the region where the first scan signal line 21 overlaps with the seventh active layer 17 serves as the gate electrode of the seventh transistor T7. The region where the second scan signal line 22 overlaps with the first active layer 11 serves as the gate electrode of the first transistor T1 of the dual-gate structure, and the second scan signal line 22 is provided with a second gate block projecting toward a side of the first initial signal line 24. The orthographic projection of the second gate block on the base substrate and the orthographic projection of the first active layer 11 on the base substrate have an overlapped region to form the first transistor T1 of the dual-gate structure. The region where the light emitting control signal line 23 overlaps with the fifth active layer 15 serves as the gate electrode of the fifth transistor T5, and the region where the light emitting control signal line 23 overlaps with the sixth active layer 16 is serves as the gate electrode of the sixth transistor T6.

In an exemplary embodiment, after the first conductive layer pattern is formed, the semiconductor layer may be subjected to a conductive treatment by using the first conductive layer as a shield. A region of the semiconductor layer, which is shielded by the first conductive layer, forms channel regions of the first transistor T1 to the seventh transistor T7, and a region of the semiconductor layer, which is not shielded by the first conductive layer, is made to be conductive, that is, first regions and second regions of the first active layer to the seventh active layer are all made to be conductive.

In an exemplary embodiment, the first conductive layers of the first sub-pixel P1, the second sub-pixel P2, the third sub-pixel P3, and the fourth sub-pixel P4 may have substantially the same shape and location.

Figure 11A:
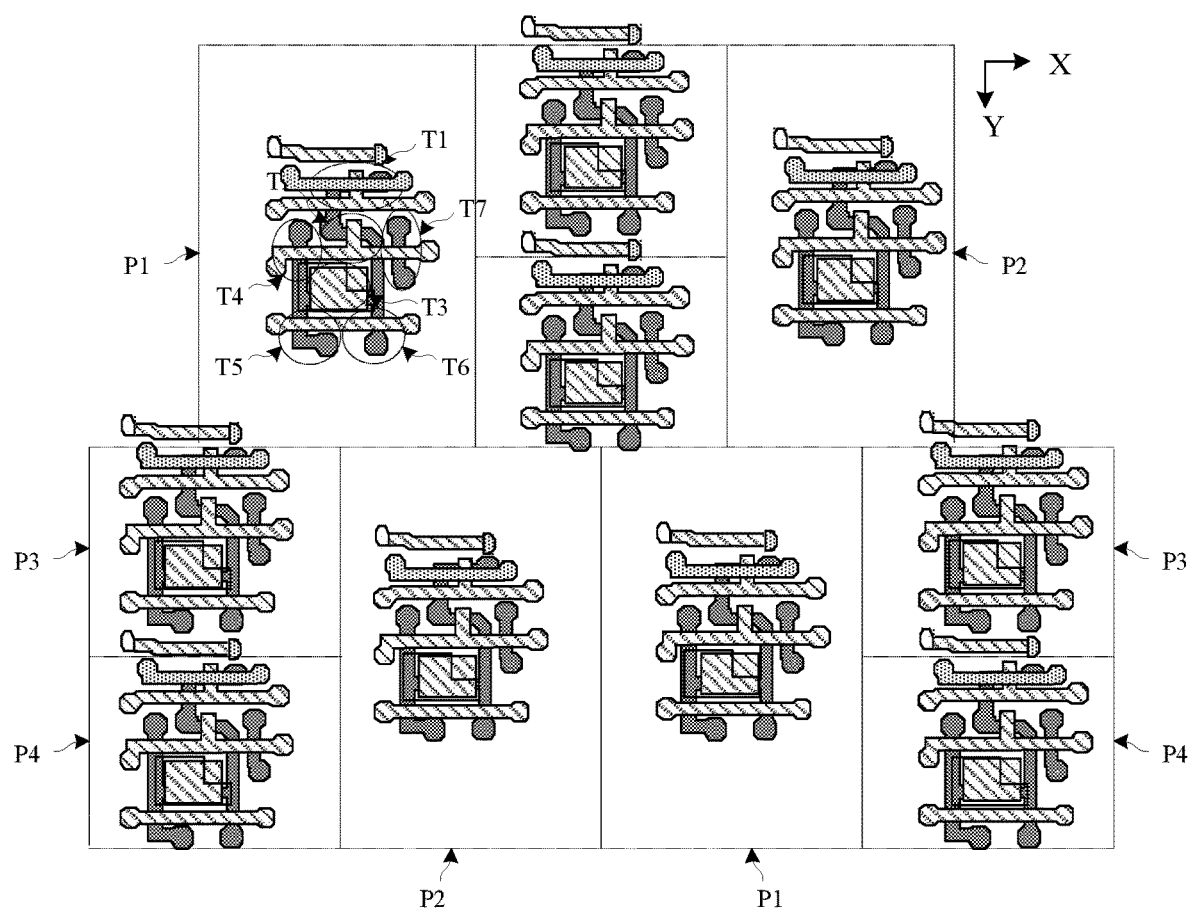
FIG. 11a is a schematic diagram after a pattern of a second conductive layer is formed according to an exemplary embodiment of the present disclosure.
Figure 11B:
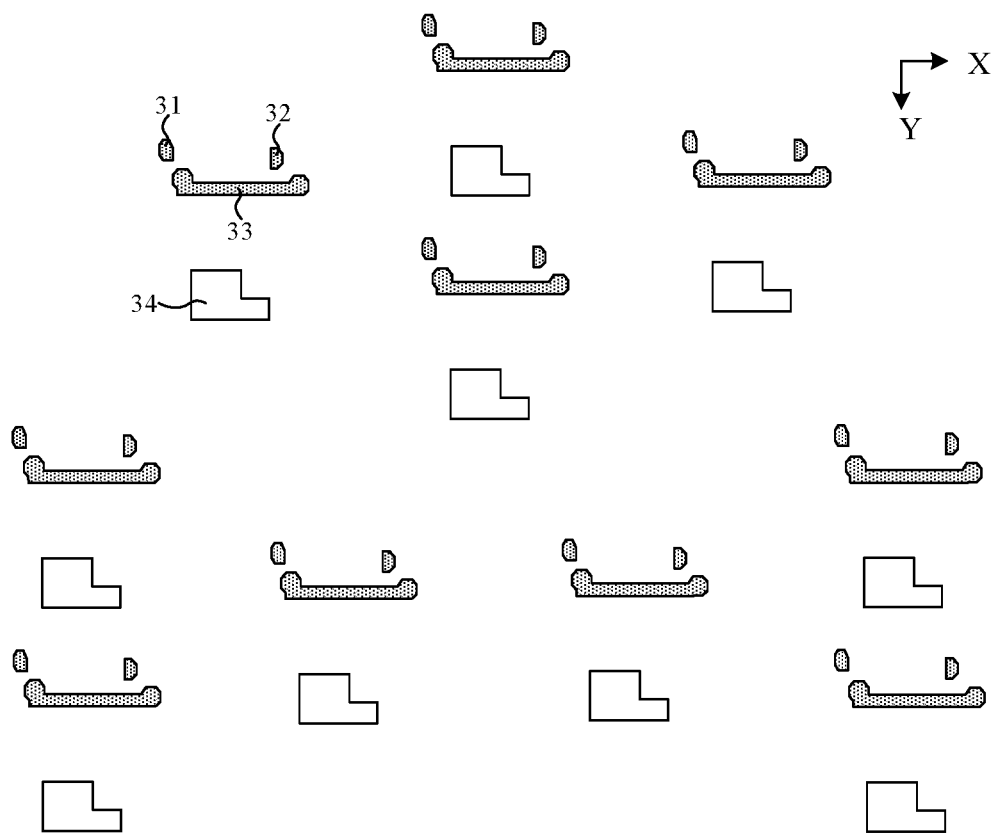

(3) A pattern of a second conductive layer is formed. In an exemplary embodiment, forming a pattern of a second conductive layer may include: a third insulation thin film and a second conductive thin film are sequentially deposited on the base substrate on which the aforementioned patterns are formed, and the second conductive thin film is patterned through a patterning process to form a third insulation layer that covers the first conductive layer and the pattern of the second conductive layer disposed on the third insulation layer, as shown in FIG. 11a and FIG. 11b. FIG. 11b is a schematic plan view of the second conductive layer in FIG. 11a. In an exemplary embodiment, the second conductive layer may be referred to as a second gate metal (GATE2) layer.

In conjunction with FIGS. 9 through 11b, the second conductive layer pattern includes at least a thirty-first connection electrode 31, a thirty-second connection electrode 32, a second initial signal line 33, and a second electrode plate 34 at each sub-pixel.

The thirty-first connection electrode 31 may be rectangular, rectangle corners may be set with chamfer. The thirty-first connection electrode 31 may be located at the first end of the first initial signal line 24, and the thirty-first connection electrode 31 is configured to be connected to the subsequently formed forty-first connection electrode.

In an exemplary embodiment, the thirty-second connection electrode 32 may be rectangular, rectangle corners may be set with chamfer. The thirty-second connection electrode 32 may be located at the second end of the first initial signal line 24, and the thirty-second connection electrode 32 is configured to be connected to the subsequently formed forty-second connection electrodes.

In an exemplary embodiment, the second initial signal line 33 may be in the shape of a line with a main part extending in the first direction X. The second initial signal line 33 may be located between the second scan signal line 22 and the first initial signal line 24, and the orthographic projection of the second initial signal line 33 on the base substrate overlaps at least partially with the orthographic projection of the first region of the first active layer on the base substrate.

In an exemplary embodiment, the outline of the second electrode plate 34 may be rectangular, rectangle corners may be provided with chamfers, the second electrode plate 34 may be located between the first scan signal line 21 and the light emitting control signal line 23, the orthographic projection of the second electrode plate 34 on the base substrate overlaps at least partially with the orthographic projection of the first electrode plate 25 on the base substrate, the second electrode plate 34 may serve as another electrode plate of the storage capacitor, and the first electrode plate 25 and the second electrode plate 34 constitute the storage capacitor of the pixel drive circuit. The second electrode plate 34 is provided with an opening, which may be located at a corner toward a side of the first scan signal line 21, and the opening exposes a third insulating layer covering the first electrode plate 25. In an exemplary embodiment, the opening is configured to accommodate a first via subsequently formed, which is located in the opening and exposes the first electrode plate 25, so that a second electrode of the first transistor T1 subsequently formed is connected with the first electrode plate 25.

In an exemplary embodiment, the second conductive layers of the first sub-pixel P1, the second sub-pixel P2, the third sub-pixel P3, and the fourth sub-pixel P4 may have substantially the same shape and location.

Figure 12:
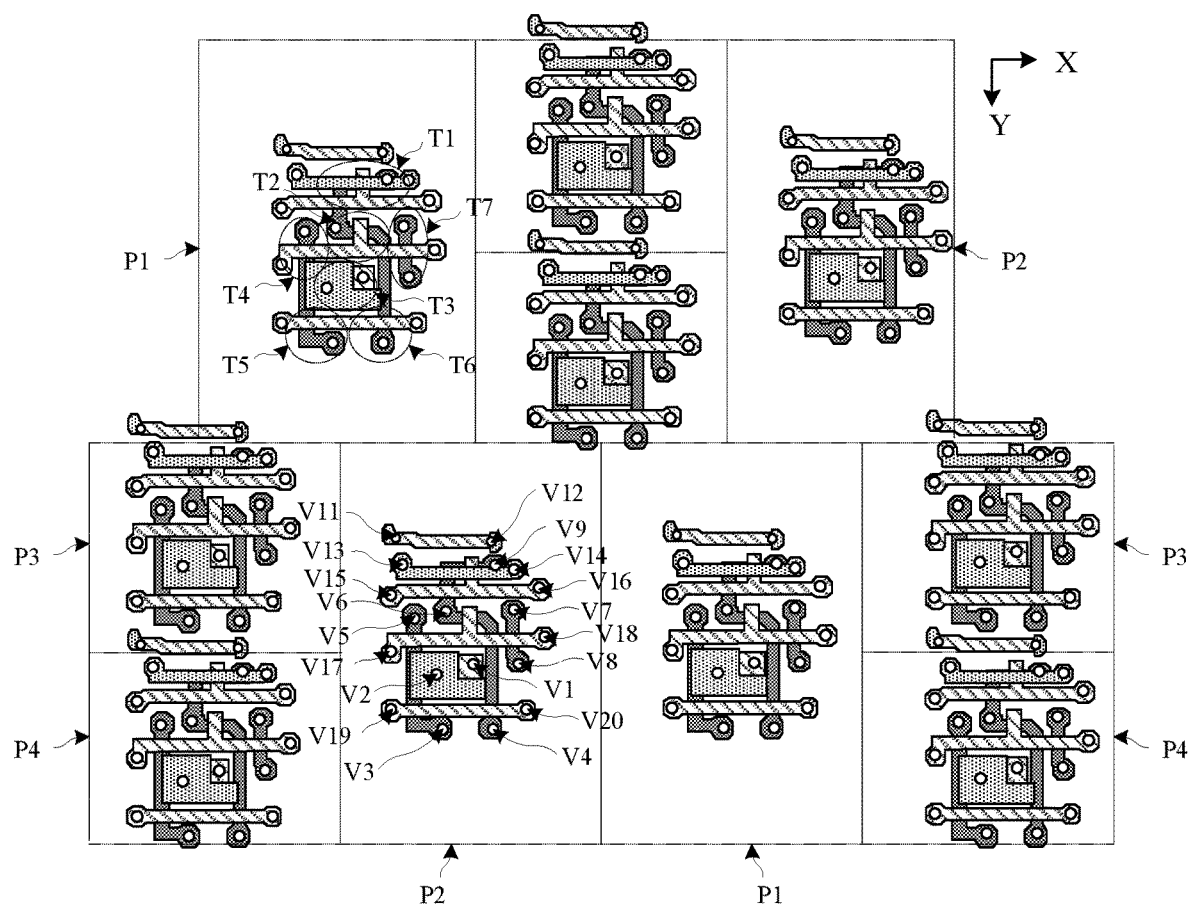
FIG. 12 is a schematic diagram of a display substrate after a pattern of a fourth insulating layer is formed according to an exemplary embodiment of the present disclosure.

(4) A pattern of a fourth insulating layer is formed. In an exemplary embodiment, forming the fourth insulating layer pattern may include: depositing a fourth insulating film on the base substrate on which the aforementioned patterns are formed, patterning the fourth insulating film through a patterning process to form a fourth insulating layer covering the second conductive layer, with a plurality of vias provided in the fourth insulating layer of each circuit unit, as shown in FIG. 12.

In conjunction with FIGS. 9 through 12, the plurality of vias includes at least a first via V1, a second via V2, a third via V3, a fourth via V4, a fifth via V5, a sixth via V6, a seventh via V7, an eighth via V8, a ninth via V9, an eleventh via V11, a twelfth via V12, a thirteenth via V13, a fourteenth via V14, a fifteenth via V15, a sixteenth via V16, a seventeenth via V17, an eighteenth via V18, a nineteenth via V19, and a twentieth via V20 in each sub-pixel.

In an exemplary embodiment, the orthographic projection of the first via V1 on the base substrate is located within the range of the orthographic projection of the opening of the second electrode plate 34 on the base substrate, the fourth insulating layer and the third insulating layer within the first via V1 are etched away to expose the surface of the first electrode plate 25, and the first via V1 is configured such that the second electrode of the subsequently formed first transistor T1 is connected to the first electrode plate 25 through the via.

In an exemplary embodiment, the orthographic projection of the second via V2 on the base substrate is located within the range of the orthographic projection of the second electrode plate 34 on the base substrate, the fourth insulating layer within the second via V2 is etched away to expose the surface of the second electrode plate 34, and the second via V2 is configured such that a subsequently formed first power line is connected to the second electrode plate 34 through the via. In an exemplary embodiment, the second via V2 served as a power supply via may be plural, and the plurality of second vias V2 may be sequentially arranged along the first direction X or the second direction Y, thereby increasing the connection reliability between the first power supply line and the second electrode plate 34.

In an exemplary embodiment, the orthographic projection of the third via V3 on the base substrate is located within the range of the orthographic projection of the first region of the fifth active layer on the base substrate, the fourth insulating layer, the third insulating layer, and the second insulating layer within the third via V3 are etched away to expose the surface of the first region of the fifth active layer, and the third via V3 is configured such that a subsequently formed first power line is connected to the fifth active layer through the via.

In an exemplary embodiment, the orthographic projection of the fourth vias V4 on the base substrate is located within the range of the orthographic projection of the second region of the sixth active layer on the base substrate, the fourth insulating layer, the third insulating layer, and the second insulating layer within the fourth vias V4 are etched away to expose the surface of the second region of the sixth active layer, and the fourth vias V4 is configured such that the second electrode of the subsequently formed sixth transistor T6 is connected to the second region of the sixth active layer through the via.

In an exemplary embodiment, the orthographic projection of the fifth via V5 on the base substrate is located within the range of the orthographic projection of the first region of the fourth active layer on the base substrate, the fourth insulating layer, the third insulating layer, and the second insulating layer within the fifth via V5 are etched away to expose the surface of the first region of the fourth active layer, and the fifth via V5 is configured such that a subsequently formed data signal line is connected to the first region of the fourth active layer through the via.

In an exemplary embodiment, the orthographic projection of the sixth vias V6 on the base substrate is located within the range of the orthographic projection of the second region of the first active layer on the base substrate, the fourth insulating layer, the third insulating layer, and the second insulating layer within the sixth vias V6 are etched away to expose the surface of the second region of the first active layer (also the first region of the second active layer), and the sixth vias V6 is configured such that the second electrode of the subsequently formed first transistor T1 (and also the first electrode of the second transistor T2) is connected to the second region of the first active layer through this vias.

In an exemplary embodiment, the orthographic projection of the seventh via V7 on the base substrate is located within the range of the orthographic projection of the first region of the seventh active layer on the base substrate, the fourth insulating layer, the third insulating layer, and the second insulating layer within the seventh via V7 are etched away to expose the surface of the first region of the seventh active layer, and the seventh via V7 is configured such that the first electrode of the subsequently formed seventh transistor T7 is connected to the first region of the seventh active layer through the via.

In an exemplary embodiment, the orthographic projection of the eighth via V8 on the base substrate is located within the range of the orthographic projection of the second region of the seventh active layer on the base substrate, the fourth insulating layer, the third insulating layer, and the second insulating layer within the eighth via V8 are etched away to expose the surface of the second region of the seventh active layer, and the eighth via V8 is configured such that the second electrode of the subsequently formed seventh transistor T7 is connected to the second region of the seventh active layer through the via.

In an exemplary embodiment, the orthographic projection of the ninth via V9 on the base substrate overlaps at least partially with the orthographic projection of the first region of the first active layer and the second initial signal line 33 on the base substrate. The ninth via V9 is a jumper via, with the fourth insulating layer, the third insulating layer, and the second insulating layer within half of the ninth via V9 being etched away to expose the surface of the first region of the first active layer, and the fourth insulating layer within the other half of the ninth via V9 being etched away to expose the surface of the second initial signal line 33. The ninth via V9 is configured such that the subsequently formed forty-fourth connection electrode is simultaneously connected to both the first region of the first active layer and the second initial signal line 33 through this via. The present disclosure makes the forty-fourth connection electrode as the third transmission electrode connected to both the first region and the second initial signal line of the first active layer through a jumper via by providing the ninth via of the jumper via structure, which has a simple structure, effectively reduces the occupied area of the pixel drive circuit, reduces the layout space of the pixel drive circuit, and improves the transmission rate of the transmissive display area.

In an exemplary embodiment, the orthographic projection of the eleventh via V11 on the base substrate overlaps at least partially with the orthographic projection of the thirty-first connection electrode 31 and the first end of the first initial signal line 24 on the base substrate. The eleventh via V11 is a jumper via, with the fourth insulating layer and the third insulating layer in half of the eleventh via V11 being etched away to expose the surface of the first end of the first initial signal line 24, and the fourth insulating layer in the other half of the eleventh via V11 being etched away to expose the surface of the thirty-first connection electrode 31, and the eleventh via V11 being configured to allow a subsequently formed forty-first connection electrode to connect to the third eleventh connection electrode 31 and the first initial signal line 24 simultaneously via this vias. By providing the eleventh via of the jumper via structure, the present disclosure enables the forty-first connection electrode to be simultaneously connected to the thirty-first connection electrode and the first initial signal line through a jumper via, which has a simple structure, effectively reduces the occupied area of the pixel drive circuit, reduces the layout space of the pixel drive circuit, and improves the transmission rate of the transmissive display area.

In an exemplary embodiment, the orthographic projection of the twelfth via V12 on the base substrate overlaps at least partially with the orthographic projection of the thirty-second connection electrodes 32 and the second end of the first initial signal line 24 on the base substrate. The twelfth via V12 is a jumper via, with the fourth insulating layer and the third insulating layer in half of the twelfth via V12 being etched away to expose the surface of the second end of the first initial signal line 24, and the fourth insulating layer in the other half of the twelfth via V12 being etched away to expose the surface of the thirty-second connection electrode 32, and the twelfth via V12 being configured to allow a subsequently formed forty-second connection electrode to connect to both the thirty-second connection electrode 32 and the first initial signal line 24 through this vias simultaneously. The present disclosure makes the forty-second connection electrode connected to the thirty-second connection electrode and the first initial signal line simultaneously through a jumper via by providing the twelfth via of the jumper via structure, which has a simple structure, effectively reduces the occupied area of the pixel drive circuit, reduces the layout space of the pixel drive circuit, and improves the transmission rate of the transmissive display area.

In an exemplary embodiment, the orthographic projection of the thirteenth via V13 on the base substrate is located within the range of the orthographic projection of the first end of the second initial signal line 33 on the base substrate, the fourth insulating layer within the thirteenth via V13 is etched away to expose the surface of the first end of the second initial signal line 33, and the thirteenth via V13 is configured such that a subsequently formed forty-third connection electrode is connected to the first end of the second initial signal line 33 through the via.

In an exemplary embodiment, the orthographic projection of the fourteenth via V14 on the base substrate is located within the orthographic projection of the second end of the second initial signal line 33 on the base substrate, the fourth insulating layer within the fourteenth via V14 is etched away to expose the surface of the second end of the second initial signal line 33, and the fourteenth via V14 is configured such that a subsequently formed forty-fourth connection electrode is connected to the second end of the second initial signal line 33 through the via.

In an exemplary embodiment, the orthographic projection of the fifteenth via V15 on the base substrate is located within the orthographic projection of the first end of the second scan signal line 22 on the base substrate, the fourth insulating layer and the third insulating layer within the fifteenth via V15 are etched away to expose the surface of the first end of the second scan signal line 22, and the fifteenth via V15 is configured such that the subsequently formed forty-fifth connection electrode 45 is connected to the first end of the second scan signal line 22 through this vias.

In an exemplary embodiment, the orthographic projection of the sixteenth via V16 on the base substrate is located within the range of the orthographic projection of the second end of the second scan signal line 22 on the base substrate, the fourth insulating layer and the third insulating layer within the sixteenth via V16 are etched away to expose the surface of the second end of the second scan signal line 22, and the sixteenth via V16 is configured such that a subsequently formed forty-sixth connection electrode is connected to the second end of the second scan signal line 22 through the via.

In an exemplary embodiment, the orthographic projection of the seventeenth via V17 on the base substrate is located within the orthographic projection of the first end of the first scan signal line 21 on the base substrate, the fourth insulating layer and the third insulating layer within the seventeenth via V17 are etched away to expose the surface of the first end of the first scan signal line 21, and the seventeenth via V17 is configured such that a subsequently formed forty-seventh connection electrode is connected to the first end of the first scan signal line 21 through the via.

In an exemplary embodiment, the orthographic projection of the eighteenth via V18 on the base substrate is located within the range of the orthographic projection of the second end of the first scan signal line 21 on the base substrate, the fourth insulating layer and the third insulating layer within the eighteenth via V18 are etched away to expose the surface of the second end of the first scan signal line 21, and the eighteenth via V18 is configured such that a subsequently formed forty-eighth connection electrode is connected to the second end of the first scan signal line 21 through the via.

In an exemplary embodiment, the orthographic projection of the nineteenth via V19 on the base substrate is located within the orthographic projection of the first end of the light emitting control signal line 23 on the base substrate, the fourth insulating layer and the third insulating layer within the nineteenth via V19 are etched away to expose the surface of the first end of the light emitting control signal line 23, and the nineteenth via V19 is configured such that a subsequently formed forty-ninth connection electrode is connected to the first end of the light emitting control signal line 23 through the via.

In an exemplary embodiment, the orthographic projection of the twentieth via V20 on the base substrate is located within the orthographic projection of the second end of the light emitting control signal line 23 on the base substrate, the fourth insulating layer and the third insulating layer within the twentieth via V20 are etched away to expose the surface of the second end of the light emitting control signal line 23, and the twentieth via V20 is configured such that a subsequently formed fiftieth connection electrode is connected to the second end of the light emitting control signal line 23 through the via.

In an exemplary embodiment, the plurality of vias of the first sub-pixel P1, the second sub-pixel P2, the third sub-pixel P3, and the fourth sub-pixel P4 may have substantially the same shape and location.

Figure 13A:
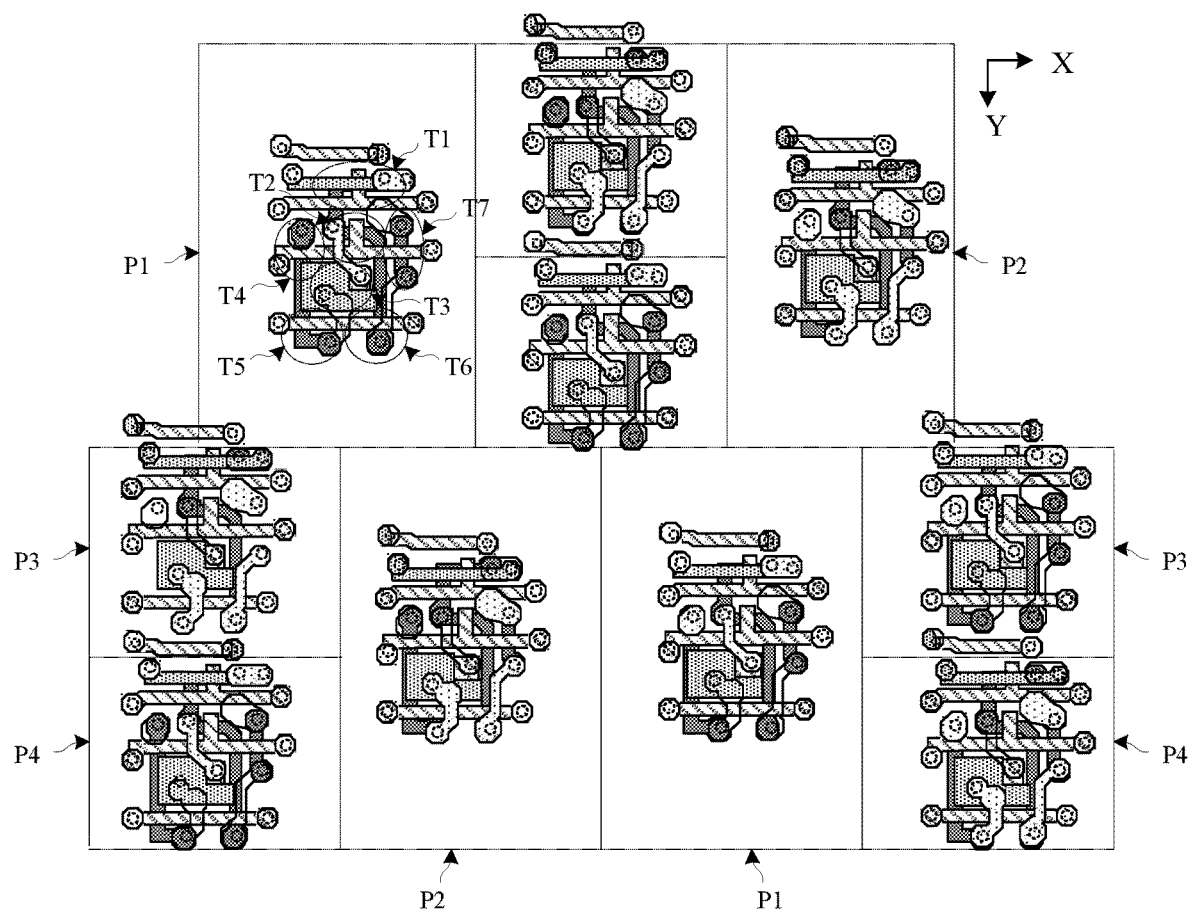
FIG. 13a is a schematic diagram after a pattern of a third conductive layer is formed according to an exemplary embodiment of the present disclosure.
Figure 13B:
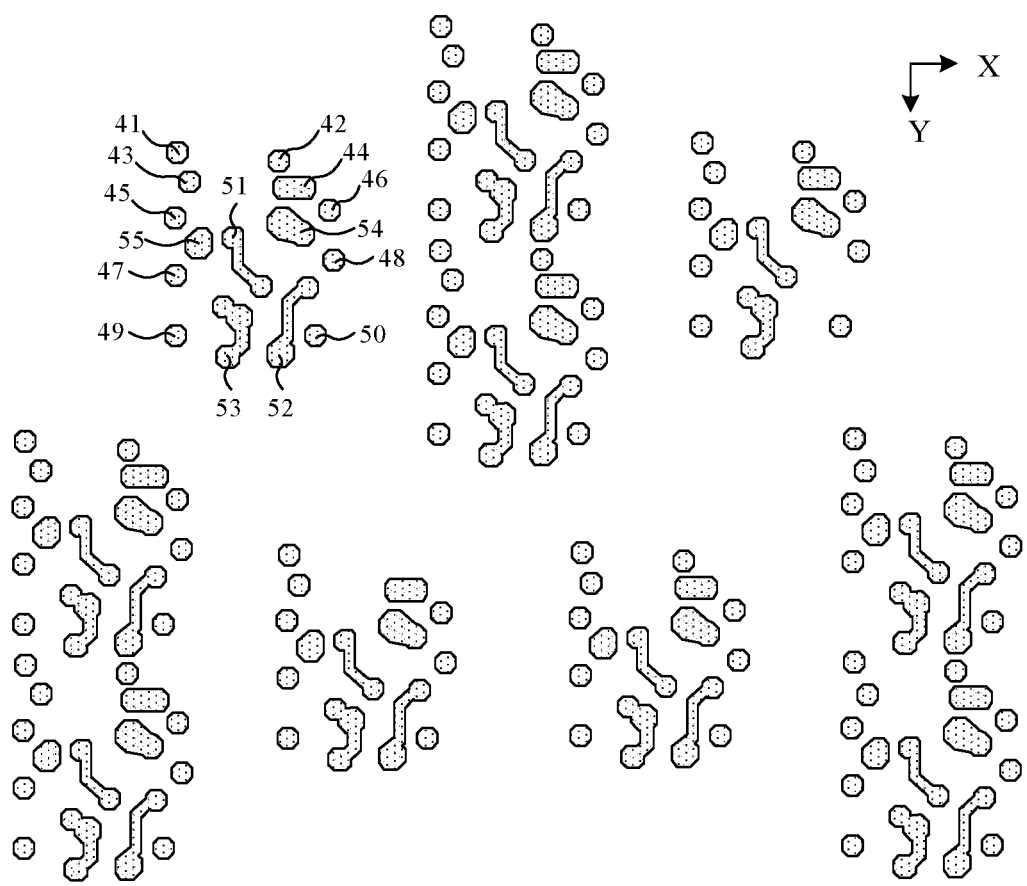

(5) A pattern of a third conductive layer is formed. In an exemplary embodiment, forming the third conductive layer may include: depositing a third conductive film on the base substrate on which the aforementioned patterns are formed, patterning the third conductive film using a patterning process to form a pattern of the third conductive layer provided on the fourth insulating layer, as shown in FIG. 13a and FIG. 13b, with FIG. 13b showing a schematic plan view of the third conductive layer in FIG. 13a. In an exemplary embodiment, the third conductive layer may be referred to as a first source-drain metal layer (SD1).

In conjunction with FIGS. 9 to 13b, the third conductive layer includes at least a forty-first connection electrode 41, a forty-second connection electrode 42, a forty-third connection electrode 43, a forty-fourth connection electrode 44, a forty-fifth connection electrode 45, a forty-sixth connection electrode 46, a forty-seventh connection electrode 47, a forty-eighth connection electrode 48, a forty-ninth connection electrode 49, a fiftieth connection electrode 50, fifty-first connection electrode 51, fifty-second connection electrode 52, fifty-third connection electrode 53, fifty-fourth connection electrode 54, and fifty-fifth connection electrode 55 in each sub-pixel.

In an exemplary embodiment, the forty-first connection electrode 41 may be rectangular, rectangle corners may be set with chamfer, the forty-first connection electrode 41 is connected to the thirty-first connection electrode 31 and the first end of the first initial signal line 24 simultaneously through the eleventh via V11, and the forty-first connection electrode 41 is configured to be connected to a subsequently formed sixty-first connection line, or to a subsequently formed sixty-second connection line.

In an exemplary embodiment, the forty-second connection electrode 42 may be rectangular, and rectangle corners may be set with chamfer, the forty-second connection electrode 42 is connected to the thirty-second connection electrode 32 and the second end of the first initial signal line 24 simultaneously through the twelfth via V12, and the forty-second connection electrode 42 is configured to be connected to a subsequently formed sixty-first connection line, or to a subsequently formed sixty-second connection line.

In an exemplary embodiment, the forty-third connection electrode 43 may be rectangular, and rectangle corners may be set with chamfer, the forty-third connection electrode 43 is connected to the first end of the second initial signal line 33 through the thirteenth via V13, and the forty-third connection electrode 43 is configured to be connected to a subsequently formed sixty-third connection line or to a subsequently formed sixty-seventh connection line.

In an exemplary embodiment, the forty-fourth connection electrode 44 may be rectangular, and rectangle corners may be set with chamfer, and the forty-fourth connection electrode 44 is connected to the first region of the first active layer and the second initial signal line 33 simultaneously through the ninth via V9 on the one hand, and to the second end of the second initial signal line 33 through the fourteenth via V14 on the other hand. The forty-fourth connection electrode 44 as the third transmission electrode of the present disclosure, is configured to be connected to the sixty-third connection line or the sixty-seventh connection line formed subsequently, and is connected to the seventy-second connection line through the sixty-third connection line and the sixty-seventh connection line. The present disclosure improves the connection reliability by setting the forty-fourth connection electrode to be connected to the second initial signal line at two positions, and by connecting to a plurality of connection lines formed subsequently, the structure is simple, the occupied area of the pixel drive circuit is effectively reduced, the layout space of the pixel drive circuit is reduced, and the transmittance of the transmissive display area is improved.

In an exemplary embodiment, the forty-fifth connection electrode 45 may be rectangular, rectangle corners may be set with chamfer, the forty-fifth connection electrode 45 is connected to the first end of the second scan signal line 22 through the fifteenth via V15, and the forty-fifth connection electrode 45 is configured to be connected to a subsequently formed sixty-fourth connection line or to a subsequently formed sixty-eighth connection line.

In an exemplary embodiment, the forty-sixth connection electrode 46 may be rectangular, rectangle corners may be set with chamfer, the forty-sixth connection electrode 46 is connected to the second end of the second scan signal line 22 through the sixteenth via V16, and the forty-sixth connection electrode 46 is configured to be connected to a subsequently formed sixty-fourth connection line, or to a subsequently formed sixty-eighth connection line.

In an exemplary embodiment, the forty-seventh connection electrode 47 may be rectangular, rectangle corners may be set with chamfer, the forty-seventh connection electrode 47 is connected to the first end of the first scan signal line 21 through the seventeenth via V17, and the forty-seventh connection electrode 47 is configured to be connected to a subsequently formed sixty-fifth connection line.

In an exemplary embodiment, the forty-eighth connection electrode 48 may be rectangular, and rectangle corners may be set with chamfer, the forty-eighth connection electrode 48 is connected to the second end of the first scan signal line 21 through the eighteenth via V18, and the forty-eighth connection electrode 48 is configured to be connected to a subsequently formed sixty-fifth connection line.

In an exemplary embodiment, the forty-ninth connection electrode 49 may be rectangular, and rectangle corners may be set with chamfer, the forty-ninth connection electrode 49 is connected to the first end of the light emitting control signal line 23 through the nineteenth via V19, and the forty-ninth connection electrode 49 is configured to be connected to a subsequently formed sixty-sixth connection line, or to a subsequently formed sixty-ninth connection line.

In an exemplary embodiment, the fiftieth connection electrode 50 may be rectangular, and rectangle corners may be set with chamfer, the fiftieth connection electrode 50 is connected to the second end of the light emitting control signal line 23 through the twentieth via V20, and the fiftieth connection electrode 50 is configured to be connected to a subsequently formed sixty-sixth connection line, or to a subsequently formed sixty-ninth connection line.

In an exemplary embodiment, the fifty-first connection electrode 51 may be shaped as a folded line extending along the second direction Y. A first end of the first connection electrode is connected with the second region of the first active layer (which is also the first region of the second active layer) through the sixth via V6, and a second end of the first connection electrode is connected with the first electrode plate 25 through the first via V1, so that the first electrode plate 25, the second electrode of the first transistor T1 and the first electrode of the second transistor T2 have a same potential. In an exemplary embodiment, the fifty-first connection electrode 51 may serve as both the second electrode of the first transistor T1 and the first electrode of the second transistor T2.

In an exemplary embodiment, the fifty-second connection electrode 52 may be shaped as a folded line extending along the second direction Y. A first end of the fifty-second connection electrode is connected with the second region of the sixth active layer through the fourth via V4 and its second end is connected with the second region of the seventh active layer through the eighth via V8, such that the second electrode of the sixth transistor T6 and the second electrode of the seventh transistor T7 have the same potential. In an exemplary embodiment, the fifty-second connection electrode 52 may serve as both the second electrode of the sixth transistor T6 and the second electrode of the seventh transistor T7, and is configured to be connected to the anode through the subsequently formed connection electrode.

In an exemplary embodiment, the fifty-third connection electrode 53 may be shaped as a folded line extending along the second direction Y. A first end of the fifty-third connection electrode is connected with the first region of the fifth active layer through the third via V3, and its second end is connected with the second electrode plate 34 through the second via V2, such that the first electrode of the fifth transistor T5 and the second electrode plate 34 have the same potential. In an exemplary embodiment, the fifty-third connection electrode 53 may serve as the first electrode of the fifth transistor T5, and is configured to be connected to the first power line through the subsequently formed connection electrode.

In an exemplary embodiment, the fifty-fourth connection electrode 54 may be shaped as a strip extending along the second direction Y. The fifty-fourth connection electrode 54 is connected to the first region of the seventh active layer through the seventh via V7. In an exemplary embodiment, the fifty-fourth connection electrode 54 may serve as a first electrode of the seventh transistor T7, and is configured to be connected to the first initial signal line through the subsequently formed eighty-fourth connection electrode. In an exemplary embodiment, the fifty-fourth connection electrode 54 of the third sub-pixel P3 may serve as a first transmission electrode, and is configured to be connected to the subsequently formed fourteenth transmission connection line.

In an exemplary embodiment, the fifty-fifth connection electrode 55 may be rectangular, and rectangle corners may be set with chamfer, and the fifty-fifth connection electrode 55 is connected to the first region of the fourth active layer through the fifth via V5. In an exemplary embodiment, the fifty-fifth connection electrode 55 may serve as the first electrode of the fourth transistor T4, and is configured to be connected to the data signal line through the subsequently formed connection electrode.

In an exemplary embodiment, the third conductive layers of the first sub-pixel P1, the second sub-pixel P2, the third sub-pixel P3, and the fourth sub-pixel P4 may have substantially the same shape and location.

Figure 14:
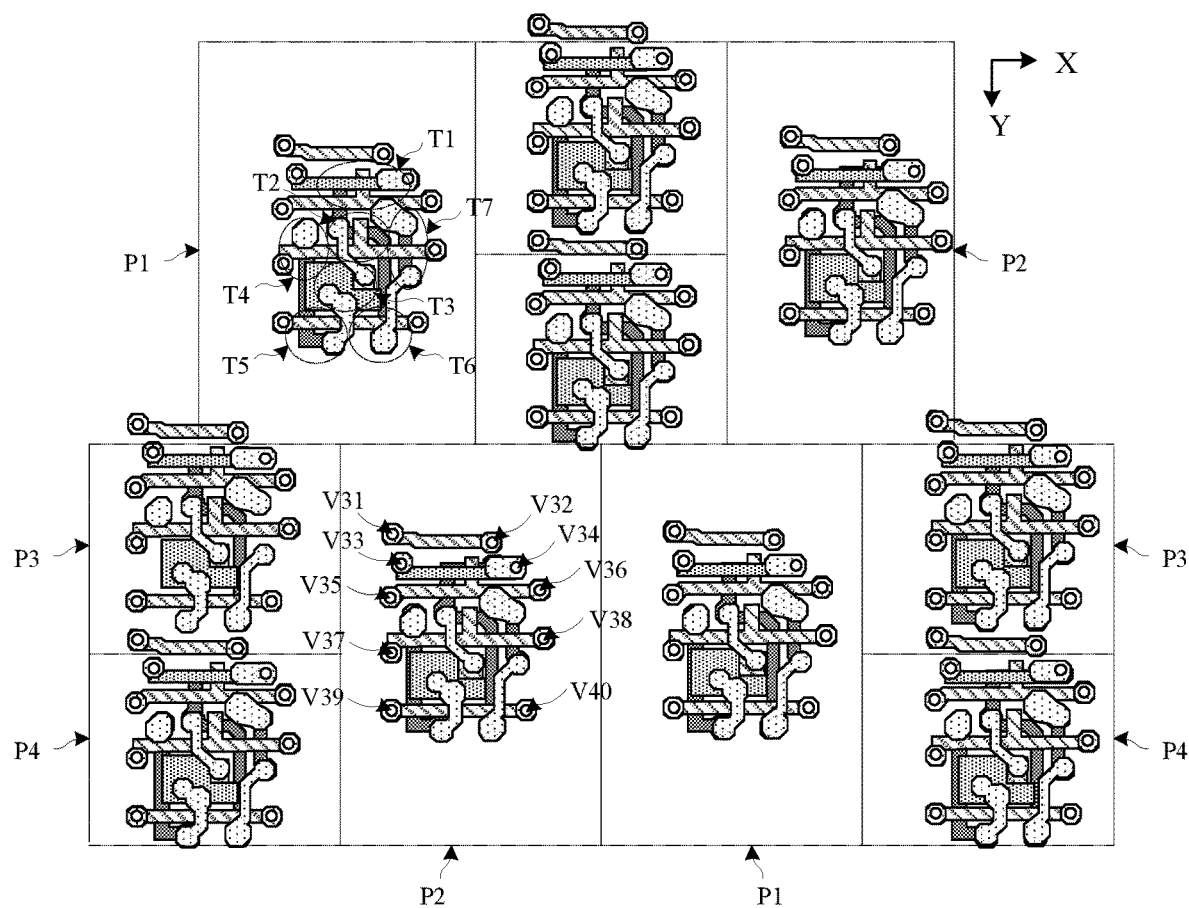
FIG. 14 is a schematic diagram after a pattern of a fifth insulation layer is formed according to an exemplary embodiment of the present disclosure.

(6) A pattern of a fifth insulation layer is formed. In an exemplary embodiment, forming the fifth insulating layer pattern may include: depositing a fifth insulating film on the base substrate on which the aforementioned patterns are formed, patterning the fifth insulating film using a patterning process to form a fifth insulating layer covering the third conductive layer, with a plurality of vias provided in the fifth insulating layer of each circuit unit, as shown in FIG. 14.

In conjunction with FIGS. 9 through 14, the plurality of vias may include at least a thirty-first via V31, a thirty-second via V32, a thirty-third via V33, a thirty-fourth via V34, a thirty-fifth via V35, a thirty-sixth via V36, a thirty-seventh via V37, a thirty-eighth via V38, a thirty-ninth via V39, and a fortieth via V40 located at each sub-pixel.

In an exemplary embodiment, the orthographic projection of the thirty-first via V31 on the base substrate may be located within the range of the orthographic projection of the forty-first connection electrode 41 on the base substrate, the fifth insulating layer within the thirty-first via V31 is etched away to expose the surface of the forty-first connection electrode 41, and the thirty-first via V31 is configured such that the subsequently formed sixty-first connection line is connected to the forty-first connection electrode 41 through the via, or such that the subsequently formed sixty-second connection line is connected to the forty-first connection electrode 41 through this via.

In an exemplary embodiment, the orthographic projection of the thirty-second via V32 on the base substrate may be located within the range of the orthographic projection of the forty-second connection electrode 42 on the base substrate, the fifth insulating layer within the thirty-second via V32 is etched away to expose the surface of the forty-second connection electrode 42, and the thirty-second via V32 is configured such that the subsequently formed sixty-first connection line is connected to the forty-second connection electrode 42 through the via, or such that the subsequently formed sixty-second connection line is connected to the forty-second connection electrode 42 through the via.

In an exemplary embodiment, the orthographic projection of the thirty-third via V33 on the base substrate may be located within the range of the orthographic projection of the forty-third connection electrode 43 on the base substrate, the fifth insulating layer within the thirty-third via V33 is etched away to expose the surface of the forty-third connection electrode 43, and the thirty-third via V33 is configured such that the subsequently formed sixty-third connection line is connected to the forty-third connection electrode 43 through this via, or such that the subsequently formed sixty-seventh connection line is connected to the forty-third connection electrode 43 through this via.

In an exemplary embodiment, the orthographic projection of the thirty-fourth via V34 on the base substrate may be located within the range of the orthographic projection of the forty-fourth connection electrode 44 on the base substrate, the fifth insulating layer within the thirty-fourth via V34 is etched away to expose the surface of the forty-fourth connection electrode 44, and the thirty-fourth via V34 is configured such that the subsequently formed sixty-third connection line is connected to the forty-fourth connection electrode 44 through this via, or such that the subsequently formed sixty-seventh connection line is connected to the forty-fourth connection electrode 44 through this via.

In an exemplary embodiment, the orthographic projection of the thirty-fifth via V35 on the base substrate may be located within the range of the orthographic projection of the forty-fifth connection electrode 45 on the base substrate, the fifth insulating layer within the thirty-fifth via V35 is etched away to expose the surface of the forty-fifth connection electrode 45, and the thirty-fifth via V35 is configured such that the subsequently formed sixty-fourth connection line is connected to the forty-fifth connection electrode 45 through the via, or such that the subsequently formed sixty-eighth connection line is connected to the forty-fifth connection electrode 45 through the via.

In an exemplary embodiment, the orthographic projection of the thirty-sixth via V36 on the base substrate may be located within the range of the orthographic projection of the forty-sixth connection electrode 46 on the base substrate, the fifth insulating layer within the thirty-sixth via V36 is etched away to expose the surface of the forty-sixth connection electrode 46, and the thirty-sixth via V36 is configured such that the subsequently formed sixty-fourth connection line is connected to the forty-sixth connection electrode 46 through the via, or such that the subsequently formed sixty-eighth connection line is connected to the forty-sixth connection electrode 46 through the via.

In an exemplary embodiment, the orthographic projection of the thirty-seventh via V37 on the base substrate may be located within the range of the orthographic projection of the forty-seventh connection electrode 47 on the base substrate, the fifth insulating layer within the thirty-seventh via V37 is etched away to expose the surface of the forty-seventh connection electrode 47, and the thirty-seventh via V37 is configured such that the subsequently formed sixty-fifth connection line is connected to the forty-seventh connection electrode 47 through the via.

In an exemplary embodiment, the orthographic projection of the thirty-eighth via V38 on the base substrate may be located within the range of the orthographic projection of the forty-eighth connection electrode 48 on the base substrate, the fifth insulating layer within the thirty-eighth via V38 is etched away to expose the surface of the forty-eighth connection electrode 48, and the thirty-eighth via V38 is configured such that the subsequently formed sixty-fifth connection line is connected to the forty-eighth connection electrode 48 through the via.

In an exemplary embodiment, the orthographic projection of the thirty-ninth via V39 on the base substrate may be located within the orthographic projection of the forty-ninth connection electrode 49 on the base substrate, the fifth insulating layer within the thirty-ninth via V39 is etched away to expose the surface of the forty-ninth connection electrode 49, and the thirty-ninth via V39 is configured such that the subsequently formed sixty-sixth connection line is connected to the forty-ninth connection electrode 49 through the via, or such that the subsequently formed sixty-ninth connection line is connected to the forty-ninth connection electrode 49 through this via.

In an exemplary embodiment, the orthographic projection of the fortieth via V40 on the base substrate may be located within the range of the orthographic projection of the fiftieth connection electrode 50 on the base substrate, the fifth insulating layer within the fortieth via V40 is etched away to expose the surface of the fiftieth connection electrode 50, and the fortieth via V40 is configured such that a subsequently formed sixty-sixth connection line is connected to the fiftieth connection electrode 50 through the via, or such that a subsequently formed sixty-ninth connection line is connected to the fiftieth connection electrode 50 through the via.

In an exemplary embodiment, the plurality of vias of the first sub-pixel P1, the second sub-pixel P2, the third sub-pixel P3, and the fourth sub-pixel P4 may have substantially the same shape and location.

Figure 15A:
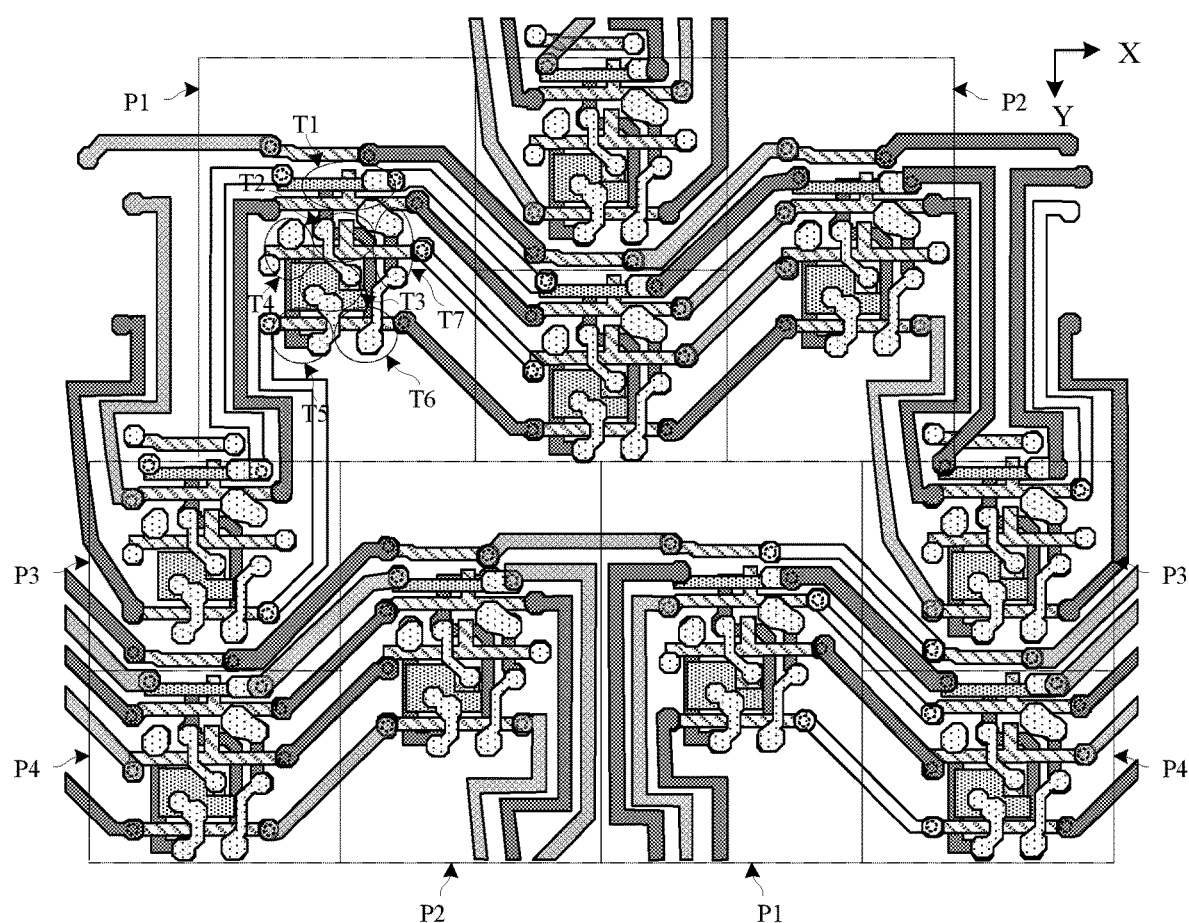
FIG. 15a is a schematic diagram after a pattern of a fourth conductive layer is formed according to an exemplary embodiment of the present disclosure.
Figure 15B:
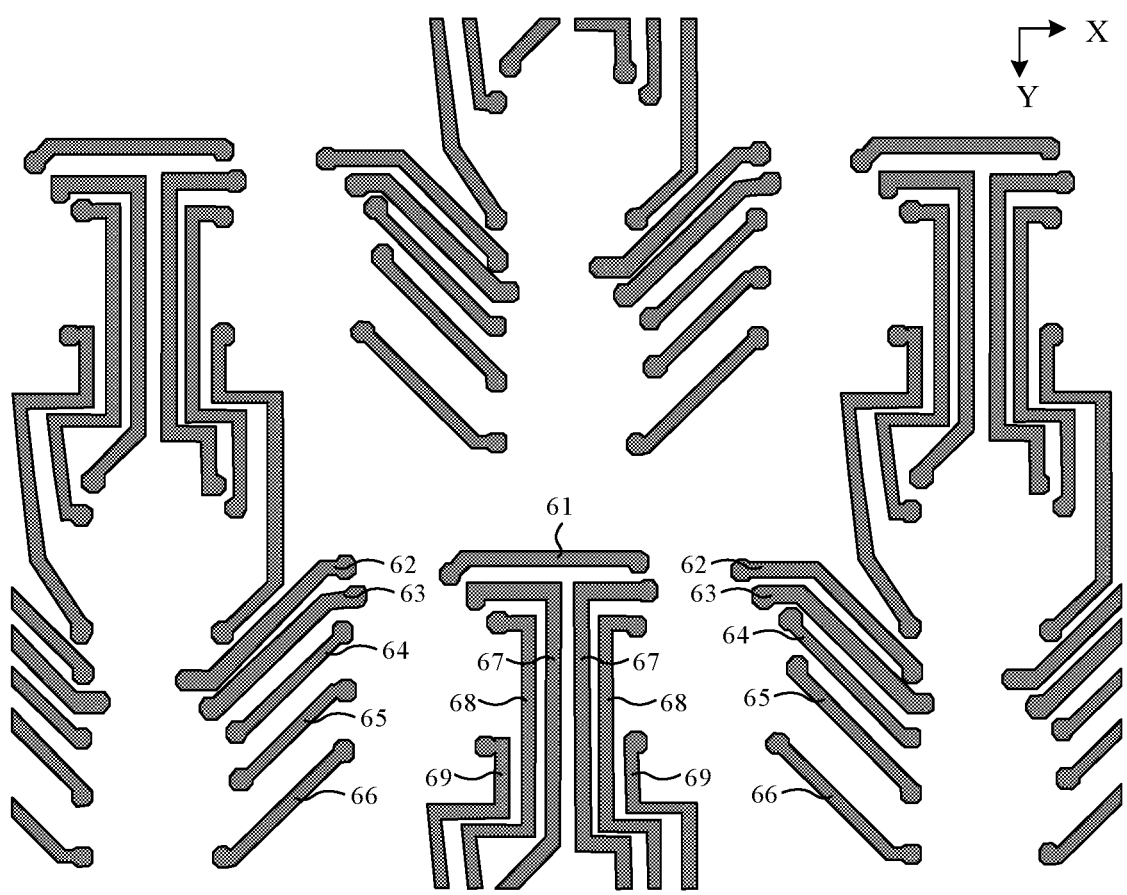

(7) A pattern of a fourth conductive layer is formed. In an exemplary embodiment, forming the fourth conductive layer may include: depositing a fourth conductive film on the base substrate on which the aforementioned patterns are formed, patterning the fourth conductive film using a patterning process to form a pattern of the fourth conductive layer provided on the fifth insulating layer, as shown in FIG. 15a and FIG. 15b, with FIG. 15b showing a schematic plan view of the fourth conductive layer in FIG. 15a. In an exemplary embodiment, the fourth conductive layer may be referred to as a first transparent conductive (ITO1) layer.

In conjunction with FIGS. 9 through 15b, the fourth conductive layer includes at least: a sixty-first connection line 61, a sixty-second connection line 62, a sixty-third connection line 63, a sixty-fourth connection line 64, a sixty-fifth connection line 65, a sixty-sixth connection line 66, a sixty-seventh connection line 67, a sixty-eighth connection line 68, and a sixty-ninth connection line 69.

In an exemplary embodiment, the sixty-first connection line 61 may serve as an eleventh transmission connection line. The sixty-first connection line 61 may be shaped as a strip extending along the first direction X. It may serve as a connection line for the first initial signal line 24 of the first sub-pixel P1 and the second sub-pixel P2 adjacent to each other in the first direction X.

For the first sub-pixel P1, the second end of the sixty-first connection line 61 is connected to the forty-first connection electrode 41 of the first sub-pixel P1 through the thirty-first via V31 of the first sub-pixel P1. For the second sub-pixel P2, the first end of the sixty-first connection line 61 is connected to the forty-second connection electrode 42 of the second sub-pixel P2 through the thirty-second via V32 of the second sub-pixel P2. Since the forty-first connection electrode 41 of the first sub-pixel P1 is connected to the first end of the first initial signal line 24 of the first sub-pixel P1 through a via, and the forty-second connection electrode 42 of the second sub-pixel P2 is connected to the second end of the first initial signal line 24 of the second sub-pixel P2 through a via, thus interconnection of the first initial signal line 24 of the first sub-pixel P1 and the first initial signal line 24 of the second sub-pixel P2 is achieved, i.e., interconnection of the first initial signal line 24 in the first sub-pixel P1 and the second sub-pixel P2 adjacent in the first direction X is achieved.

In an exemplary embodiment, the sixty-second connection line 62 may serve as a twelfth transmission connection line. The sixty-second connection line 62 may be shaped as a straight line or a folded line extending along the third direction, and may serve as a connection line for the first initial signal line 24 of the first sub-pixel P1 and the fourth sub-pixel P4 adjacent in the first direction X, or may serve as a connection line for the first initial signal line 24 of the second sub-pixel P2 and the fourth sub-pixel P4 adjacent in the first direction X. In an exemplary embodiment, the third direction is crossed with the first direction X and the second direction Y, respectively.

For the first sub-pixel P1, the first end of the sixty-second connection line 62 is connected to the forty-second connection electrode 42 of the first sub-pixel P1 through the thirty-second via V32 of the first sub-pixel P1, and the second end of the sixty-second connection line 62, after extending in the third direction, is connected to the forty-first connection electrode 41 of the fourth sub-pixel P4 through the thirty-first via V31 of the fourth sub-pixel P4.

Since the forty-second connection electrode 42 of the first sub-pixel P1 is connected to the second end of the first initial signal line 24 of the first sub-pixel P1 through the via, the forty-first connection electrode 41 of the fourth sub-pixel P4 is connected to the first end of the first initial signal line 24 of the fourth sub-pixel P4 through the via, thus the interconnection between the first initial signal line 24 of the first sub-pixel P1 and the first initial signal line 24 of the fourth sub-pixel P4 adjacent in the first direction X is achieved.

For the second sub-pixel P2, the first end of the sixty-second connection line 62 is connected to the forty-first connection electrode 41 of the second sub-pixel P2 through the thirty-first via V31 of the second sub-pixel P2, and the second end of the sixty-second connection line 62, after extending in the third direction, is connected to the forty-second connection electrode 42 of the fourth sub-pixel P4 through the thirty-second via V32 of the fourth sub-pixel P4. Since the forty-first connection electrode 41 of the second sub-pixel P2 is connected to the first end of the first initial signal line 24 of the second sub-pixel P2 through the via, the forty-second connection electrode 42 of the fourth sub-pixel P4 is connected to the second end of the first initial signal line 24 of the fourth sub-pixel P4 through the via, thus the interconnection between the first initial signal line 24 of the fourth sub-pixel P4 and the first initial signal line 24 of the second sub-pixel P2 adjacent in the first direction X is achieved.

In an exemplary embodiment, the sixty-third connection line 63 may serve as the twenty-first transmission connection line. The sixty-third connection line 63 may be shaped as a straight line or a folded line extending along the third direction, and may serve as a connection line for the second initial signal line 33 of the first sub-pixel P1 and the fourth sub-pixel P4 adjacent in the first direction X, or may serve as a connection line for the second initial signal line 33 of the second sub-pixel P2 and the fourth sub-pixel P4 adjacent in the first direction X.

For the first sub-pixel P1, the first end of the sixty-third connection line 63 is connected to the forty-fourth connection electrode 44 of the first sub-pixel P1 through the thirty-fourth via V34 of the first sub-pixel P1, and the second end of the sixty-third connection line 63, after extending in the third direction, is connected to the forty-third connection electrode 43 of the fourth sub-pixel P4 through the thirty-third via V33 of the fourth sub-pixel P4. Since the forty-fourth connection electrode 44 of the first sub-pixel P1 is connected to the second end of the second initial signal line 33 of the first sub-pixel P1 through the via, the forty-third connection electrode 43 of the fourth sub-pixel P4 is connected to the first end of the second initial signal line 33 of the fourth sub-pixel P4 through the via, thus the interconnection between the second initial signal line 33 of the first sub-pixel P1 and the second initial signal line 33 of the fourth sub-pixel P4 adjacent in the first direction X is achieved.

For the second sub-pixel P2, the first end of the sixty-third connection line 63 is connected to the forty-third connection electrode 43 of the second sub-pixel P2 through the thirty-third via V33 of the second sub-pixel P2, and the second end of the sixty-third connection line 63, after extending in the third direction, is connected to the forty-fourth connection electrode 44 of the fourth sub-pixel P4 through the thirty-fourth via V34 of the fourth sub-pixel P4. Since the forty-third connection electrode 43 of the second sub-pixel P2 is connected to the first end of the second initial signal line 33 of the second sub-pixel P2 through the via, the forty-fourth connection electrode 44 of the fourth sub-pixel P4 is connected to the second end of the second initial signal line 33 of the fourth sub-pixel P4 through the via, thus the interconnection between the second initial signal line 33 of the fourth sub-pixel P4 and the second initial signal line 33 of the second sub-pixel P2 adjacent in the first direction X is achieved.

In an exemplary embodiment, the sixty-fourth connection line 64 may be shaped as a straight line or a folded line extending along the third direction, and may serve as a connection line for the second scan signal line 22 between the first sub-pixel P1 and the fourth sub-pixel P4 adjacent in the first direction X, or may serve as a connection line for a second scan signal line 22 between the second sub-pixel P2 and the fourth sub-pixel P4 adjacent in the first direction X.

For the first sub-pixel P1, the first end of the sixty-fourth connection line 64 is connected to the forty-sixth connection electrode 46 of the first sub-pixel P1 through the thirty-sixth via V36 of the first sub-pixel P1, and the second end of the sixty-fourth connection line 64, after extending in the third direction, is connected to the forty-fifth connection electrode 45 of the fourth sub-pixel P4 through the thirty-fifth via V35 of the fourth sub-pixel P4. Since the forty-sixth connection electrode 46 of the first sub-pixel P1 is connected to the second end of the second scan signal line 22 of the first sub-pixel P1 through the via, the forty-fifth connection electrode 45 of the fourth sub-pixel P4 is connected to the first end of the second scan signal line 22 of the fourth sub-pixel P4 through the via, thus the interconnection between the second scan signal line 22 of the first sub-pixel P1 and the second scan signal line 22 of the fourth sub-pixel P4 adjacent in the first direction X is achieved.

For the second sub-pixel P2, the first end of the sixty-fourth connection line 64 is connected to the forty-fifth connection electrode 45 of the second sub-pixel P2 through the thirty-fifth via V35 of the second sub-pixel P2, and the second end of the sixty-fourth connection line 64, after extending in the third direction, is connected to the forty-sixth connection electrode 46 of the fourth sub-pixel P4 through the thirty-sixth via V36 of the fourth sub-pixel P4. Since the forty-fifth connection electrode 45 of the second sub-pixel P2 is connected to the first end of the second scan signal line 22 of the second sub-pixel P2 through the via, the forty-sixth connection electrode 46 of the fourth sub-pixel P4 is connected to the second end of the second scan signal line 22 of the fourth sub-pixel P4 through the via, thus the interconnection between the second scan signal line 22 of the fourth sub-pixel P4 and the second scan signal line 22 of the second sub-pixel P2 adjacent in the first direction X is achieved.

In an exemplary embodiment, the sixty-fifth connection line 65 may have a shape of a straight line or a folded line extending along the third direction, and may serve as the connection line for the first scan signal line 21 of the first sub-pixel P1 and the fourth sub-pixel P4 adjacent in the first direction X, or may serve as the first scan signal line 21 of the second sub-pixel P2 and the fourth sub-pixel P4 adjacent in the first direction X.

For the first sub-pixel P1, the first end of the sixty-fifth connection line 65 is connected to the forty-eighth connection electrode 48 of the first sub-pixel P1 through the thirty-eighth via V38 of the first sub-pixel P1, and the second end of the sixty-fifth connection line 65, after extending in the third direction, is connected to the forty-seventh connection electrode 47 of the fourth sub-pixel P4 through the thirty-seventh via V37 of the fourth sub-pixel P4. Since the forty-eighth connection electrode 48 of the first sub-pixel P1 is connected to the second end of the first scan signal line 21 of the first sub-pixel P1 through the via, the forty-seventh connection electrode 47 of the fourth sub-pixel P4 is connected to the first end of the first scan signal line 21 of the fourth sub-pixel P4 through the via, thus the interconnection between the first scan signal line 21 of the first sub-pixel P1 and the first scan signal line 21 of the fourth sub-pixel P4 adjacent in the first direction X is achieved.

For the second sub-pixel P2, the first end of the sixty-fifth connection line 65 is connected to the forty-seventh connection electrode 47 of the second sub-pixel P2 through the thirty-seventh via V37 of the second sub-pixel P2, and the second end of the sixty-fifth connection line 65, after extending in the third direction, is connected to the forty-eighth connection electrode 48 of the fourth sub-pixel P4 through the thirty-eighth via V38 of the fourth sub-pixel P4. Since the forty-seventh connection electrode 47 of the second sub-pixel P2 is connected to the first end of the first scan signal line 21 of the second sub-pixel P2 through the via, the forty-eighth connection electrode 48 of the fourth sub-pixel P4 is connected to the second end of the first scan signal line 21 of the fourth sub-pixel P4 through the via, thus the interconnection between the first scan signal line 21 of the fourth sub-pixel P4 and the first scan signal line 21 of the second sub-pixel P2 adjacent in the first direction X is achieved.

In an exemplary embodiment, the connection line 66 may be shaped as a straight line or a folded line extending along the third direction, and may serve as a connection line for the light emitting control signal line 23 of the first sub-pixel P1 and the fourth sub-pixel P4 adjacent in the first direction X, or may serve as a connection line for the light emitting control signal line 23 of the second sub-pixel P2 and the fourth sub-pixel P4 adjacent in the first direction X.

For the first sub-pixel P1, the first end of the connection line 66 is connected to the fiftieth connection electrode 50 of the first sub-pixel P1 through the fortieth via V40 of the first sub-pixel P1, and the second end of the connection line 66, after extending in the third direction, is connected to the forty-ninth connection electrode 49 of the fourth sub-pixel P4 through the thirty-ninth via V39 of the fourth sub-pixel P4. Since the fiftieth connection electrode 50 of the first sub-pixel P1 is connected to the second end of the light emitting control signal line 23 of the first sub-pixel P1 through the via, the forty-ninth connection electrode 49 of the fourth sub-pixel P4 is connected to the first end of the light emitting control signal line 23 of the fourth sub-pixel P4 through the via, thus the interconnection between the light emitting control signal line 23 of the first sub-pixel P1 and the light emitting control signal line 23 of the fourth sub-pixel P4 adjacent in the first direction X is achieved.

For the second sub-pixel P2, the first end of the sixty-sixth connection line 66 is connected to the forty-ninth connection electrode 49 of the second sub-pixel P2 through the thirty-ninth via V39 of the second sub-pixel P2, and the second end of the sixty-sixth connection line 66, after extending in the third direction, is connected to the fiftieth connection electrode 50 of the fourth sub-pixel P4 through the fortieth via V40 of the fourth sub-pixel P4. Since the forty-ninth connection electrode 49 of the second sub-pixel P2 is connected to the first end of the light emitting control signal line 23 of the second sub-pixel P2 through the via, the fiftieth connection electrode 50 of the fourth sub-pixel P4 is connected to the second end of the light emitting control signal line 23 of the fourth sub-pixel P4 through the via, thus the interconnection between the light emitting control signal line 23 of the fourth sub-pixel P4 and the light emitting control signal line 23 of the second sub-pixel P2 in the first direction X adjacent is achieved.

In an exemplary embodiment, the sixty-seventh connection line 67 may serve as the twenty-second transmission connection line. The sixty-seventh connection line 67 may be shaped as a folded line with a main part extending in the second direction Y. It may serve as a connection line for the second initial signal line 33 of the first sub-pixel P1 and the third sub-pixel P3 adjacent in the second direction Y, or it may serve as a connection line for the second initial signal line 33 of the second sub-pixel P2 and the third sub-pixel P3 adjacent in the second direction Y.

For the first sub-pixel P1, the first end of the sixty-seventh connection line 67 is connected to the forty-third connection electrode 43 of the first sub-pixel P1 through the thirty-third via V33 of the first sub-pixel P1, and the second end of the sixty-seventh connection line 67 is connected to the forty-fourth connection electrode 44 of the third sub-pixel P3 through the thirty-fourth via V34 of the third sub-pixel P3. Since the forty-third connection electrode 43 of the first sub-pixel P1 is connected to the first end of the second initial signal line 33 of the first sub-pixel P1 through the via, the forty-fourth connection electrode 44 of the third sub-pixel P3 is connected to the second end of the second initial signal line 33 of the third sub-pixel P3 through the via, thus the interconnection between the second initial signal line 33 of the first sub-pixel P1 and the second initial signal line 33 of the third sub-pixel P3 adjacent in the second direction Y is achieved.

For the second sub-pixel P2, the first end of the sixty-seventh connection line 67 is connected to the forty-fourth connection electrode 44 of the second sub-pixel P2 through the thirty-fourth via V34 of the second sub-pixel P2, and the second end of the sixty-seventh connection line 67 is connected to the forty-third connection electrode 43 of the third sub-pixel P3 through the thirty-third via V33 of the third sub-pixel P3. Since the forty-fourth connection electrode 44 of the second sub-pixel P2 is connected to the second end of the second initial signal line 33 of the first sub-pixel P1 through the via, the forty-third connection electrode 43 of the third sub-pixel P3 is connected to the first end of the second initial signal line 33 of the third sub-pixel P3 through the via, thus the interconnection between the second initial signal line 33 of the second sub-pixel P2 and the second initial signal line 33 of the third sub-pixel P3 adjacent in the second direction Y is achieved.

In an exemplary embodiment, the sixty-eighth connection line 68 may be shaped as a folded line with a main part extending in the second direction Y. It may serve as a connection line for the second scan signal line 22 of the first sub-pixel P1 and the third sub-pixel P3 adjacent in the second direction Y, or it may serve as a connection line for the second scan signal line 22 of the second sub-pixel P2 and the third sub-pixel P3 adjacent in the second direction Y.

For the first sub-pixel P1, the first end of the sixty-eighth connection line 68 is connected to the forty-fifth connection electrode 45 of the first sub-pixel P1 through the thirty-fifth via V35 of the first sub-pixel P1, and the second end of the sixty-eighth connection line 68 is connected to the forty-sixth connection electrode 46 of the third sub-pixel P3 through the thirty-sixth via V36 of the third sub-pixel P3.

Since the forty-fifth connection electrode 45 of the first sub-pixel P1 is connected to the first end of the second scan signal line 22 of the first sub-pixel P1 through the via, the forty-sixth connection electrode 46 of the third sub-pixel P3 is connected to the second end of the second scan signal line 22 of the third sub-pixel P3 through the via, thus the interconnection between the second scan signal line 22 of the first sub-pixel P1 and the second scan signal line 22 of the third sub-pixel P3 adjacent in the second direction Y is achieved.

For the second sub-pixel P2, the first end of the sixty-eighth connection line 68 is connected to the forty-sixth connection electrode 46 of the second sub-pixel P2 through the thirty-sixth via V36 of the second sub-pixel P2, and the second end of the sixty-eighth connection line 68 is connected to the forty-fifth connection electrode 45 of the third sub-pixel P3 through the thirty-fifth via V35 of the third sub-pixel P3. Since the forty-sixth connection electrode 46 of the second sub-pixel P2 is connected to the second end of the second scan signal line 22 of the first sub-pixel P1 through the via, the forty-fifth connection electrode 45 of the third sub-pixel P3 is connected to the first end of the second scan signal line 22 of the third sub-pixel P3 through the via, thus the interconnection between the second scan signal line 22 of the second sub-pixel P2 and the second scan signal line 22 of the third sub-pixel P3 adjacent in the second direction Y is achieved.

In an exemplary embodiment, the sixty-ninth connection line 69 may be shaped as a folded line with a main part extending in the second direction Y. It may serve as a connection line for the light emitting control signal line 23 of the first sub-pixel P1 and the third sub-pixel P3 adjacent in the second direction Y, or it may serve as a connection line for the light-emitting control signal line 23 of the second sub-pixel P2 and the third sub-pixel P3 adjacent in the second direction Y.

For the first sub-pixel P1, the first end of the sixty-ninth connection line 69 is connected to the forty-ninth connection electrode 49 of the first sub-pixel P1 through the thirty-ninth via V39 of the first sub-pixel P1, and the second end of the sixty-ninth connection line 69 is connected to the fiftieth connection electrode 50 of the third sub-pixel P3 through the fortieth via V40 of the third sub-pixel P3. Since the forty-ninth connection electrode 49 of the first sub-pixel P1 is connected to the first end of the light emitting control signal line 23 of the first sub-pixel P1 through the via, the fiftieth connection electrode 50 of the third sub-pixel P3 is connected to the second end of the light emitting control signal line 23 of the third sub-pixel P3 through the via, thus the interconnection between the light emitting control signal line 23 of the first sub-pixel P1 and the light emitting control signal line 23 of the third sub-pixel P3 adjacent in the second direction Y is achieved.

For the second sub-pixel P2, the first end of the sixty-ninth connection line 69 is connected to the fiftieth connection electrode 50 of the second sub-pixel P2 through the fortieth via V40 of the second sub-pixel P2, and the second end of the sixty-ninth connection line 69 is connected to the forty-ninth connection electrode 49 of the third sub-pixel P3 through the thirty-ninth via V39 of the third sub-pixel P3. Since the fiftieth connection electrode 50 of the second sub-pixel P2 is connected to the second end of the light emitting control signal line 23 of the first sub-pixel P1 through the via, the forty-ninth connection electrode 49 of the third sub-pixel P3 is connected to the first end of the light emitting control signal line 23 of the third sub-pixel P3 through the via, thus the interconnection between the light emitting control signal line 23 of the second sub-pixel P2 and the light emitting control signal line 23 of the third sub-pixel P3 adjacent in the second direction Y is achieved.

In an exemplary embodiment, the first initial signal lines 24 of the first sub-pixel P1, the second sub-pixel P2, and the fourth sub-pixel P4 adjacent along the first direction X are connected to each other by the sixty-first connection line 61 and the sixty-second connection line 62. The first initial signal line 24 of the fourth sub-pixel P4 is connected to the first initial signal line 24 of the second sub-pixel P2 adjacent in the first direction X via the sixty-second connection line 62, the first initial signal line 24 of the second sub-pixel P2 is connected to the first initial signal line 24 of the first sub-pixel P1 adjacent in the first direction X via the sixty-first connection line 61, and the first initial signal line 24 of the first sub-pixel P1 is connected to the first initial signal line 24 of the fourth sub-pixel P4 adjacent in the first direction X via the sixty-second connection line 62.

In an exemplary embodiment, the second initial signal lines 33 of the adjacent first sub-pixel P1, the second sub-pixel P2, and the fourth sub-pixel P4 are connected to each other via the sixty-third connection line 63 and the sixty-seventh connection line 67. The second initial signal line 33 of the first sub-pixel P1 is connected to the second initial signal line 33 of the fourth sub-pixel P4 adjacent in the first direction X via the sixty-third connection line 63, the second initial signal line 33 of the fourth sub-pixel P4 is connected to the second initial signal line 33 of the second sub-pixel P2 adjacent in the first direction X via the sixty-third connection line 63, the second initial signal line 33 of the second sub-pixel P2 is connected to the second initial signal line 33 of the third sub-pixel P3 adjacent in the second direction Y via the sixty-seventh connection line 67, and the second initial signal line 33 of the third sub-pixel P3 is connected to the second initial signal line 33 of the first sub-pixel P1 adjacent in the second direction Y via the sixty-seventh connection line 67.

In an exemplary embodiment, the second scan signal lines 22 of adjacent sub-pixels are connected to each other via the sixty-fourth connection line 64 and the sixty-eighth connection line 68. The second scan signal line 22 of the first sub-pixel P1 is connected to the second scan signal line 22 of the fourth sub-pixel P4 adjacent in the first direction X via the sixty-fourth connection line 64, the second scan signal line 22 of the fourth sub-pixel P4 is connected to the second scan signal line 22 of the second sub-pixel P2 adjacent in the first direction X via the sixty-fourth connection line 64, the second scan signal line of the second sub-pixel P2 is connected to the second scan signal line 22 of the third sub-pixel P3 adjacent in the second direction Y via the sixty-eighth connection line 68, and the second scan signal line 22 of the third sub-pixel P3 is connected to the second scan signal line 22 of the first sub-pixel P1 adjacent in the second direction Y via the sixty-eighth connection line 68.

In an exemplary embodiment, the interconnection of the first scan signal lines 21 of the first sub-pixel P1, the second sub-pixel P2, and the fourth sub-pixel P4 adjacent in the first direction X is made by the sixty-fifth connection line 65. The first scan signal line 21 of the first sub-pixel P1 is connected to the first scan signal line 21 of the fourth sub-pixel P4 adjacent in the first direction X via the sixty-fifth connection line 65, and the first scan signal line 21 of the fourth sub-pixel P4 is connected to the first scan signal line 21 of the second sub-pixel P2 adjacent in the first direction X via the sixty-fifth connection line 65.

In an exemplary embodiment, the light emitting control signal line 24 of adjacent sub-pixels are connected to each other via the sixty-sixth connection line 66 and the sixty-ninth connection line 69. The light emitting control signal line 24 of the first sub-pixel P1 is connected to the light emitting control signal line 24 of the fourth sub-pixel P4 adjacent in the first direction X via the sixty-sixth connection line 66, the light emitting control signal line 24 of the fourth sub-pixel P4 is connected to the light emitting control signal line 24 of the second sub-pixel P2 adjacent in the first direction X via the sixty-sixth connection line 66, the light emitting control signal line 24 of the second sub-pixel P2 is connected to the light emitting control signal line 24 of the third sub-pixel P3 adjacent in the second direction Y via the sixty-ninth connection line 69, and the light emitting control signal line 24 of the third sub-pixel P3 is connected to the light emitting control signal line 24 of the first sub-pixel P1 adjacent in the second direction Y via the sixty-ninth connection line 69.

In an exemplary embodiment, some of the vias provided on the fifth insulating layer are not connected to the corresponding connection lines. For example, the thirty-seventh via V37 of the first sub-pixel P1, the thirty-eighth via V38 of the second sub-pixel P2, and the thirty-first via V31, thirty-second via V32, thirty-seventh via V37, and thirty-eighth via V38 of the third sub-pixel P3 are configured to be connected to the subsequently formed vias, which will not be described here.

Figure 16:
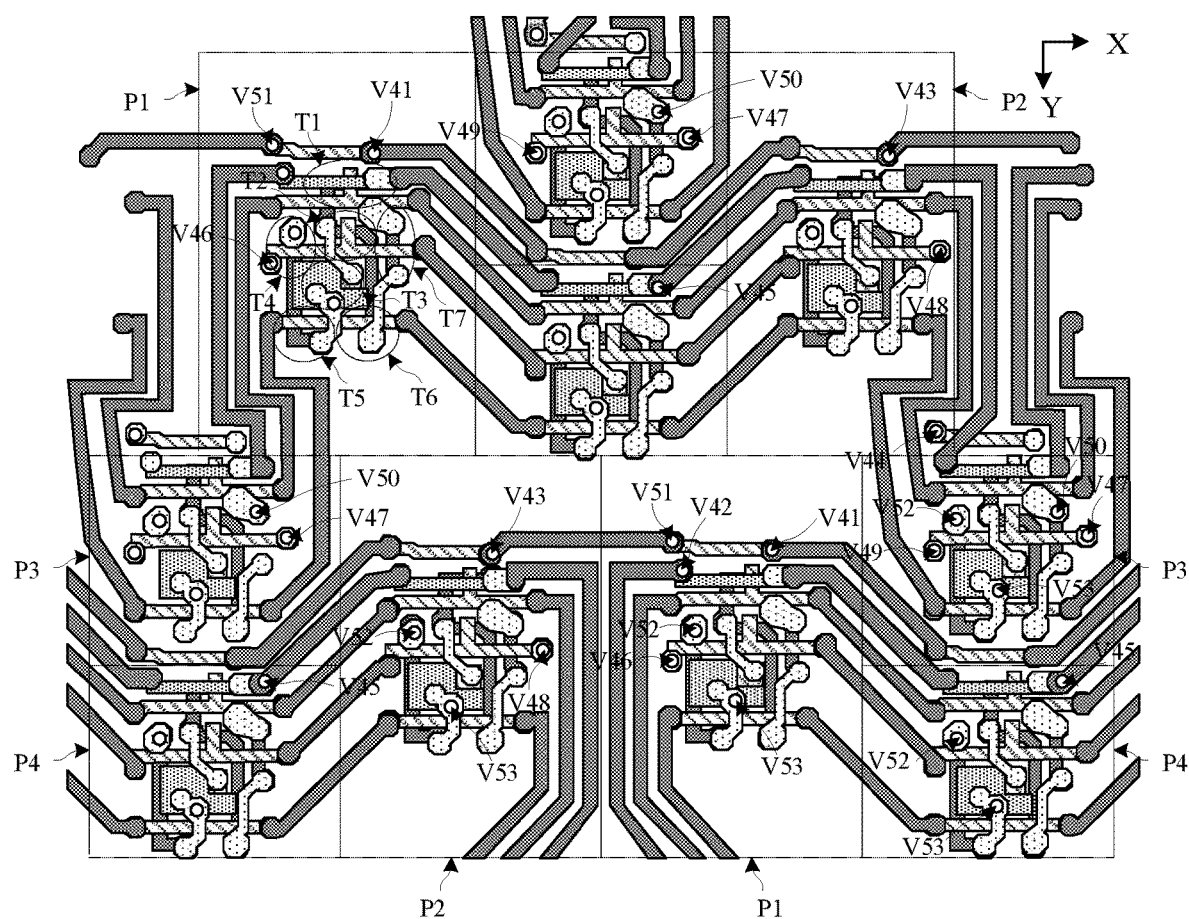
FIG. 16 is a schematic diagram after a pattern of a first planarization layer is formed according to an exemplary embodiment of the present disclosure.

(8) Forming a pattern of a first planarization layer. In an exemplary embodiment, forming the first planarization layer pattern may include: coating a first planarization film on the base substrate on which the aforementioned patterns are formed, patterning the first planarization film using a patterning process to form a first planarization layer covering a fourth conductive layer, with a plurality of vias provided in the first planarization layer, as shown in FIG. 16.

In conjunction with FIGS. 9 through 16, the plurality of vias may include: forty-first via V41, forty-second via V42, forty-sixth via V46, and fifty-first via V51 located at first sub-pixel P1, forty-third via V43 and forty-eighth via V48 located at second sub-pixel P2, forty-fourth via V44, forty-seventh via V47, forty-ninth via V49 and fiftieth via V50 located at third sub-pixel P3, forty-fifth via V45 located in the fourth sub-pixel P4, and fifty-second via V52 and fifty-third via V53 located in each sub-pixel.

In an exemplary embodiment, the orthographic projection of the forty-first via V41 on the base substrate may be located within the range of the orthographic projection of the forty-second connection electrode 42 of the first sub-pixel P1 on the base substrate, the first planarization layer within the forty-first via V41 is removed to expose the surface of the first end of the sixty-second connection line 62, and the forty-first via V41 is configured such that a subsequently formed seventy-first connection line is connected to the first end of the sixty-second connection line 62 of the first sub-pixel P1 through this via.

In an exemplary embodiment, the orthographic projection of the forty-second via V42 on the base substrate may be located within the range of the orthographic projection of the forty-third connection electrode 43 of the first sub-pixel P1 on the base substrate, the first planarization layer within the forty-second via V42 is removed to expose the surface of the first end of the sixty-seventh connection line 67, and the forty-second via V42 is configured such that the subsequently formed seventy-second connection line is connected to the first end of the sixty-seventh connection line 67 of the first sub-pixel P1 through the via.

In an exemplary embodiment, the orthographic projection of the forty-third via V43 on the base substrate may be located within the range of the orthographic projection of the forty-second connection electrode 42 of the second sub-pixel P2 on the base substrate, the first planarization layer within the forty-third via V43 is removed to expose the surface of the first end of the sixty-first connection line 61, and the forty-third via V43 is configured such that a subsequently formed seventy-first connection line is connected to the first end of the sixty-first connection line 61 of the second sub-pixel P2 via the via.

In an exemplary embodiment, the orthographic projection of the forty-fourth via V44 on the base substrate may be located within the range of the orthographic projection of the forty-first connection electrode 41 of the third sub-pixel P3 on the base substrate, the first planarization layer within the forty-fourth via V44 is removed to expose the surface of the forty-first connection electrode 41, and the forty-fourth via V44 is configured such that a subsequently formed seventy-first connection line is connected to the forty-first connection electrode 41 of the third sub-pixel P3 through the via.

In an exemplary embodiment, the orthographic projection of the forty-fifth via V45 on the base substrate may be located within the range of the orthographic projection of the forty-fourth connection electrode 44 of the fourth sub-pixel P3 on the base substrate, the first planarization layer within the forty-fifth via V45 is removed to expose the surface of the second end of the sixty-third connection line 63, and the forty-fifth via V45 is configured such that a subsequently formed seventy-second connection line is connected to the second end of the sixty-third connection line 63 of the fourth sub-pixel P3 through the via.

In an exemplary embodiment, the orthographic projection of the forty-sixth via V46 on the base substrate may be located within the range of the orthographic projection of the forty-seventh connection electrode 47 of the first sub-pixel P1 on the base substrate, the first planarization layer within the forty-sixth via V46 is removed to expose the surface of the forty-seventh connection electrode 47, and the forty-sixth via V46 is configured such that the subsequently formed seventy-third connection line is connected to the forty-seventh connection electrode 47 of the first sub-pixel P1 through the via.

In an exemplary embodiment, the orthographic projection of the forty-seventh via V47 on the base substrate may be located within the range of the orthographic projection of the forty-eighth connection electrode 48 of the third sub-pixel P3 on the base substrate, the first planarization layer within the forty-seventh via V47 is removed to expose the surface of the forty-eighth connection electrode 48, and the forty-seventh via V47 is configured such that a subsequently formed seventy-third connection line is connected to the forty-eighth connection electrode 48 of the third sub-pixel P3 through the via.

In an exemplary embodiment, the orthographic projection of the forty-eighth via V48 on the base substrate may be located within the range of the orthographic projection of the forty-eighth connection electrode 48 of the second sub-pixel P2 on the base substrate, the first planarization layer within the forty-eighth via V48 is removed to expose the surface of the forty-eighth connection electrode 48, and the forty-eighth via V48 is configured such that a subsequently formed seventy-fourth connection line is connected to the forty-eighth connection electrode 48 of the second sub-pixel P2 through the via.

In an exemplary embodiment, the orthographic projection of the forty-ninth via V49 on the base substrate may be located within the orthographic projection of the forty-seventh connection electrode 47 of the third sub-pixel P3 on the base substrate, the first planarization layer within the forty-ninth via V49 is removed to expose the surface of the forty-seventh connection electrode 47, and the forty-ninth via V49 is configured such that a subsequently formed seventy-fourth connection line is connected to the forty-seventh connection electrode 47 of the third sub-pixel P3 through the via.

In an exemplary embodiment, the orthographic projection of the fiftieth via V50 on the base substrate may be located within the range of the orthographic projection of the fifty-fourth connection electrode 54 of the third sub-pixel P3 on the base substrate, the first planarization layer within the fiftieth via V50 is removed to expose the surface of the fifty-fourth connection electrode 54, and the fiftieth via V50 is configured such that the subsequently formed seventy-fifth connection line 75 is connected to the fifty-fourth connection electrode 54 of the third sub-pixel P3 through the via.

In an exemplary embodiment, the orthographic projection of the fifty-first via V51 on the base substrate may be located within the range of the orthographic projection of the forty-first connection electrode 41 of the first sub-pixel P1 on the base substrate, the first planarization layer within the fifty-first via V51 is removed to expose the surface of the first end of the sixty-first connection line 61, and the fifty-first via V51 is configured such that a subsequently formed seventy-fifth connection line is connected to the first end of the sixty-first connection line 61 of the first sub-pixel P1 through the via.

In an exemplary embodiment, the orthographic projection of the fifty-second via V52 on the base substrate may be located within the range of the orthographic projection of the fifty-fifth connection electrode 55 on the base substrate in each sub-pixel, the first planarization layer within the fifty-second via V52 is removed to expose the surface of the fifty-fifth connection electrode 55, and the fifty-second via V52 is configured such that a subsequently formed data signal line is connected to the fifty-fifth connection electrode 55 through the via.

In an exemplary embodiment, the orthographic projection of the fifty-third via V53 on the base substrate may be located within the range of the orthographic projection of the fifty-third connection electrode 53 on the base substrate in each sub-pixel, the first planarization layer of the fifty-third via V53 is removed to expose the surface of the fifty-third connection electrode 53, and the fifty-third via V53 is configured such that a subsequently formed first power line is connected to the fifty-third connection electrode 53 through the via.

In an exemplary embodiment, the first planarization layer may also be provided with a plurality of other vias exposing corresponding connection electrodes or connection lines, and these vias are configured to communicate with subsequently formed vias, which are not described here.

Figure 17A:
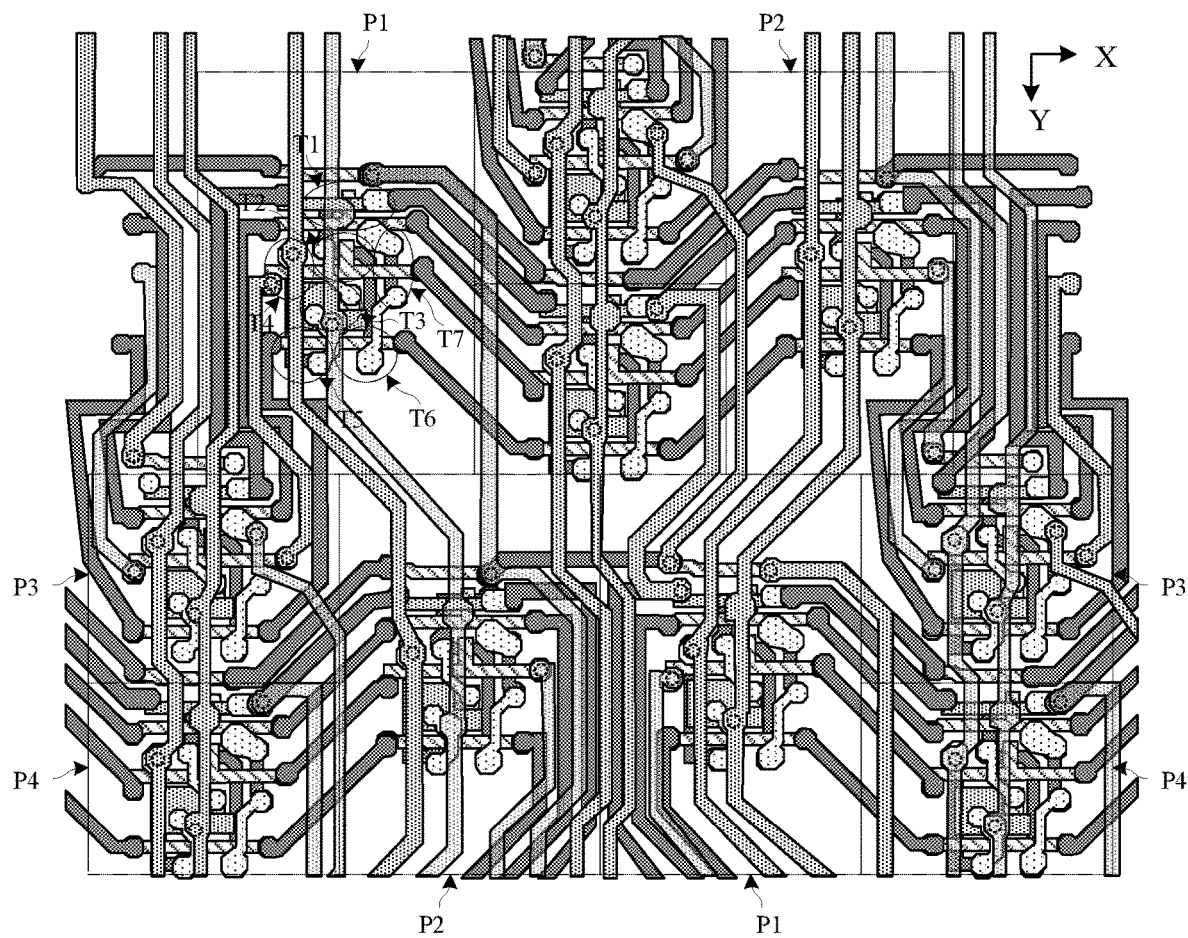
FIG. 17a is a schematic diagram after a pattern of a fifth conductive layer is formed according to an exemplary embodiment of the present disclosure.
Figure 17B:
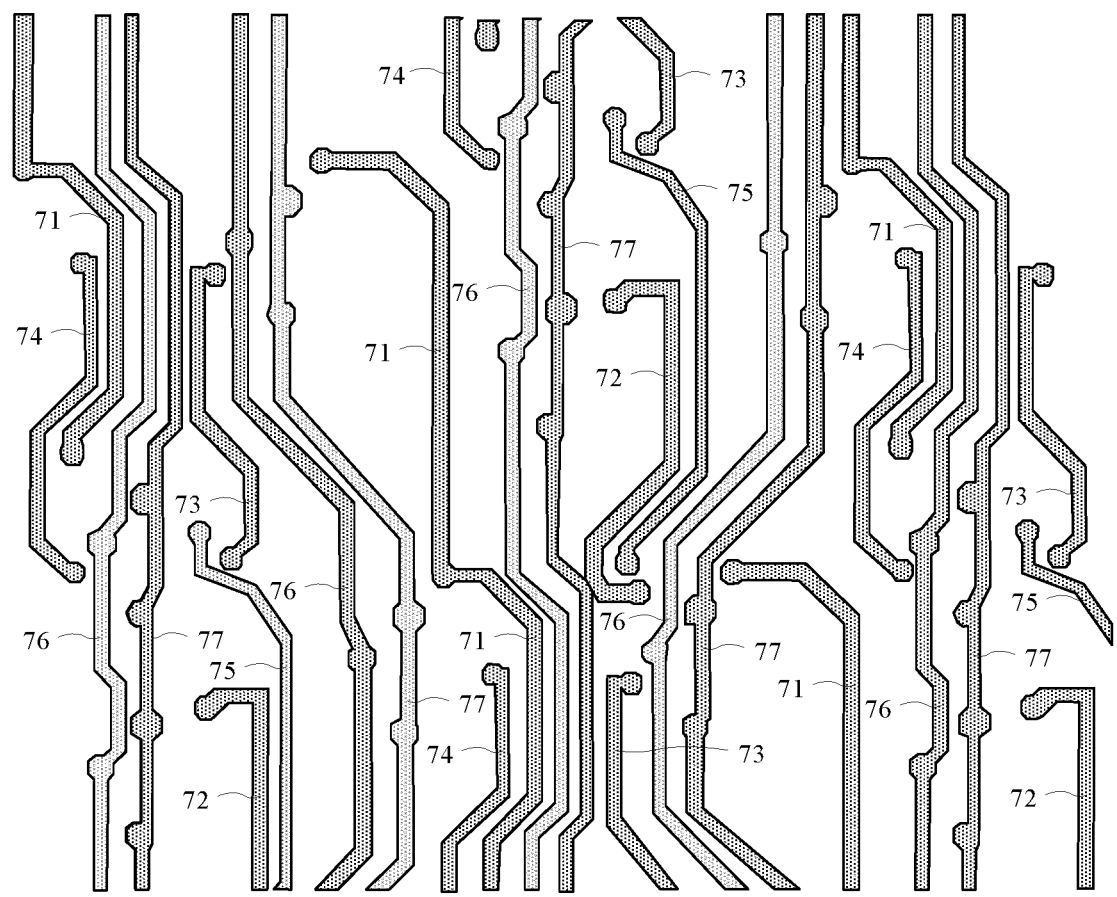

(9) A pattern of a fifth conductive layer is formed. In an exemplary embodiment, forming the fifth conductive layer may include: depositing a fifth conductive film on the substrate on which the aforementioned pattern is formed, and patterning the fifth conductive film through a patterning process to form a pattern of the fifth conductive layer provided on the first planarization layer, as shown in FIG. 17a and FIG. 17b, where FIG. 17b is a schematic plan view of the fifth conductive layer in FIG. 17a. In an exemplary embodiment, the fifth conductive layer may be referred to as a second transparent conductive (ITO2) layer.

In conjunction with FIGS. 9 through 17b, the fifth conductive layer includes at least: a seventy-first connection line 71, a seventy-second connection line 72, a seventy-third connection line 73, a seventy-fourth connection line 74, a seventy-fifth connection line 75, a data signal line 76, and a first power line 77.

In an exemplary embodiment, the seventy-first connection line 71 may serve as a thirteenth transmission connection line. The seventy-first connection line 71 may be in the form of a folded line with a main part extending in the second direction Y. A first end of the seventy-first connection line 71 is connected to the sixty-second connection line 62 of the first sub-pixel P1 through the forty-first via V41 of the first sub-pixel P1. The third end of the seventy-first connection line 71 is connected to the sixty-first connection line 61 of the second sub-pixel P2 adjacent in the second direction Y through the forty-third via V43 of the second sub-pixel P2 in the second direction Y. The second end of the seventy-first connection line 71 is connected to the forty-first connection electrode 41 of the third sub-pixel P3 through the forty-fourth via V44 of the third sub-pixel P3 adjacent in the second direction Y. The third end is located between the first end and the second end. Since the sixty-second connection line 62 of the first sub-pixel P1 is connected to the first initial signal lines 24 of the first sub-pixel P1 and the fourth sub-pixel P4, the forty-first connection electrode 41 of the third sub-pixel P3 is connected to the first initial signal line 24 of the third sub-pixel P3, and the sixty-first connection line 61 of the second sub-pixel P2 is connected to the first initial signal line 24 of the second sub-pixel P2 and the first sub-pixel P1, thus the first initial signal line 24 of the first sub-pixel P1, the second sub-pixel P2, the third sub-pixel P3 and the fourth sub-pixel P4 are interconnected.

In an exemplary embodiment, the seventy-second connection line 72 may serve as a twenty-third transmission connection line. The seventy-second connection line 72 may be in the form of a folded line with a main part extending in the second direction Y. The first end of the seventy-second connection line 72 is connected to the sixty-third connection line 63 of the fourth sub-pixel P3 through the forty-fifth via V45 of the fourth sub-pixel P3. The second end of the seventy-second connection line 72 is connected to the sixty-seventh connection line 67 of the first sub-pixel P1 through the forty-second via V42 of the first sub-pixel P1. Since the sixty-third connection line 63 of the fourth sub-pixel P3 is connected to the second initial signal line 33 of the fourth sub-pixel P3 and the sixty-seventh connection line 67 of the first sub-pixel P1 is connected to the second initial signal line 33 of the first sub-pixel P1, the second initial signal lines 33 of the first sub-pixel P1 and the fourth sub-pixel P4 are interconnected.

In an exemplary embodiment, the seventy-third connection line 73 may be in the form of a folded line with a main part extending in the second direction Y. The first end of the seventy-third connection line 73 is connected to the forty-seventh connection electrode 47 of the first sub-pixel P1 through the forty-sixth via V46 of the first sub-pixel P1. The second end of the seventy-third connection line 73 is connected to the forty-seventh connection electrode 48 of the third sub-pixel P3 through the forty-seventh via V47 of the third sub-pixel P3. Since the forty-seventh connection electrode 47 of the first sub-pixel P1 is connected to the first end of the first scan signal line 21 of the first sub-pixel P1, and the forty-eighth connection electrode 48 of the third sub-pixel P3 is connected to the second end of the first scan signal line 21 of the third sub-pixel P3, the first scan signal lines 21 of the first sub-pixel P1 and the third sub-pixel P3 are thus interconnected.

In an exemplary embodiment, the seventy-fourth connection line 74 may be in the form of a folded line with a main part extending in the second direction Y. The first end of the seventy-fourth connection line 74 is connected to the forty-eighth connection electrode 48 of the second sub-pixel P2 through the forty-eighth via V48 of the second sub-pixel P2. The second end of the seventy-fourth connection line 74 is connected to the forty-seventh connection electrode 47 of the third sub-pixel P3 through the forty-ninth via V49 of the third sub-pixel P3. Since the forty-eighth connection electrode 48 of the second sub-pixel P2 is connected to the second end of the first scan signal line 21 of the second sub-pixel P2, and the forty-seventh connection electrode 47 of the third sub-pixel P3 is connected to the first end of the first scan signal line 21 of the third sub-pixel P3, the first scan signal lines 21 of the second sub-pixel P2 and the third sub-pixel P3 are interconnected.

In an exemplary embodiment, the seventy-fifth connection line 75 may serve as a fourteenth transmission connection line. The seventy-fifth connection line 75 may be in the form of a folded line with a main part extending in the second direction Y, with the first end of the seventy-fifth connection line 75 connected to the fifty-fourth connection electrode 54 of the third sub-pixel P3 through the fiftieth via V50 of the third sub-pixel P3, and the second end of the seventy-fifth connection line 75 connected to the first end of the sixty-first connection line 61 through the fifty-first via V51 of the first sub-pixel P1. Since the fifty-fourth connection electrode 54 of the third sub-pixel P3 serves as the first electrode of the seventh transistor T7 and the sixty-first connection line 61 of the first sub-pixel P1 serves as the connection line of the first initial signal line 24, the interconnection of the first initial signal line 24 with the first electrode of the seventh transistor T7 is achieved.

In an exemplary embodiment, the data signal line 76 may be in the form of a folded line with a main part extending in the second direction Y, and the data signal line 76 is connected to the fifty-fifth connection electrode 55 through the fifty-second via V52 of each sub-pixel. Since the fifty-fifth connection electrode 55 is connected to the first region of the fourth active layer through the via, the connection of the data signal line 76 to the first electrode of the fourth transistor T4 is achieved.

In an exemplary embodiment, the first power line 77 may be in the form of a folded line with a main part extending in the second direction Y, and the first power line 77 is connected to the fifty-third connection electrode 53 through the fifty-third via V53 of each sub-pixel. Since the fifty-third connection electrode 53 is connected to the first region and the second electrode plate 34 of the fifth active layer through the via, the connection of the first power line 77 to the first electrode of the fifth transistor T5 and the second electrode plate of the storage capacitor is achieved.

Figure 18:
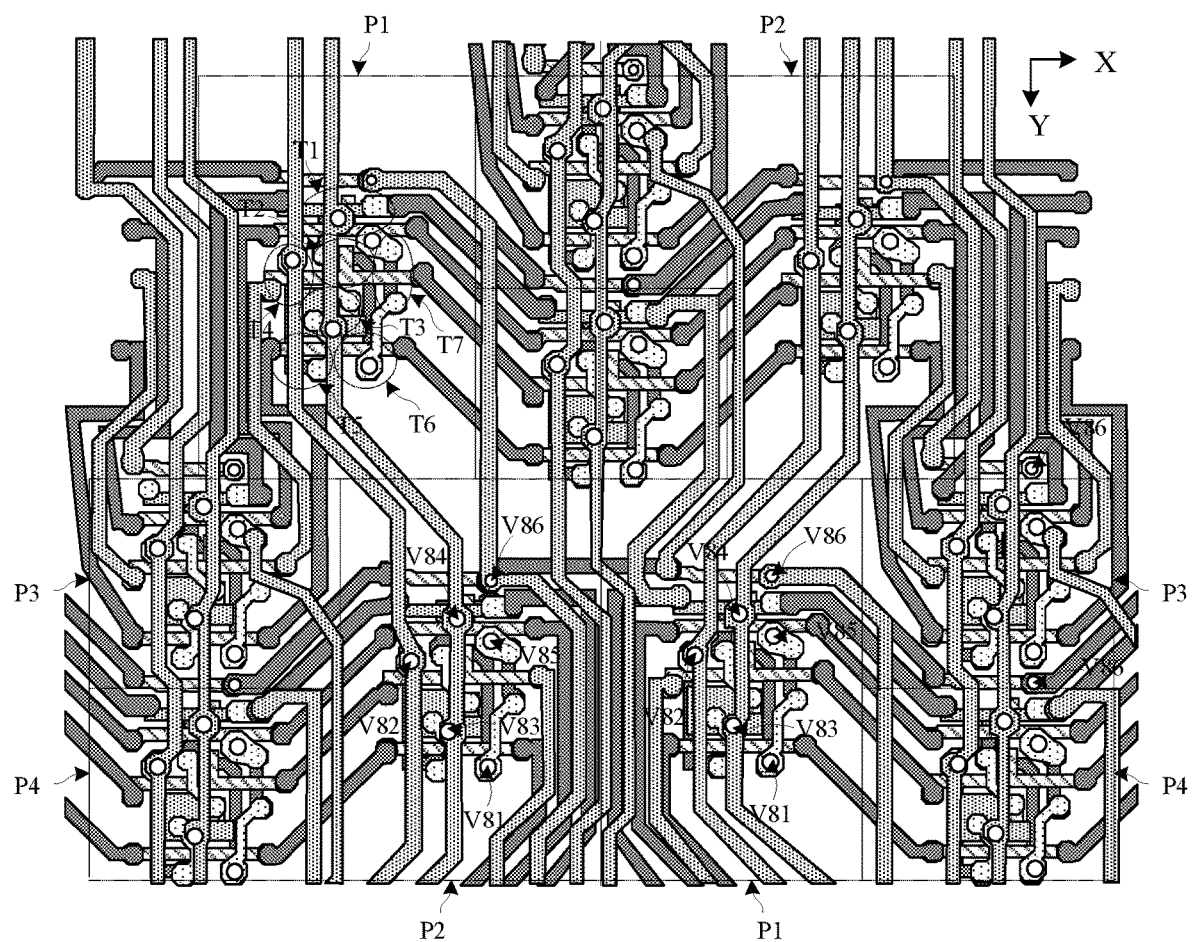
FIG. 18 is a schematic diagram after a pattern of a second planarization layer is formed according to an exemplary embodiment of the present disclosure.

(10) Forming a pattern of a second planarization layer. In an exemplary embodiment, forming a pattern of a second planarization layer may include: coating a second planarization thin film on the substrate on which the aforementioned patterns are formed, patterning the second planarization thin film through a patterning process to form a second planarization layer covering the fifth conductive layer, with a plurality of vias provided in the second planarization layer as shown in FIG. 18.

In conjunction with FIGS. 9 through 18, the plurality of vias may include: the eighty-first via V81, the eighty-second via V82, the eighty-third via V83, the eighty-fourth via V84, the eighty-fifth via V85, and the eighty-sixth via V86.

In an exemplary embodiment, the orthographic projection of the eighty-first via V81 on the base substrate may be located within the range of the orthographic projection of the fifty-second connection electrode 52 on the base substrate, the second planarization layer within the eighty-first via V61 is removed to expose the surface of the fifty-second connection electrode 52, and the eighty-first via V61 is configured such that a subsequently formed eighty-first connection electrode is connected to the fifty-second connection electrode 52 through the via.

In an exemplary embodiment, the orthographic projection of the eighty-second via V82 on the base substrate may be located within the range of the orthographic projection of the fifty-fifth connection electrode 55 on the base substrate, the second planarization layer within the eighty-second via V82 is removed to expose the surface of the data signal line 76, and the eighty-second via V82 is configured such that a subsequently formed eighty-second connection electrode is connected to the data signal line 76 through this via.

In an exemplary embodiment, the orthographic projection of the eighty-third via V83 on the base substrate may be located within the range of the orthographic projection of the fifty-third connection electrode 53 on the base substrate, the second planarization layer within the eighty-third via V83 is removed to expose the surface of the first power line 77, and the eighty-third via V83 is configured such that a subsequently formed eighty-third connection electrode is connected to the first power line 77 through this via.

In an exemplary embodiment, the orthographic projection of the eighty-fourth via V84 on the base substrate may be located within the range of the orthographic projection of the first power line 77 on the base substrate, the second planarization layer within the eighty-fourth via V84 is removed to expose the surface of the first power line 77, and the eighty-fourth via V84 is configured so that a the subsequently formed eighty-third connection electrode is connected to the first power line 77 through this via.

In an exemplary embodiment, the orthographic projection of the eighty-fifth via V85 on the base substrate may be located within the range of the orthographic projection of the fifty-fourth connection electrode 54 on the base substrate, the second planarization layer within the eighty-fifth via V85 is removed to expose the surface of the fifty-fourth connection electrode 54, and the eighty-fifth via V85 is configured such that a subsequently formed eighty-fourth connection electrode is connected to the fifty-fourth connection electrode 54 through the via.

In an exemplary embodiment, the orthographic projection of the eighty-sixth via V86 on the base substrate may be located within the range of the orthographic projection of the forty-second connection electrode 42 on the base substrate, and the eighty-sixth via V86 is configured such that a subsequently formed eighty-fourth connection electrode is connected to a corresponding connection electrode or connection line through the via. For the first sub-pixel P1, the eighty-sixth via V86 exposes the surface of the first end of the seventy-first connection line 71, for the second sub-pixel P2, the eighty-sixth via V86 exposes the surface of the third end of the seventy-first connection line 71, for the third sub-pixel P3, the eighty-sixth via V86 exposes the surface of the forty-second connection electrode 42, and for the fourth sub-pixel P4, the eighty-sixth via V86 exposes the surface of the second end of the sixty-second connection line 62.

Figure 19A:
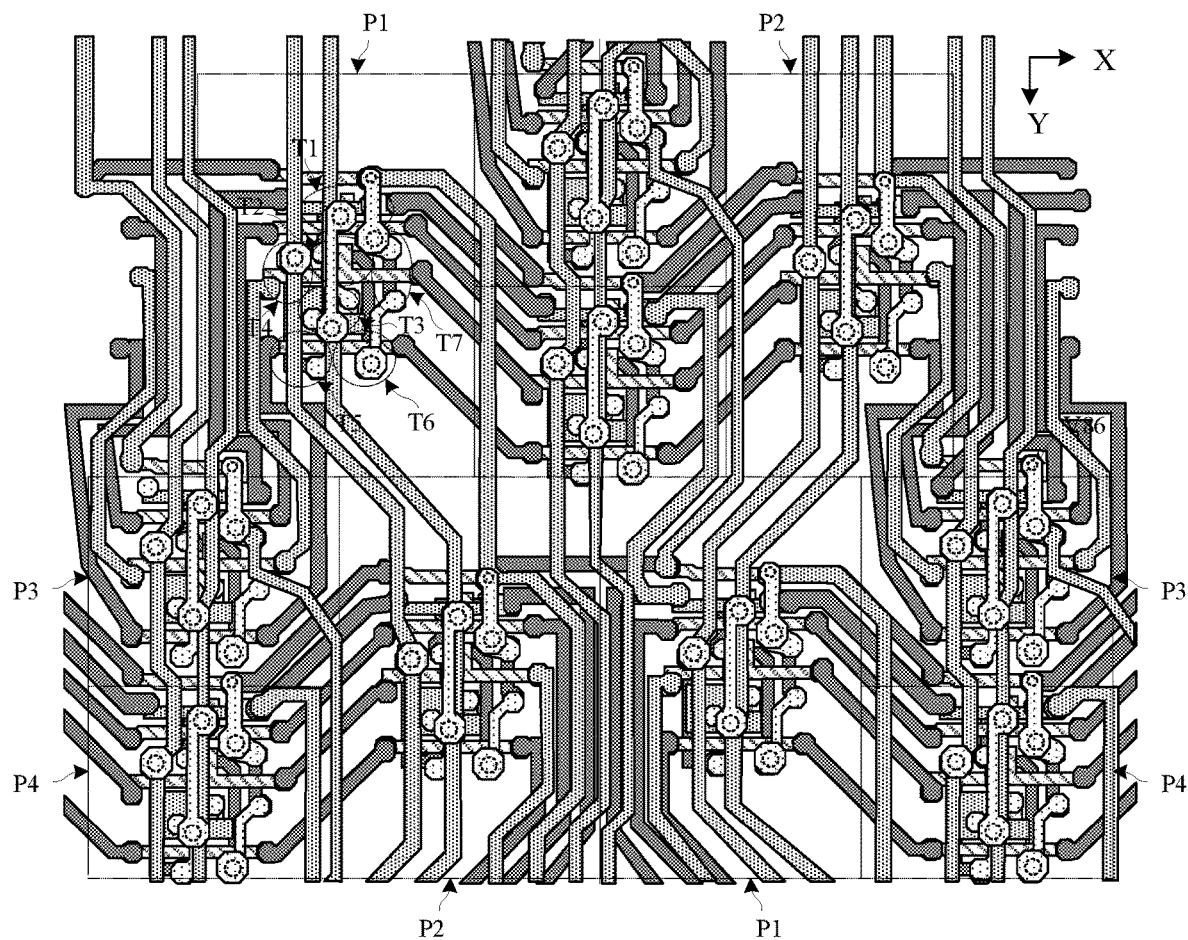
FIG. 19a is a schematic diagram after a pattern of a sixth conductive layer is formed according to an exemplary embodiment of the present disclosure.
Figure 19B:
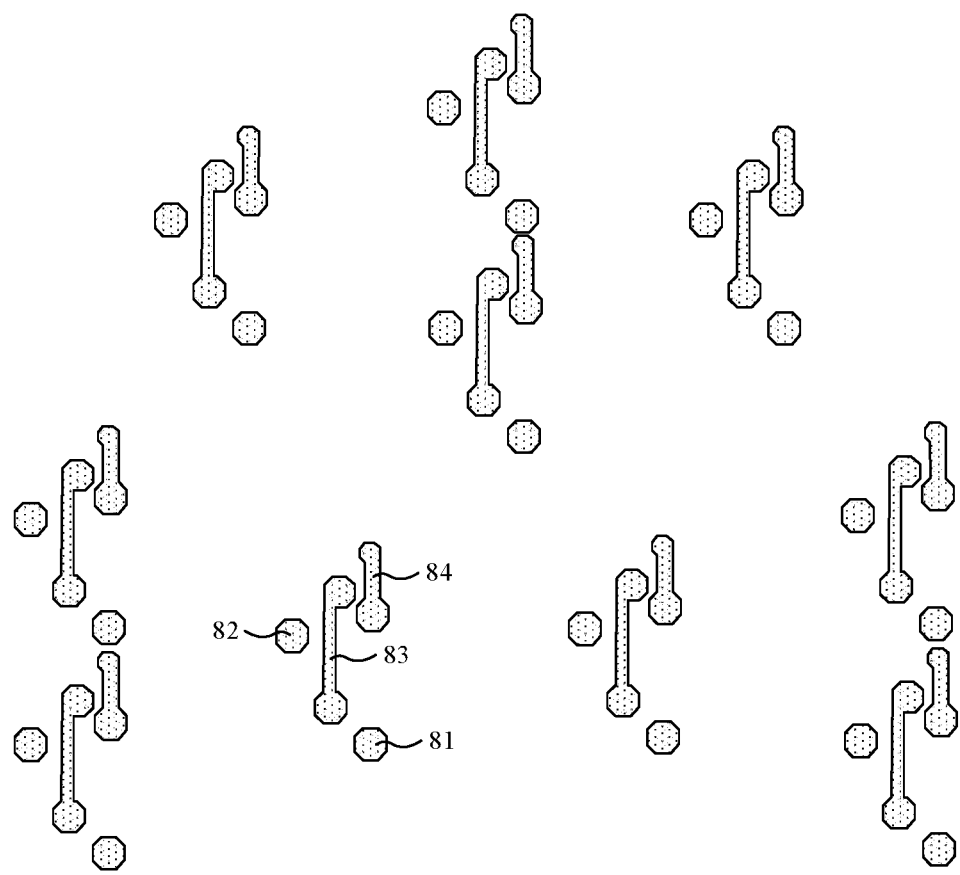

(11) A pattern of a sixth conductive layer is formed. In an exemplary embodiment, forming the sixth conductive layer may include: depositing the sixth conductive film on the base substrate on which the aforementioned patterns are formed, patterning the sixth conductive film using a patterning process to form a pattern of the sixth conductive layer provided on the second planarization layer, as shown in FIG. 19a and FIG. 19b, which shows a schematic plan view of the sixth conductive layer in FIG. 19a. In an exemplary embodiment, the sixth conductive layer may be referred to as a second source drain metal (SD2) layer.

In conjunction with FIGS. 9 through 19b, the sixth conductive layer includes at least an eighty-first connection electrode 81, an eighty-second connection electrode 82, an eighty-third connection electrode 83, and an eighty-fourth connection electrode 84 disposed at each sub-pixel.

In an exemplary embodiment, the eighty-first connection electrode 81 may be rectangular, and rectangle corners may be set with chamfer, and the eighty-first connection electrode 81 is connected to the fifty-second connection electrode 52 through the eighty-first via V81, and the eighty-first connection electrode 81 is configured to be connected to the subsequently formed anode. Since the fifty-second connection electrode 52 is connected to the second region of the sixth active layer and to the second region of the seventh active layer through the via, the connection of the anode to the second electrode of the sixth transistor T6 and to the second electrode of the seventh transistor T7 can be realized.

In an exemplary embodiment, the eighty-second connection electrode 82 may be rectangular, and rectangle corners may be set with chamfer, and the eighty-second connection electrode 82 is connected to the data signal line 76 through the eighty-second via V82, and the eighty-second connection electrode 82 is configured to reduce the resistance of the data signal line 76.

In an exemplary embodiment, the eighty-third connection electrode 83 may be shaped as a strip extending along the first direction Y. The eighty-third connection electrode 83 is connected to the first power line 77 through the eighty-third via V83 and the eighty-fourth via V84, respectively, and the eighty-third connection electrode 83 is configured to reduce the resistance of the first power line 77.

In an exemplary embodiment, the eighty-fourth connection electrode 84 may be shaped as a strip extending in the second direction Y. The first end of the eighty-fourth connection electrode 84 is connected to the fifty-fourth connection electrode 54 through the eighty-fifth via V85, and the second end of the eighty-fourth connection electrode 84 is connected to a corresponding connection electrode or connection line through the eighty-sixth via V86. The eighty-fourth connection electrode 84 is configured to provide a second initial signal to the first electrode of the seventh transistor T7.

In an exemplary embodiment, for the first sub-pixel P1 and the second sub-pixel P2, the second end of the eighty-fourth connection electrode 84 is connected to the seventy-first connection line 71 through the eighty-sixth via V86. Since the seventy-first connection line 71 is connected with the first initial signal line 24, it is realized that the first initial signal line 24 provides the second initial signal to the first electrode of the seventh transistor T7 of the first sub-pixel P1 and the second sub-pixel P2.

In an exemplary embodiment, for the third sub-pixel P3, the second end of the eighty-fourth connection electrode 84 is connected to the forty-second connection electrode 42 through the eighty-sixth via V86. Since the forty-second connection electrode 42 is connected to the first initial signal line 24, it is thus realized that the first initial signal line 24 provides a second initial signal to the first electrode of the seventh transistor T7 of the third sub-pixel P3.

In an exemplary embodiment, for the fourth sub-pixel P4, the second end of the eighty-fourth connection electrode 84 is connected to the sixty-second connection line 62 through the eighty-sixth via V86. Since the sixty-second connection line 62 is connected to the first initial signal line 24, it is realized that the first initial signal line 24 provides a second initial signal to the first electrode of the seventh transistor T7 of the fourth sub-pixel P4.

In an exemplary embodiment, the shape and location of the sixth conductive layer of the first sub-pixel P1, the second sub-pixel P2, the third sub-pixel P3, and the fourth sub-pixel P4 may be substantially the same.

The subsequent preparation process may include processes for forming the anode, pixel definition layer, organic light emitting layer, cathode, and encapsulation layer, which will not be described here.

In an exemplary implementation, the substrate may be a flexible substrate, or may be a rigid substrate. The rigid substrate may be made of, but not limited to, one or more of glass and quartz. The flexible substrate may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. The first conductive layer, the second conductive layer, the third conductive layer and the sixth conductive layer may be made of metal materials, such as any one or more of silver (Ag), copper (Cu), aluminum (Al) and molybdenum (Mo), or alloy materials of the above metals, such as an aluminum neodymium alloy (AlNd) or a molybdenum niobium alloy (MoNb), and may be a single-layer structure or a multi-layer composite structure, such as Mo/Cu/Mo, etc. The fourth conductive layer and the fifth conductive layer can be made of transparent conductive materials, such as indium tin oxide ITO or indium zinc oxide IZO, etc. The first insulating layer, the second insulating layer, the third insulating layer, the fourth insulating layer and the fifth insulating layer may be made of any one or more of silicon oxide (SiOx), silicon nitride (SiNx) and silicon oxynitride (SiON), and may be in a single layer, multiple layers, or a composite layer. The first insulating layer is referred to as a buffer layer for improving the water and oxygen resistance of the base substrate, the second and the third insulating layers are referred to as gate insulating (GI) layers, the fourth insulating layer is referred to as an interlayer insulating (ILD) layer, and the fifth insulating layer is referred to as a passivation (PVX) layer. The first planarization layer and the second planarization layer may be made of an organic material such as a resin or the like. The semiconductor layer may be made of a material, such as an amorphous indium gallium zinc oxide material (a-IGZO), zinc oxynitride (ZnON), indium zinc tin oxide (IZTO), amorphous silicon (a-Si), polycrystalline silicon (p-Si), sexithiophene or polythiophene, that is, the present disclosure is applicable to transistors manufactured based on oxide technology, silicon technology or organic technology.

Figure 20:
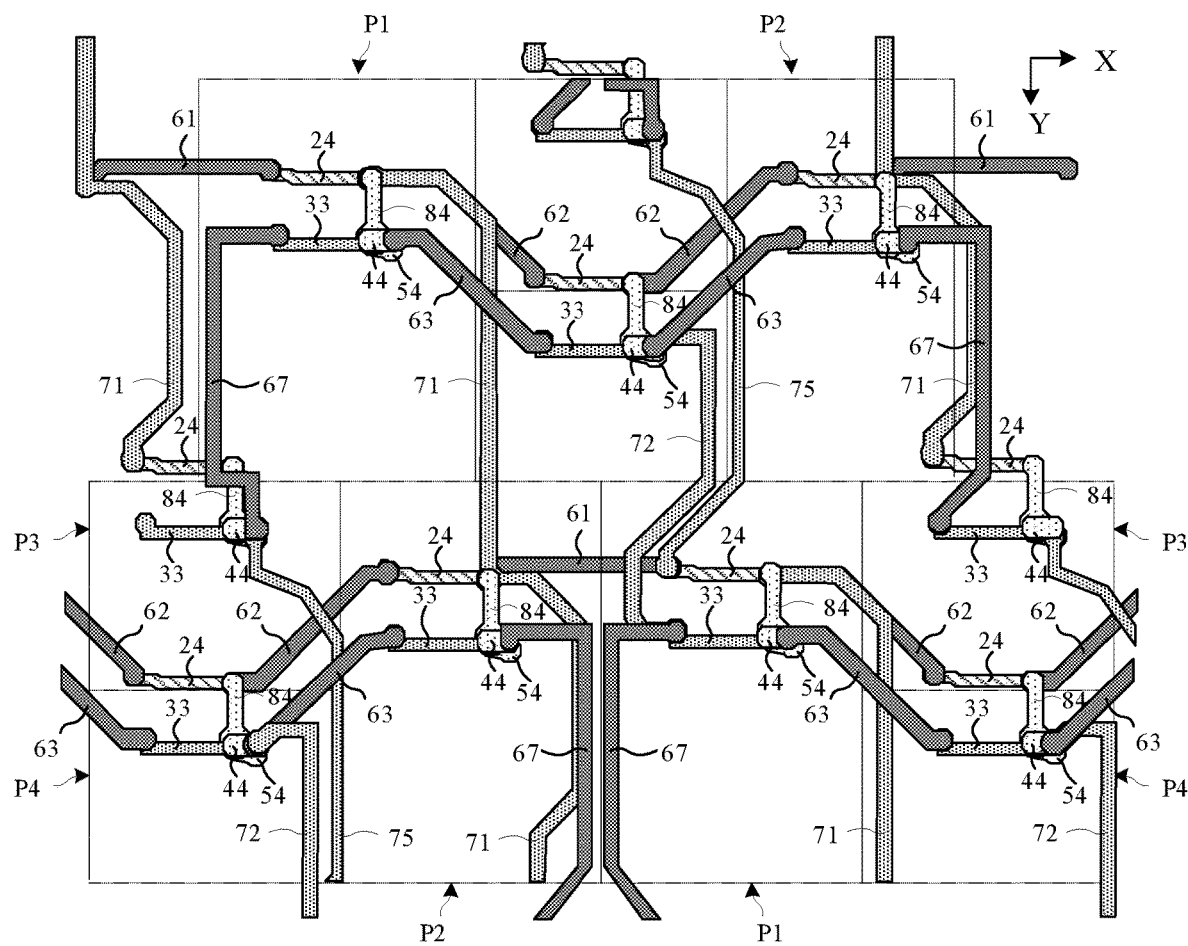
FIG. 20 is a schematic diagram of the structure of a grid-like initial transmission line according to an exemplary embodiment of the present disclosure.

FIG. 20 is a schematic diagram of a structure of a grid-like initial transmission line of an exemplary embodiment of the present disclosure, illustrating a planar structure of a first initial transmission line and a second initial transmission line for 10 sub-pixels in a pixel island of a transmissive display area. As shown in FIG. 20, the first initial transmission line for transmitting the first initial voltage signal and the second initial transmission line for transmitting the second initial signal are both in a grid structure.

In an exemplary embodiment, the first initial transmission line may include at least the first initial signal line 24, the sixty-first connection line 61 as the eleventh transmission connection line, the sixty-second connection line 62 as the twelfth transmission connection line, the seventy-first connection line 71 as the thirteenth transmission connection line, the seventy-fifth connection line 75 as the fourteenth transmission connection line, the fifty-fourth connection electrode 54 as the first transmission electrode and the eighty-fourth connection electrode 84 as the second transmission electrode. The above connection lines and electrodes are connected to form the first initial transmission line of the first grid structure, and the first grid structure may have a closed shape in an orthographic projection in the display substrate plane.

In an exemplary embodiment, the first initial signal line 24 of the first sub-pixel P1 is connected to the first initial signal line 24 of the fourth sub-pixel P4 adjacent in the first direction X via the sixty-second connection line 62, the first initial signal line 24 of the fourth sub-pixel P4 is connected to the first initial signal line 24 of the second sub-pixel P2 adjacent in the first direction X via the sixty-second connection line 62, and the first initial signal line 24 of the second sub pixel P2 is connected to the first initial signal line 24 of the first sub-pixel P1 adjacent in the first direction X via the sixty-first connection line 61, thus the connection of the first initial signal line 24 in the sub-pixels adjacent in the first direction X is realized.

In an exemplary embodiment, the first initial signal line 24 of the first sub-pixel P1 is connected to the first initial signal line 24 of the third sub-pixel P3 adjacent in the second direction Y via the seventy-fifth connection line 75, the fifty-fourth connection electrode 54, and the eighty-fourth connection electrode 84, on the other hand, the first initial signal line 24 of the first sub-pixel P1 is connected to the first initial signal line 24 of the second sub-pixel P2 adjacent in the second direction Y through the seventy-first connection line 71, and the first initial signal line 24 of the second sub-pixel P2 is connected to the first initial signal line 24 of the third sub-pixel P3 adjacent in the second direction Y through the seventy-first connection line 71, thus the connection of the first initial signal line 24 in the sub-pixels adjacent in the second direction Y is realized.

In an exemplary embodiment, the second initial transmission line may include at least a second initial signal line 33, a sixty-third connection line 63 as the twenty-first transmission connection line, a sixty-seventh connection line 67 as the twenty-second transmission connection line, a seventy-second connection line 72 as the twenty-third transmission connection line, and a forty-fourth connection electrode 44 as the third transmission electrode. The above connection lines and electrodes are connected to form a second initial transmission line of the second grid structure. The second grid structure may have a closed shape in the orthographic projection in the display substrate plane.

In an exemplary embodiment, the second initial signal line 33 of the first sub-pixel P1 is connected to the second initial signal line 33 of the fourth sub-pixel P4 adjacent in the first direction X via the forty-fourth connection electrode 44 and the sixty-third connection line 63. The second initial signal line 33 of the fourth sub-pixel P4 is connected to the second initial signal line 33 of the second sub-pixel P2 adjacent in the first direction X via the forty-fourth connection electrode 44 and the sixty-third connection line 63. The second initial signal line 33 of the second sub-pixel P2 is connected to the second initial signal line 33 of the third sub-pixel P3 adjacent in the first direction X via the forty-fourth connection electrode 44 and the sixty-seventh connection line 67, and the second initial signal line 33 of the third sub-pixel P3 is connected to the second initial signal line 33 of the first sub-pixel P1 adjacent in the first direction X through the forty-fourth connection electrode 44 and the sixty-seventh connection line 67, thus the connection of the second initial signal line 33 in the sub-pixels adjacent in the first direction X is realized.

In an exemplary implementation, the second initial signal line 33 of the fourth sub-pixel P4 is connected to the second initial signal line 33 of the first sub-pixel P1 adjacent in the second direction Y via the seventy-second connection line 72, thus the connection of the second initial signal line 33 in the sub-pixels adjacent in the second direction Y is realized.

As can be seen from the above-described structure of the display substrate and the preparation process, the display substrate provided in the present disclosure, by providing a first transmission line with a main part extending in a first direction X and a second transmission line with a main part extending in a second direction Y, causes the initial transmission line for transmitting the initial signal to form a mesh structure, which not only effectively reduces the resistance of the initial transmission line and reduces the initial transmission line voltage drop, but also effectively improves the stability of the initial voltage in the initial transmission line in the display substrate, and effectively enhances display uniformity and display quality. By providing two transparent conductive layers, one transparent conductive layer mainly forms the connection line in the first direction and the other transparent conductive layer mainly forms the connection line in the second direction, the present disclosure not only realizes the mesh structure routing of the first initial transmission line and the second initial transmission line, but also has a simple connection structure and reasonable layout, and improves the connection reliability. The preparation process in the present disclosure may be compatible well with an existing preparation process, which is simple in process implementation, easy to implement, high in production efficiency and yield, and low in production cost.

The structure and preparation process thereof shown in the foregoing of the present disclosure is only an exemplary description. In an exemplary embodiment, the corresponding structure and the patterning process can be changed and added or reduced according to actual needs, and can be applied to other display apparatus having pixel drive circuits, and the present disclosure is not limited herein.

In an exemplary implementation, the display substrate of the present disclosure may be applied to a display apparatus with a pixel drive circuit, such as an OLED, a quantum dot display (QLED), a light emitting diode display (Micro LED or Mini LED) or a quantum dot light emitting diode display (QDLED), etc., which is not limited here in the present disclosure.

The present disclosure further provides a manufacturing method for a display substrate, for preparing the display substrate according to the foregoing embodiments. In an exemplary embodiment, the display substrate includes a normal display area and a transmissive display area provided within the normal display area, the normal display area being configured to perform image display, the transmissive display area including at least one pixel island, the pixel island of the transmissive display area being configured to perform image display and transmit light; the manufacturing method may include:

forming an initial transmission line for transmitting an initial signal and at least one pixel drive circuit connected to the initial transmission line at the pixel island in the transmissive display area, the initial transmission line including a first transmission line with a main part extending in a first direction and a second transmission line with a main part extending in a second direction, the first transmission line and the second transmission line being connected to form a grid structure, the grid structure having a closed shape in an orthographic projection in the plane of the display substrate, the first direction being crossed with the second direction.

The present disclosure further provides a display apparatus which includes the aforementioned display substrate. The display apparatus may be any product or component with a display function, such as a mobile phone, a tablet computer, a television, a display, a laptop computer, a digital photo frame, or a navigator, and the embodiments of the present invention are not limited thereto.

Although the implementations disclosed in the present disclosure are described as above, the described contents are only implementations which are used for facilitating the understanding of the present disclosure, and are not intended to limit the present invention. Any skilled person in the art to which the present disclosure pertains may make any modifications and variations in forms and details of implementation without departing from the spirit and scope of the present disclosure. However, the patent protection scope of the present invention should be subject to the scope defined by the appended claims.

The invention claimed is:

1. A display substrate comprising a normal display area and a transmissive display area provided within the normal display area,
   the normal display area being configured for image display,
   the transmissive display area comprising at least one pixel island,
   the pixel island of the transmissive display area being configured for image display and transmitting light,
   the pixel island of the transmissive display area comprising an initial transmission line for transmitting an initial signal and at least one pixel drive circuit connected to the initial transmission line,
   the initial transmission line comprising a first transmission line with a main part extending in a first direction and a second transmission line with a main part extending in a second direction,
   the first transmission line and the second transmission line being connected to form a grid structure,
   the grid structure having a closed shape in an orthographic projection in the plane of the display substrate, and
   the first direction being crossed with the second direction; wherein
   the display substrate comprises, in a plane perpendicular to the display substrate, a first conductive layer, a second conductive layer provided sequentially on a base substrate;
   the initial transmission line comprises a first initial transmission line transmitting a first initial signal, and a second initial transmission line transmitting a second initial signal, the first initial transmission line comprises a first initial signal line, and the second initial transmission line comprises a second initial signal line;
   the first conductive layer comprises the second initial signal line in the second initial transmission line;
   the second conductive layer comprises the first initial signal line in the first initial transmission line; and
   the first initial transmission line and the second initial transmission line form a mesh structure routing.

2. The display substrate according to claim 1,
   the pixel island of the transmissive display area comprising a plurality of pixel units,
   at least one pixel unit comprising a first sub-pixel and a second sub-pixel provided sequentially in the first direction, and a third sub-pixel and a fourth sub-pixel provided sequentially in the second direction,
   the third sub-pixel and the fourth sub-pixel being provided between the first sub-pixel and the second sub-pixel,
   the first initial transmission line comprising the first initial signal line, an first transmission connection line and a second transmission connection line as the first transmission line, and a third transmission connection line and a fourth transmission connection line as the second transmission line,
   the first initial signal line being provided in the sub-pixels as a straight line extending along the first direction,
   the first transmission connection line and second transmission connection line being provided between adjacent sub-pixels in the first direction, being configured to connect the first initial signal line of adjacent sub-pixels in the first direction, and
   the third transmission connection line and fourth transmission connection line being provided between adjacent sub-pixels in the second direction, being configured to connect the first initial signal line of adjacent sub-pixels in the second direction.

3. The display substrate according to claim 2,
   the first transmission connection line being provided between the first sub-pixel and the second sub-pixel adjacent in the first direction, and
   the first initial signal line of the second sub-pixel and the first initial signal line of the first sub-pixel adjacent in the first direction being connected via the first transmission connection line.

4. The display substrate according to claim 2,
   the second transmission connection line being provided between the first sub-pixel and the fourth sub-pixel adjacent in the first direction, and between the second sub-pixel and the fourth sub-pixel adjacent in the first direction, the first initial signal line of the first sub-pixel and the first initial signal line of the fourth sub-pixel adjacent in the first direction being connected via the second transmission connection line, and the first initial signal line of the fourth sub-pixel and the first initial signal line of the second sub-pixel adjacent in the first direction being connected via the second transmission connection line.

5. The display substrate according to claim 2, the third transmission connection line being provided between the first sub-pixel and the second sub-pixel adjacent in the second direction, and between the second sub-pixel and the third sub-pixel adjacent in the second direction, the first initial signal line of the first sub-pixel and the first initial signal line of the second sub-pixel adjacent in the second direction being connected via the third transmission connection line, and the first initial signal line of the second sub-pixel and the first initial signal line of the third sub-pixel adjacent in the second direction being connected via the third transmission connection line.

6. The display substrate according to claim 2, the fourth transmission connection line being provided between the first sub-pixel and the third sub-pixel adjacent in the second direction, and the first initial signal line of the third sub-pixel and the first initial signal line of the first sub-pixel adjacent in the second direction being connected via the fourth transmission connection line.

7. The display substrate according to claim 2, the first initial transmission line further comprising a first transmission electrode and a second transmission electrode provided in the sub-pixel, the fourth transmission connection line being connected to the first initial signal line of the third sub-pixel via the first transmission electrode and the second transmission electrode.

8. The display substrate according to claim 7, the fourth transmission connection line being connected to the first transmission electrode through a via, the second transmission electrode being connected to the first transmission electrode and the first initial signal line through a via, respectively, and the first transmission electrode being connected to a first region of an active layer of the seventh transistor in the pixel drive circuit through a via.

9. The display substrate according to claim 2, the pixel island of the transmissive display area comprising a plurality of pixel units, at least one pixel unit comprising a first sub-pixel and a second sub-pixel provided sequentially in the first direction, and a third sub-pixel and a fourth sub-pixel provided sequentially in the second direction, the third sub-pixel and the fourth sub-pixel being provided between the first sub-pixel and the second sub-pixel, the second initial transmission line comprising the second initial signal line and a fifth transmission connection line as the first transmission line, and a sixth transmission connection line and a seventh transmission connection line as the second transmission line, the second initial signal line being provided in the sub-pixel, in the form of a straight line extending along the first direction, the fifth transmission connection line being provided between adjacent sub-pixels in the first direction, being configured to connect the second initial signal line of adjacent sub-pixels in the first direction, the sixth transmission connection line and the seventh transmission connection line being provided between adjacent sub-pixels in the second direction, being configured to connect the second initial signal line of adjacent sub-pixels in the second direction.

10. The display substrate according to claim 9, the fifth transmission connection line being provided between the first sub-pixel and the fourth sub-pixel adjacent in the first direction, and between the second sub-pixel and the fourth sub-pixel adjacent in the first direction, the second initial signal line of the first sub-pixel and the second initial signal line of the fourth sub-pixel adjacent in the first direction being connected by the fifth transmission connection line, and the second initial signal line of the fourth sub-pixel being connected to the second initial signal line of the second sub-pixel adjacent in the first direction via the fifth transmission connection line.

11. The display substrate according to claim 9, the sixth transmission connection line being provided between the first sub-pixel and the third sub-pixel adjacent in the second direction, and between the second sub-pixel and the third sub-pixel adjacent in the second direction, the second initial signal line of the first sub-pixel and the second initial signal line of the third sub-pixel adjacent in the second direction being connected via the sixth transmission connection line, and the second initial signal line of the second sub-pixel and the second initial signal line of the third sub-pixel adjacent in the second direction being connected via the sixth transmission connection line.

12. The display substrate according to claim 9, the seventh transmission connection line being provided between the first sub-pixel and the fourth sub-pixel adjacent in the second direction, and the second initial signal line of the fourth sub-pixel and the second initial signal line of the first sub-pixel adjacent in the second direction being connected via the seventh transmission connection line.

13. The display substrate according to claim 9, the second initial transmission line further comprising a third transmission electrode provided in the sub-pixel, the third transmission electrode being connected to the second initial signal line through a via, and the fifth transmission connection line, the sixth transmission connection line and the seventh transmission connection line being connected to the third transmission electrode, respectively.

14. The display substrate according to claim 13, the third transmission electrode being further connected to the second initial signal line and to a first region of an active layer of a first transistor in the pixel drive circuit simultaneously through a jumper via; or a first end of the seventh transmission connection line being connected to the fifth transmission connection line of the fourth sub-pixel through a via, and a second end of the seventh transmission connection line being connected to the sixth transmission connection line of the first sub-pixel through a via.

15. The display substrate according to claim 13,
a first end of the fifth transmission connection line being connected to the third transmission electrode of the first sub-pixel through a via,
a second end of the fifth transmission connection line being connected to the second initial signal line of the fourth sub-pixel,
a first end of the fifth transmission connection line being connected to the second initial signal line of the second sub-pixel, and
a second end of the fifth transmission connection line being connected to the third transmission electrode of the fourth sub-pixel through a via.

16. The display substrate according to claim 13,
a first end of the sixth transmission connection line being connected to the second initial signal line of the first sub-pixel,
a second end of the sixth transmission connection line being connected to the third transmission electrode of the third sub-pixel through a via,
a first end of the sixth transmission connection line being connected to the third transmission electrode of the second sub-pixel through a via, and
the second end of the sixth transmission connection line being connected to the second initial signal line of the third sub-pixel.

17. The display substrate according to claim 9,
the display substrate comprising, in a plane perpendicular to the display substrate, the first conductive layer, the second conductive layer, a third conductive layer, a fourth conductive layer, a fifth conductive layer and a sixth conductive layer provided sequentially on a base substrate,
the fourth conductive layer and the fifth conductive layer being transparent conductive layers,
the fourth conductive layer comprising the first transmission connection line and the second transmission connection line in the first initial transmission line, and the fifth transmission connection line and the sixth transmission connection line in the second initial transmission line,
the fifth conductive layer comprising the third transmission connection line and the fourth transmission connection line in the first initial transmission line, and the seventh transmission connection line in the second initial transmission line.

18. The display substrate according to claim 17,
the third conductive layer comprising a third transmission electrode in the second initial transmission line, and a first transmission electrode in the first initial transmission line, and
the sixth conductive layer comprising a second transmission electrode in the first initial transmission line.

19. A display apparatus comprising a display substrate as claimed in claim 1.

20. A manufacturing method of a display substrate, the display substrate comprising a normal display area and a transmissive display area provided within the normal display area, the normal display area being configured to perform image display, the transmissive display area comprising at least one pixel island, the pixel island of the transmissive display area being configured to perform image display and transmit light, the manufacturing method comprising:
forming an initial transmission line transmitting for an initial signal and at least one pixel drive circuit connected to the initial transmission line in the pixel island of the transmissive display area,
the initial transmission line comprising a first transmission line with a main part extending in a first direction and a second transmission line with a main part extending in a second direction,
the first transmission line and the second transmission line being connected to form a grid structure, and
the grid structure having a closed shape in an orthographic projection in the plane of the display substrate, and
the first direction being crossed with the second direction; wherein
the display substrate comprises, in a plane perpendicular to the display substrate, a first conductive layer, a second conductive layer provided sequentially on a base substrate;
the initial transmission line comprises a first initial transmission line transmitting a first initial signal, and a second initial transmission line transmitting a second initial signal, the first initial transmission line comprises a first initial signal line, and the second initial transmission line comprises a second initial signal line;
the first conductive layer comprises the second initial signal line in the second initial transmission line;
the second conductive layer comprises the first initial signal line in the first initial transmission line; and
the first initial transmission line and the second initial transmission line form a mesh structure routing.

* * * * *